（12）United States Patent
Lee et al.

(10) Patent No.: US 11,043,646 B2
(45) Date of Patent: Jun. 22, 2021

(54) ORGANIC LIGHT-EMITTING DEVICE

(71) Applicant: SAMSUNG DISPLAY CO., LTD., Yongin-si (KR)

(72) Inventors: Sunghun Lee, Yongin-si (KR); Seulong Kim, Yongin-si (KR); Illsoo Park, Yongin-si (KR); Hyosup Shin, Yongin-si (KR); Sunwoo Kang, Yongin-si (KR); Eunkyung Koh, Yongin-si (KR); Minkyung Kim, Yongin-si (KR); Taekyung Kim, Yongin-si (KR); Jaeyong Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 418 days.

(21) Appl. No.: 15/134,956

(22) Filed: Apr. 21, 2016

(65) Prior Publication Data

US 2017/0069864 A1  Mar. 9, 2017

(30) Foreign Application Priority Data

Sep. 7, 2015  (KR) .......................... 10-2015-0126453

(51) Int. Cl.
 *H01L 51/50* (2006.01)
 *H01L 51/00* (2006.01)
 *C09K 11/06* (2006.01)

(52) U.S. Cl.
 CPC .......... *H01L 51/5004* (2013.01); *C09K 11/06* (2013.01); *H01L 51/006* (2013.01);
 (Continued)

(58) Field of Classification Search
 CPC ............. H01L 51/5004; H01L 51/5056; H01L 51/5072; H01L 51/5088; H01L 51/5092;
 (Continued)

(56) References Cited

U.S. PATENT DOCUMENTS 7,045,953 B2  5/2006  Nakayama et al.
8,574,725 B2  11/2013  Nishimura et al.
(Continued)

FOREIGN PATENT DOCUMENTS

CN  1682574 A  10/2005
CN  101874316 A  10/2010
(Continued)

OTHER PUBLICATIONS

English machine translation of Takada (JP 2011-153276 A) provided by the EPO. (Year: 2019).*
(Continued)

*Primary Examiner* — Daniel P Malley, Jr.
(74) *Attorney, Agent, or Firm* — Lewis Roca Rothgerber Christie LLP

(57) ABSTRACT

An organic light-emitting device including: a first electrode, a hole transport region including a first hole transport layer (HTL), an emission layer, an electron transport region; and a second electrode; wherein the first HTL includes a first compound and a second compound, the emission layer includes a third compound and a fourth compound, the electron affinity of the second compound is greater than the electron affinity of the first compound, a lowest unoccupied molecular orbital (LUMO) energy level of the fourth compound is greater than a LUMO energy level of the third compound, the second compound and the third compound are different from each other, and the minimum anionic dissociation energy of the second compound is greater than the triplet energy of the third compound.

16 Claims, 4 Drawing Sheets

(52) U.S. Cl.
CPC ...... *H01L 51/5012* (2013.01); *H01L 51/5056* (2013.01); *H01L 51/5064* (2013.01); *H01L 51/0058* (2013.01); *H01L 51/0061* (2013.01); *H01L 51/0072* (2013.01); *H01L 2251/552* (2013.01)

(58) Field of Classification Search
CPC .............. H01L 51/5096; H01L 51/506; H01L 51/5076; C09K 11/06
See application file for complete search history.

(56) References Cited

U.S. PATENT DOCUMENTS

| | | | |
|---|---|---|---|
| 9,590,184 | B2 | 3/2017 | Lee et al. |
| 2002/0113545 | A1 | 8/2002 | Adachi et al. |
| 2003/0071565 | A1* | 4/2003 | Hatwar ................. C09K 11/06 313/504 |
| 2004/0018383 | A1* | 1/2004 | Aziz ................... C07D 219/06 428/690 |
| 2007/0075635 | A1 | 4/2007 | Yabunouchi et al. |
| 2007/0172700 | A1 | 7/2007 | Nishita |
| 2008/0067530 | A1 | 3/2008 | Forrest et al. |
| 2008/0124572 | A1 | 5/2008 | Mizuki et al. |
| 2008/0203406 | A1 | 8/2008 | He et al. |
| 2010/0295445 | A1 | 11/2010 | Kuma et al. |
| 2010/0314644 | A1 | 12/2010 | Nishimura et al. |
| 2013/0140530 | A1 | 6/2013 | Kho et al. |
| 2013/0264550 | A1 | 10/2013 | Muta et al. |
| 2014/0001444 | A1 | 1/2014 | Kim et al. |
| 2014/0061545 | A1 | 3/2014 | Leroy et al. |
| 2014/0183466 | A1* | 7/2014 | Lee ....................... C09K 11/06 257/40 |
| 2014/0353596 | A1 | 12/2014 | Kim et al. |
| 2015/0194624 | A1 | 7/2015 | Jeong et al. |

FOREIGN PATENT DOCUMENTS

| | | | |
|---|---|---|---|
| CN | 102439749 | A | 5/2012 |
| CN | 103249801 | A | 8/2013 |
| CN | 103904227 | A | 7/2014 |
| JP | 2007-200938 | A | 8/2007 |
| JP | 2008-53558 | A | 3/2008 |
| JP | 2011153276 | A * | 8/2011 |
| JP | 2013-219101 | A | 10/2013 |
| KR | 10-2009-0035729 | A | 4/2009 |
| KR | 10-2012-0024624 | A | 3/2012 |
| KR | 10-2013-0062103 | A | 6/2013 |
| KR | 10-2014-0001581 | A | 1/2014 |
| KR | 10-2014-0011966 | A | 1/2014 |
| KR | 10-2014-0063428 | A | 5/2014 |
| KR | 10-2014-0085110 | A | 7/2014 |
| KR | 10-2014-0140410 | A | 12/2014 |

OTHER PUBLICATIONS

STN structure search for U.S. Appl. No. 15/134,956 conducted by the examiner, 2021, All Pages. (Year: 2021).*

Schmidbauer, Susanna et al., Chemical Degradation in Organic Light-Emitting Devices: Mechanisms and Implications for the Design of New Materials, journal, 2013, pp. 2114-2129, vol. 25, Advanced Materials.

* cited by examiner

ORGANIC LIGHT-EMITTING DEVICE

CROSS-REFERENCE TO RELATED APPLICATION

This application claims priority to and the benefit of Korean Patent Application No. 10-2015-0126453, filed on Sep. 7, 2015, in the Korean Intellectual Property Office, the entire content of which is incorporated herein by reference.

BACKGROUND

1. Field

One or more aspects of example embodiments of the present disclosure are related to an organic light-emitting device.

2. Description of the Related Art

Organic light-emitting devices are self-emission devices that have wide viewing angles, high contrast ratios, and/or short response times. In addition, OLEDs may exhibit excellent brightness, driving voltage, and/or response speed characteristics, and produce full-color images.

An organic light-emitting device may include a first electrode on a substrate, and a hole transport region, an emission layer, an electron transport region, and a second electrode sequentially positioned on the first electrode. Holes provided from the first electrode may move toward the emission layer through the hole transport region, and electrons provided from the second electrode may move toward the emission layer through the electron transport region. Carriers (such as holes and electrons) may recombine in the emission layer to produce excitons. According to electron spin statistics, singlet excitons and triplet excitons are formed at a ratio of 1:3. Transitions between singlet exciton and triplet exciton states may occur via inter-system crossing (ISC) and/or triplet-triplet fusion (TTF). In a device using a fluorescent light-emitter, singlet excitons transition from an excited state to a ground state to thereby generate light. In a device using a phosphorescent light-emitter, triplet excitons transition from an excited state to a ground state to thereby generate light.

SUMMARY

One or more aspects of example embodiments of the present disclosure are directed toward an organic light-emitting device having a long lifespan.

Additional aspects will be set forth in part in the description which follows and, in part, will be apparent from the description, or may be learned by practice of the presented embodiments.

One or more aspects of example embodiments of the present disclosure provide an organic light-emitting device including: a first electrode; a second electrode facing the first electrode; an emission layer between the first electrode and the second electrode; a hole transport region between the first electrode and the emission layer, the hole transport region including a first hole transport layer (HTL) directly contacting the emission layer; and an electron transport region between the second electrode and the emission layer, wherein the first HTL includes a first compound and a second compound, the emission layer includes a third compound and a fourth compound, an electron affinity of the second compound is greater than an electron affinity of the first compound, a lowest unoccupied molecular orbital (LUMO) energy level of the fourth compound is greater than a LUMO energy level of the third compound, the second compound and the third compound are different from each other, and a minimum anionic decomposition energy of the second compound is greater than a triplet energy of the third compound.

BRIEF DESCRIPTION OF THE DRAWINGS

These and/or other aspects will become apparent and more readily appreciated from the following description of the example embodiments, taken in conjunction with the accompanying drawings, in which.

DETAILED DESCRIPTION

Figure 1:
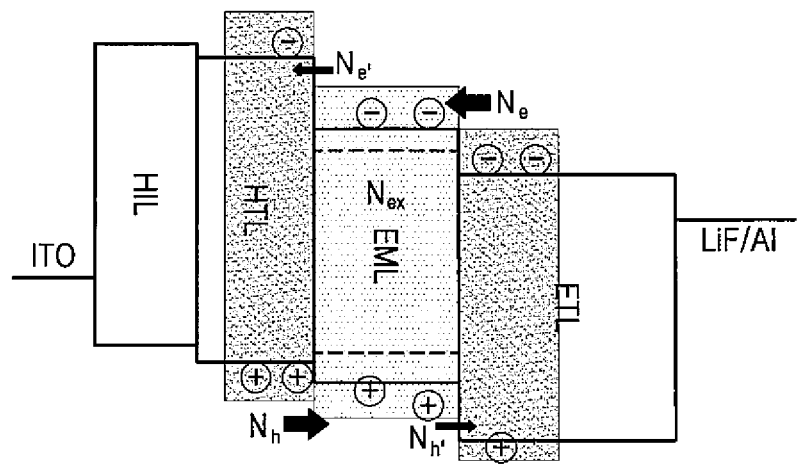
FIG. 1 illustrates an energy level diagram of an organic light-emitting device in the related art, including an injection/leakage charge concentration and an exciton concentration in an emission region under a driving luminance.

Reference will now be made in more detail to example embodiments, examples of which are illustrated in the accompanying drawings, wherein like reference numerals refer to like elements throughout, and duplicative descriptions thereof will not be provided. In this regard, the present example embodiments may have different forms and should not be construed as being limited to the descriptions set forth herein. Accordingly, the example embodiments are merely described below, by referring to the drawings, to explain aspects of the present description. As used herein, the term "and/or" includes any and all combinations of one or more of the associated listed items. Expressions such as "at least one of", "one of", "at least one selected from", and "one selected from" when preceding a list of elements, modify the entire list of elements and do not modify the individual elements of the list.

In the drawings, the thickness of layers, films, panels, regions, etc., may be exaggerated for clarity. It will be understood that when an element such as a layer, film, region, or substrate is referred to as being "on" another element, it can be directly on the other element or intervening element(s) may also be present. In contrast, when an element is referred to as being "directly on" another element, no intervening elements are present.

The performance of an organic light-emitting device may deteriorate when a particular chemical bond of an organic molecule used in the organic light-emitting device decomposes (e.g., is broken) due to reaction with charges or excitons. Accordingly, when a molecule with a smaller decomposition rate constant is used, the manufactured organic light-emitting device may have a long lifespan.

FIG. 1 illustrates an energy level diagram of an organic light-emitting device of the related art, including an injection/leakage charge concentration and an exciton concentration in an emission region under a driving luminance.

In FIG. 1, $N_e$ indicates the concentration of electrons injected from an electron transport layer (ETL) to an emission layer (EML), $N_h$ indicates the concentration of holes injected from a hole transport layer (HTL) to the EML, $N_{ex}$ indicates the concentration of excitons formed by recombination of electrons and holes in the EML, $N_h'$ indicates the concentration of holes leaking from the EML to the ETL, and $N_e'$ indicates the concentration of electrons leaking from the EML to the HTL. A chemical bond of an organic molecule used in an organic light-emitting device may decompose when the organic molecule receives exciton energy. The decomposition rate constant of the organic molecule may vary according to whether the organic molecule is in a cationic state, an anionic state, and/or a neutral state. The decomposition of the chemical bond in the organic molecule may lead to a change in the efficiency of the organic light-emitting device.

The lifetime of an organic light-emitting device may described by referring to the following Equations below.

$$\eta_{EQE} = \gamma \times \eta_{S/T} \times \varphi_{PL} \times \eta_{out}. \quad \text{Equation 1}$$

According to Equation 1, the external quantum efficiency ($\eta_{EQE}$) can be calculated as the product of the charge balance factor ($\gamma$) multiplied by an emission-allowed exciton ratio ($\eta_{S/T}$), the luminous quantum efficiency of an EML ($\varphi_{PL}$), and the external light extraction efficiency ($\eta_{out}$). The lifespan (R) can be calculated as the rate of change of the external quantum efficiency at a target luminance (e.g., derivative of $\eta_{EQE}$ with respect to time), such that the rate of change of the external quantum efficiency depends on the rates of change of the charge balance factor and the luminous quantum efficiency of the EML (e.g., derivative of $\gamma \cdot \varphi_{PL}$ with respect to time). As the change in the remaining two variables ($\eta_{S/T}$ and $\eta_{out}$) over time is negligible, the two variables may be regarded as a constant (C). The rate of change of the external quantum efficiency with respect to time is shown in Equation 2:

$$R = \frac{d\eta_{EQE}}{dt} = C \frac{\gamma \cdot d\phi_{PL} + \phi_{PL} \cdot d\gamma}{dt}. \quad \text{Equation 2}$$

According to Equation 2, the performance of an organic light-emitting device may deteriorate due to decomposition of a material in an EML, and/or a change in the charge balance factor.

The decomposition rate related to the rate of change in the luminous quantum efficiency with respect to time ($r_{ex}$) caused by the decomposition of the material for an EML can be calculated according to Equation 3:

$$r_{ex} = \frac{d\phi_{PL}}{dt} = k_{deg,nu} \cdot N_{nu} \cdot N_{ex} + \\ k_{deg,cation} \cdot N_{cation} \cdot N_{ex} + k_{deg,anion} \cdot N_{ex} \cdot N_{anion} \dots. \quad \text{Equation 3}$$

In Equation 3, $N_{nu}$, $N_{cation}$, and $N_{anion}$ respectively indicate the concentrations of the material for an EML when the material is in a neutral state, a cationic state, and an anionic state, $N_{ex}$ indicates the concentration of excitons in an EML, and $k_{deg,nu}$, $k_{deg,cation}$, and $k_{deg,anion}$ indicate the decomposition rate constants of the material for an EML when the material is in a neutral state, a cationic state, and an anionic state, respectively. The decomposition rate described by Equation 3 may also be applicable to other bonds of an organic molecule in the EML.

The decomposition rate related to a rate of change in the charge balance factor (used in Equation 2) with respect to time ($r_{bal}$) can be calculated according to Equation 4:

$$r_{bal} = \frac{d\gamma}{dt} = C_1 r_{HT} + C_2 r_{ET} + C_3 r_{EM} \quad \text{Equation 4}$$

$$r_{HT} = k_{deg,HT,an} \cdot N_{HT,ex} \cdot N_e + \\ k_{deg,HT,ca} \cdot N_{HT,ex} \cdot N_h + k_{deg,HT,nu} \cdot N_{HT,nu} \cdot N_{HT,ex} \dots$$

$$r_{ET} = k_{deg,ET,ca} \cdot N_{ET,ex} \cdot N_h + k_{deg,ET,an} \cdot N_{ET,ex} \cdot N_e + \\ k_{deg,ET,nu} \cdot N_{ET,nu} \cdot N_{ET,ex} \dots$$

$$r_{EM} = k_{deg,EM,ca} \cdot N_{EM,ex} \cdot N_h + k_{deg,EM,an} \cdot N_{EM,ex} \cdot N_e + \\ k_{deg,EM,nu} \cdot N_{EM,nu} \cdot N_{EM,ex} \dots.$$

In Equation 4, $r_{HT}$, $r_{ET}$, and $r_{EM}$ respectively indicate the decomposition rates of a hole transport layer, an electron transport layer, and an EML material, and $C_1$, $C_2$, and $C_3$ are constants. $N_{a,b}$ indicates the concentration of a material in the state of "b", the material being included in the "a" layer (for example, a HTL, an ETL, or an EML), and $k_{deg,a,b}$ indicates the decomposition rate constant of a molecule in the state of "b", the molecule being included in the "a" layer. The decomposition rate constants used in Equations 3 and 4 are bimolecular rate constants, and may be generalized in the form of Equation 5:

$$k_{deg} = A \exp\left(-\frac{E_a}{RT}\right). \quad \text{Equation 5}$$

In Equation 5, A is a value related to entropy (units of frequency per unit volume), $E_a$ is an activation energy, which is related to bond-decomposition energy, R is the Boltzmann constant, and T is the absolute temperature (e.g., in Kelvin). The decomposition energy of a molecule may vary depending on whether the molecule is in a cationic state, an anionic state, a neutral state, or an exciton state. When the decomposition energy of the molecule in a cationic state, an anionic state, and/or a neutral state is smaller (e.g., lower) than the decomposition energy of the molecule in an exciton state, it is highly likely that the molecule in a cationic state, an anionic state, and/or a neutral state may decompose.

For example, the decomposition energies in a cationic state, an anionic state, and a neutral state were compared for each of NPB (a material for a hole transport layer), ADN (a host for an EML), FD1 (a dopant for an EML), and ET1 (a material for an electron transport layer), and the resulting values are shown in Table 1. In general, the decomposition energy decreases in order for a C—C double bond, a C—C single bond, and a C—N single bond, and Table 1 shows the decomposition energy of the weakest bonds in each molecule. For comparison, the following table also shows the singlet and triplet energies of the four molecules. The method used to calculate the decomposition energies may be understood by referring to the Evaluation Examples below.

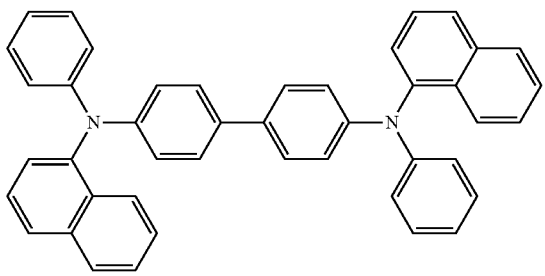

NPB

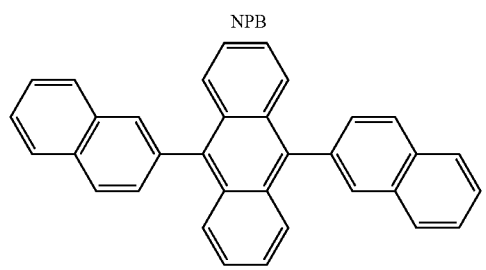

ADN

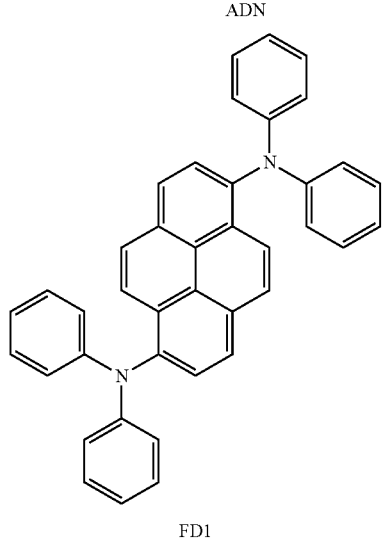

FD1

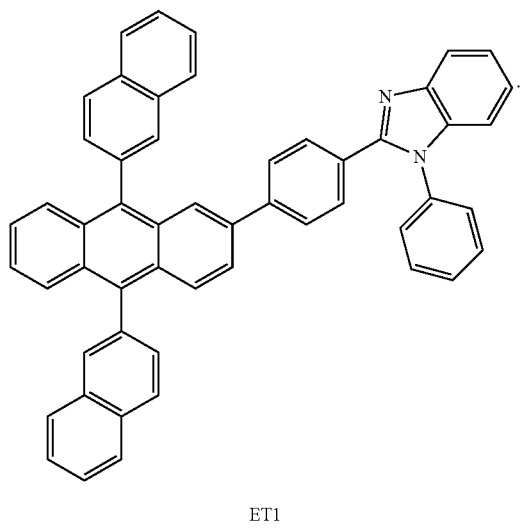

ET1

TABLE 1

|  | NPB (C—N single bond) | ADN (C—C single bond) | FD1 (C—N single bond) | ET1 (C—N single bond) |
| --- | --- | --- | --- | --- |
| Decomposition energy when in a neutral state (eV) | 3.1 | 4.5 | 3.0 | 3.5 |
| Decomposition energy when in a cationic state (eV) | 3.2 | 4.9 | 2.9 | 3.5 |
| Decomposition energy when in an anionic state (eV) | 1.5 | 3.9 | 1.5 | 2.0 |
| Singlet energy (eV) | 3.04 | 3.12 | 2.71 | 2.95 |
| Triplet energy (eV) | 2.49 | 1.76 | 1.9 | 1.71 |

As shown in Table 1, referring to Equations 3 and 5, it is seen that the decomposition energy of ADN (a host for an EML) in the neutral, cationic, and/or anionic state is greater than the singlet and triplet energies thereof. Accordingly, decomposition of ADN due to singlet and/or triplet energy transfer may not occur.

However, when FD1 (a dopant for an EML) is in an anionic state, the decomposition energy of the C—N bond is smaller than the singlet and triplet energies. The decomposition rate constant of the C—N bond when FD1 is in an anionic state is larger than the other decomposition rate constants, and accordingly, Equation 3 may be expressed (e.g., approximated) as Equation 6:

$$r_{ex} = \frac{d\phi_{PL}}{dt} \approx k_{deg,anion} \cdot N_{ex} \cdot N_{anion}.$$

Equation 6

That is, since the decomposition rate constant of the C—N bond is high when FD1 (a dopant for an EML) is in the anionic state, the luminous quantum efficiency may be decreased.

Figure 2:
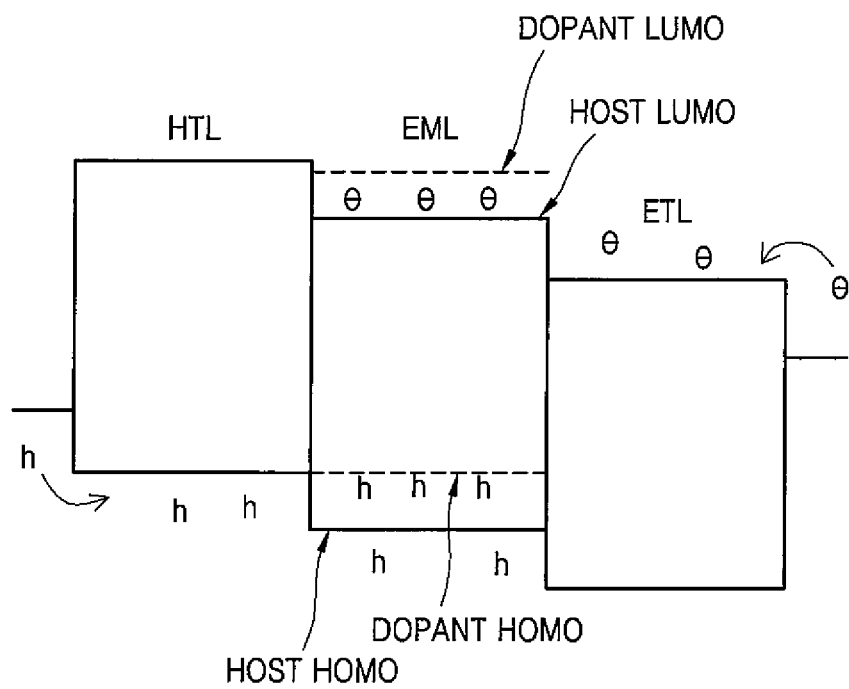
FIG. 2 illustrates an energy level diagram indicating the highest occupied molecular orbital (HOMO) and lowest unoccupied molecular orbital (LUMO) energy levels of a hole transport layer (HTL) material (NPB), an emission layer (EML) host (ADN), an emission layer (EML) dopant (FD1), and an electron transport layer (ETL) material (ET1)

FIG. 2 illustrates an energy level diagram indicating the highest occupied molecular orbital (HOMO) and lowest unoccupied molecular orbital (LUMO) energy levels of a HTL material (NPB), an EML host (ADN), an EML dopant (FD1), and an ETL material (ET1). When the energy levels of a host and a dopant in the EML are compared, regarding a hole, an energy level of the dopant lies in a trap position, that is, at a level more stable than the energy level of the host, and regarding an electron, the energy level of the dopant lies in a scatter position, that is, at a level higher than the energy level of the host. That is, in the case of a hole injected from the HTL, the hole is trapped by a dopant material, but in the case of an electron injected from the ETL, since the energy level of the dopant material lies in the scatter position, the electron may not anionize the dopant material and may anionize only the host material. Since the probability that the dopant material exists in the anionic state is substantially low, the probability that the EML deteriorates is substantially low, and the contribution of the dopant material to the deterioration of the EML, which is the first term in the numerator in Equation 2, may be reduced. To this end, the LUMO level of a dopant should be higher than the LUMO level of a host. For example, the LUMO level of the dopant molecule may be greater than the LUMO level of the host molecule by, for example, 0.1 eV or more, or 0.2 eV or more.

Referring to Table 1 and Equations 4 and 5, the decomposition energies of NPB and ET1 are the lowest in the anionic state; and in the case where NPB is in an anionic state, the decomposition energy of the C—N bond is lower than the triplet energies of ADN and/or FD1. In the case where ET1 is in an anionic state, the decomposition energy of the C—N bond is greater than the triplet energy of ADN and/or the triplet energy of FD1 and lower than the respective singlet energies thereof, and accordingly, ET1 may decompose due to singlet energy transfer, but the probability of ET1 decomposing due to triplet energy transfer is low. Thus, since NPB and ET1 have relatively large C—N bond decomposition rate constants in the anionic state, and a host material for EML has a relatively small decomposition rate constant, Equation 4 may be expressed (e.g., approximated) as Equation 7:

$$r_{bal} = \frac{d\gamma}{dt} = C_1 k_{deg,HT,an} \cdot N_{HT,ex} \cdot N_e + C_2 k_{deg,ET,an} \cdot N_{ET,ec} \cdot N_e.$$ Equation 7

That is, the rate of change of the charge balance factor, which is the second term in the numerator of Equation 2, depends on the decomposition of a material for the HTL and a material for the ETL.

Figures 3, 4:
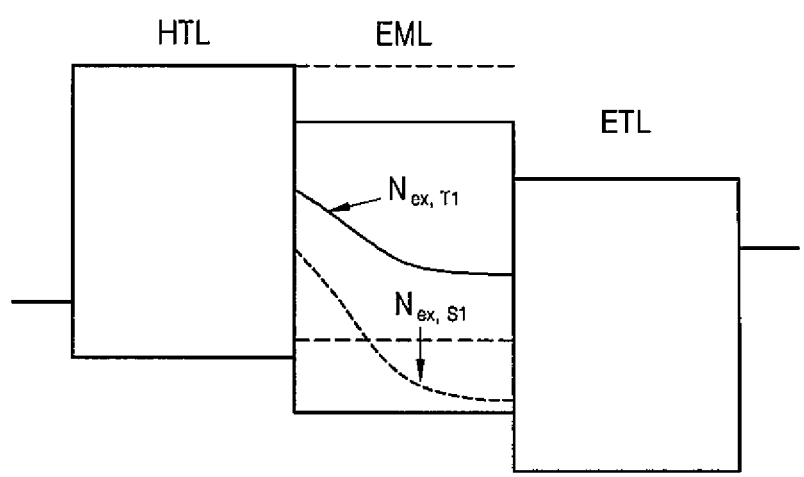
FIG. 3 illustrates an exciton concentration distribution in an emission layer of an organic light-emitting device.
FIG. 4 illustrates a schematic view of an organic light-emitting device according to an embodiment of the present disclosure.

FIG. 3 illustrates the exciton concentration distribution in an EML of an organic light-emitting device in the related art. In an EML, a hole is located in a trap position, and an electron is located in a scattering position. Accordingly, in the EML, electron mobility may be about $10^2$ to $10^3$ times larger than hole mobility. Due to the difference in mobility, electrons move faster than holes in an EML at a particular applied voltage, and accordingly, the exciton concentration in the EML may be the greatest at the interface between a HTL and the EML, and may decrease in the direction moving from the EML to the interface between the EML and an ETL. The transition time of a singlet exciton may be, for example, a few nanoseconds (ns), and the fastest transition time of a triplet exciton may be for example, tens of microseconds (μs) due to a delay by TTF-induced fluorescence. Accordingly, when the transition time is taken into consideration, per unit time, the concentration of triplet excitons may be about 1,000 times the concentration of singlet excitons.

The concentration of singlet excitons in the EML at the interface between the HTL and the EML may be about 100 times that at the interface between the ETL and the EML, due to the difference between hole mobility and electron mobility in the EML. Also, since the bond decomposition energy of a material for the HTL in the anionic state is lower than that of a material for the ETL in the anionic state (for example, by 0.5 eV), the decomposition rate constant of the material for the HTL is greater than that of the material for the ETL. Accordingly, the probability of decomposition of the material for the HTL is substantially higher than the probability of decomposition of the material for the ETL.

The bond decomposition energy of a material for the ETL in the anionic state is greater than the triplet energy of a host material for the EML, and accordingly, the decomposition rate constant of the material for the ETL is low, and thus, the probability of decomposition of the material for the ETL is low. However, the bond decomposition energy of a material for the HTL when in the anionic state is smaller than the triplet energy of the host for the EML, such that the material for the HTL may have a relatively high decomposition rate constant, and accordingly, the material for the HTL may thereby have a higher probability of decomposition.

Accordingly, the decomposition of the material for the HTL may be a main cause for the deterioration in performance of an organic light-emitting device, and an organic light-emitting device having a long lifespan may be obtainable by preventing or reducing the decomposition of a material of an HTL.

FIG. 4 illustrates a schematic view of an organic light-emitting device 10 according to an embodiment of the present disclosure. The organic light-emitting device 10 includes a first electrode 110, a hole transport region 130, an EML 150, an electron transport region 170, and a second electrode 190.

Hereinafter, the structure of an organic light-emitting device according to an embodiment of the present disclosure and a method of manufacturing an organic light-emitting device according to an embodiment of the present disclosure will be described in connection with FIG. 4.

In FIG. 4, a substrate may be under the first electrode 110 and/or above the second electrode 190. The substrate may be a glass substrate and/or a transparent plastic substrate, each with excellent mechanical strength, thermal stability, transparency, surface smoothness, ease of handling, and/or water-resistance.

The first electrode 110 may be formed by depositing and/or sputtering a material for forming the first electrode 110 on the substrate. When the first electrode 110 is an anode, the material for the first electrode 110 may be selected from materials with a high work function to facilitate hole injection. The first electrode 110 may be a reflective electrode, a semi-transmissive electrode, and/or a transmissive electrode. The material for the first electrode 110 may be a transparent and/or highly conductive material, and non-limiting examples of such a material may include indium tin oxide (ITO), indium zinc oxide (IZO), tin oxide ($SnO_2$), and zinc oxide (ZnO). When the first electrode 110 is a semi-transmissive electrode and/or a reflective electrode, at least one selected from magnesium (Mg), aluminum (Al), aluminum-lithium (Al—Li), calcium (Ca), magnesium-indium (Mg—In), and magnesium-silver (Mg—Ag) may be used as a material for forming the first electrode 110.

The first electrode 110 may have a single-layer structure and/or a multi-layer structure including two or more layers. For example, the first electrode 110 may have a three-layered structure of ITO/Ag/ITO, but embodiments of the structure of the first electrode 110 are not limited thereto.

On the first electrode 110, the hole transport region 130, the EML 150, and the electron transport region 170 are sequentially stacked in this stated order.

The hole transport region 130 includes a first HTL that directly contacts the EML 150, and the first HTL may include a first compound and a second compound.

The first compound may be selected from m-MTDATA, TDATA, 2-TNATA, NPB, β-NPB, TPD, Spiro-TPD, Spiro-NPB, methylated NPB, TAPC, HMTPD, TCTA, and compounds represented by Formulae 1A and 1B:

-continued
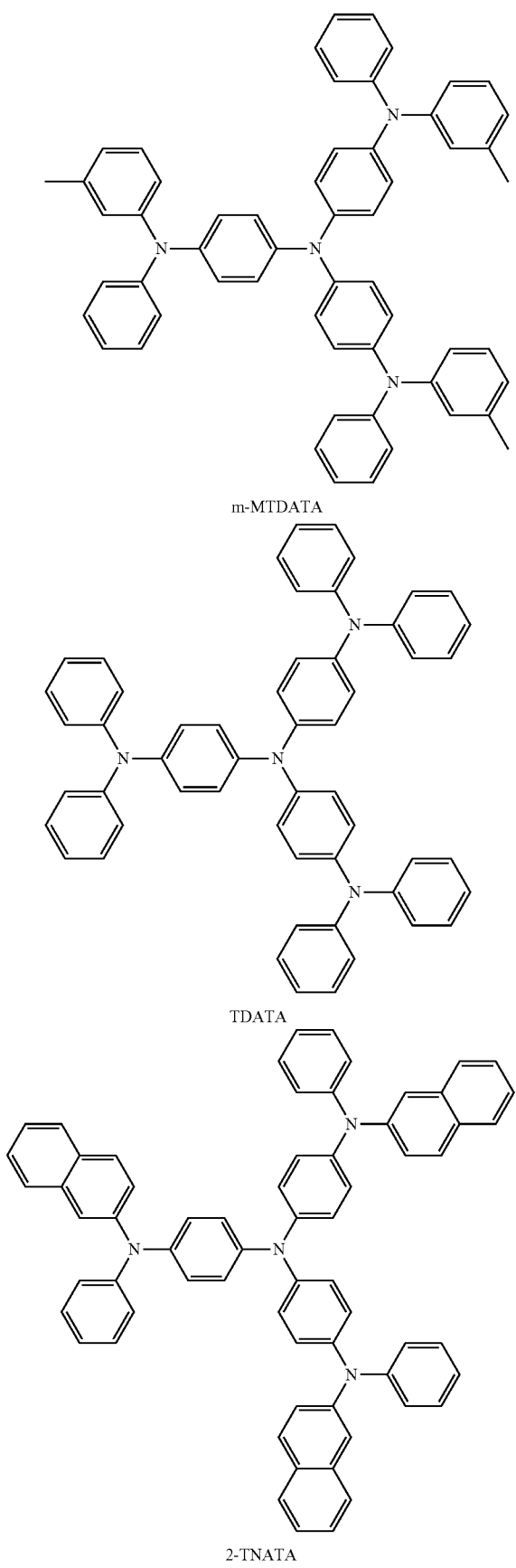
m-MTDATA
TDATA
2-TNATA
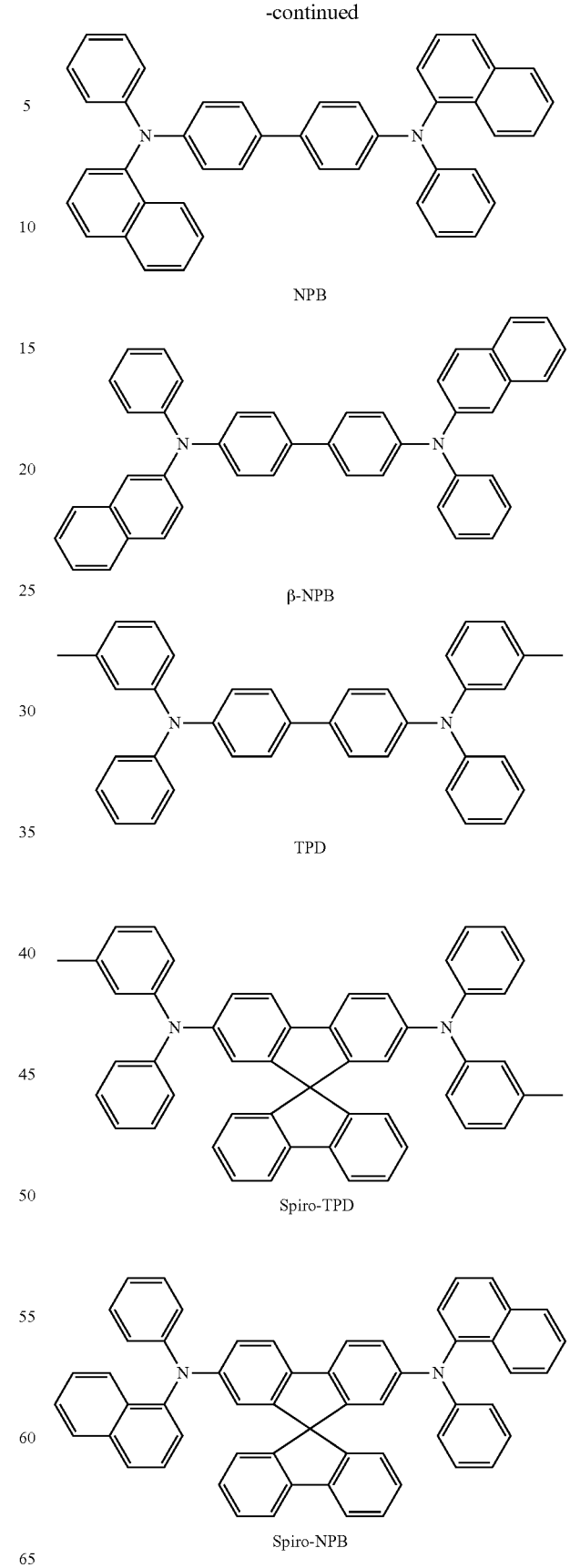
NPB
β-NPB
TPD
Spiro-TPD
Spiro-NPB -continued

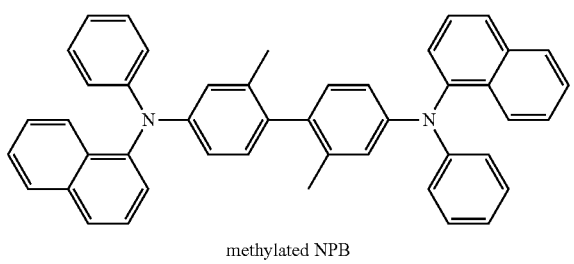

methylated NPB

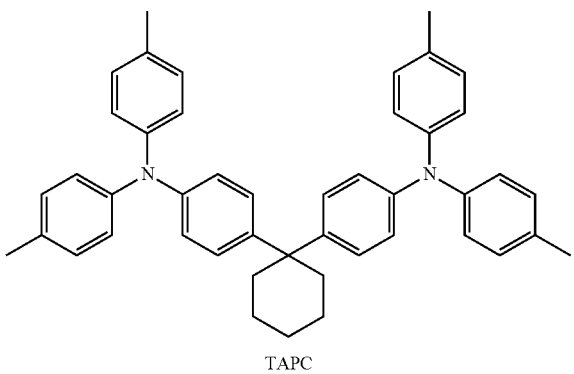

TAPC

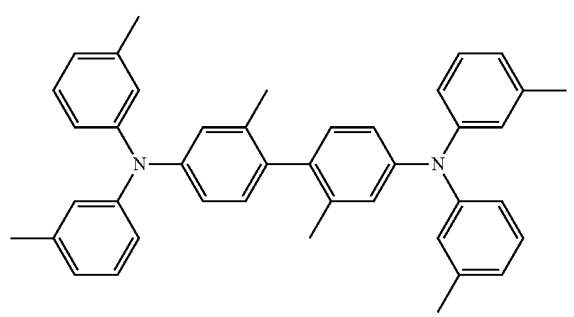

HMTPD

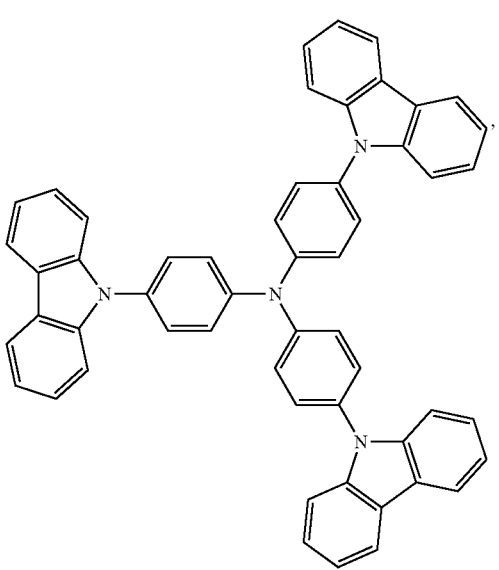

TCTA

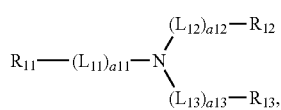

Formula 1A

-continued

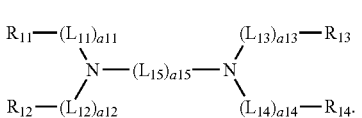

Formula 1B

In Formulae 1A and 1B, $L_{11}$ to $L_{15}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a11 to a14 may each independently be selected from 0, 1, 2, and 3, a15 may be selected from 1, 2, 3, 4, and 5; and $R_{11}$ to $R_{14}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, the first compound may be represented by Formula 1A(1) or 1B(1):

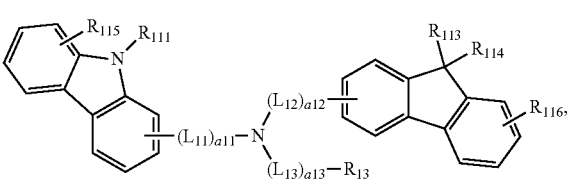

Formula 1A(1)

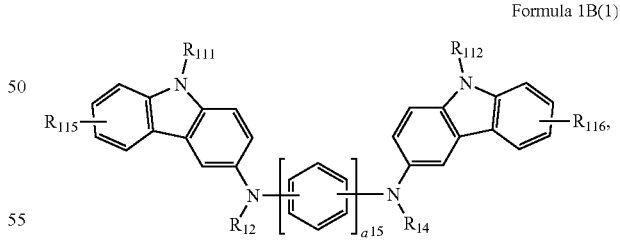

Formula 1B(1)

In Formulae 1A(1) and 1B(1), $L_{11}$ to $L_{13}$, a11 to a13, a15, and $R_{12}$ to $R_{14}$ may each be the same as described herein in connection with Formulae 1A and 1B, and $R_{111}$ and $R_{112}$ may each be the same as described herein in connection with $R_{13}$, and $R_{113}$ to $R_{116}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formulae 1A(1) and 1B(1), $L_{11}$ to $L_{13}$ may each independently be selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, a11 to a13 may each independently be selected from 0 and 1, $R_{12}$ to $R_{14}$, $R_{111}$, and $R_{112}$ may each independently be selected from:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, $R_{113}$ and $R_{114}$ may each independently be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, $R_{115}$ and $R_{116}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and a15 may be selected from 1 and 2.

For example, $R_{113}$ and $R_{114}$ in Formula 1A(1) may bind (e.g., couple) to each other and form a saturated or unsaturated ring.

The first compound may be represented by one selected from Compounds HT1 to HT20, but embodiments of the present disclosure are not limited thereto:

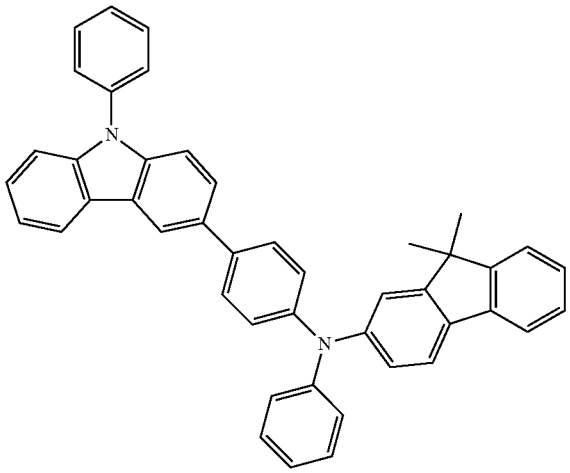

HT1

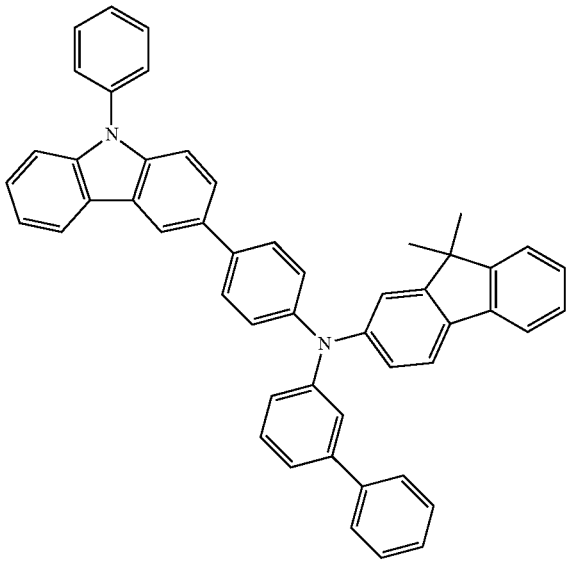

HT2

HT3
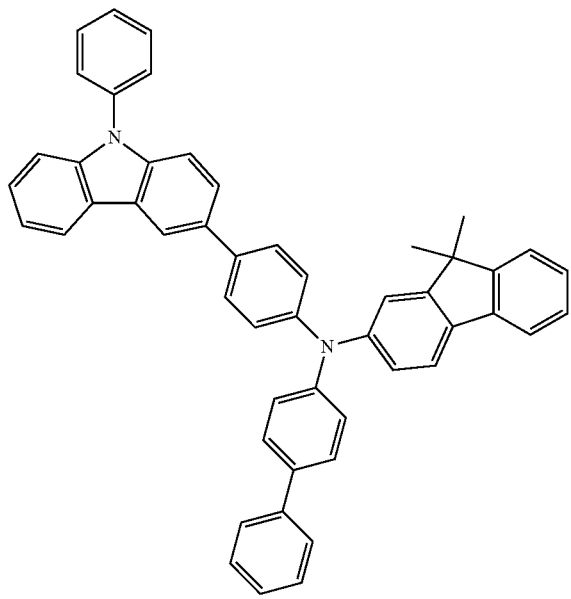
HT4
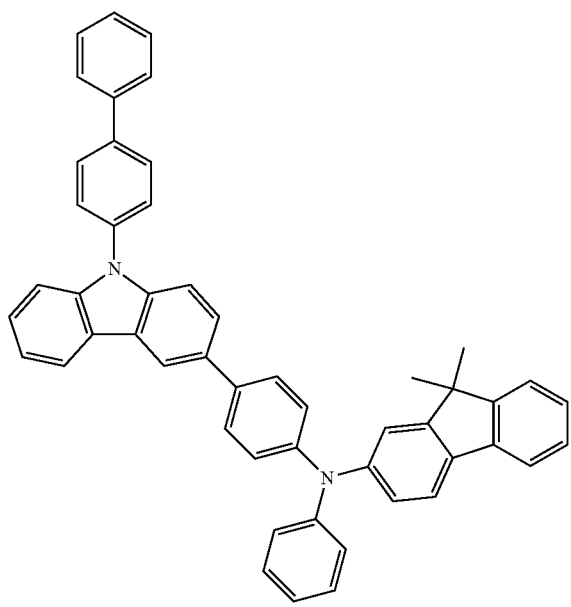
HT5
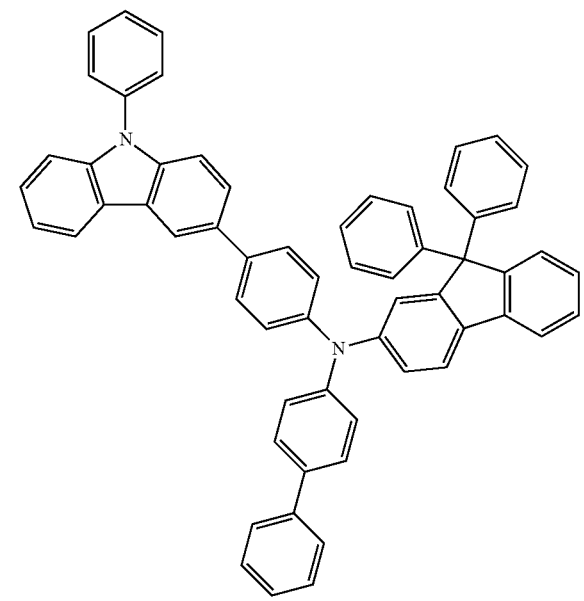
HT6
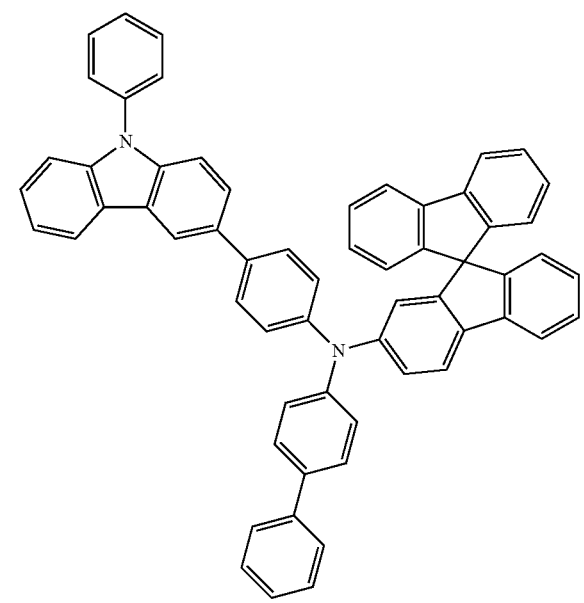

HT7
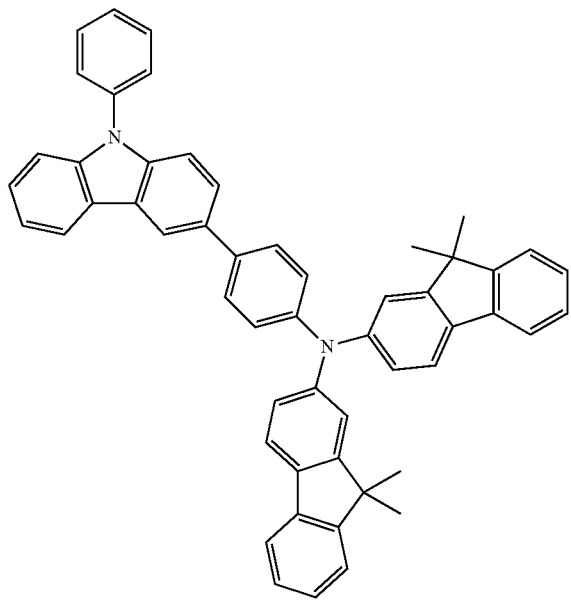
HT8
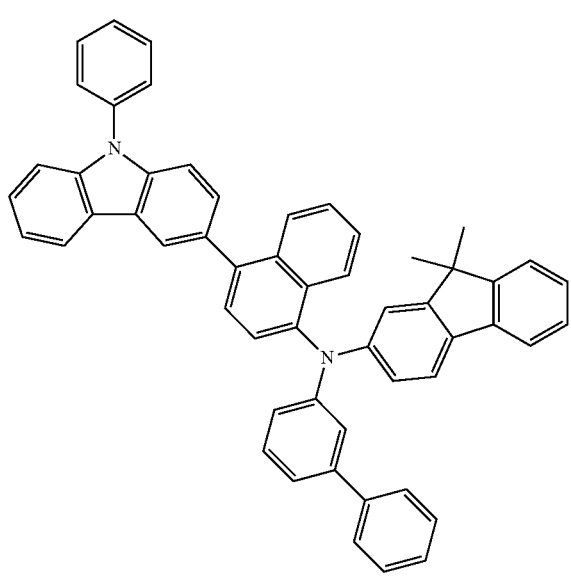
HT9
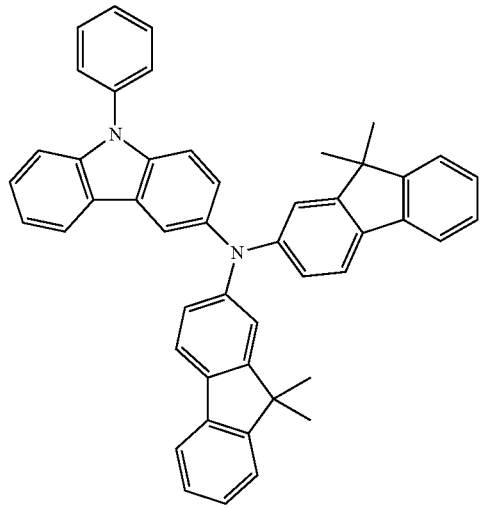
HT10
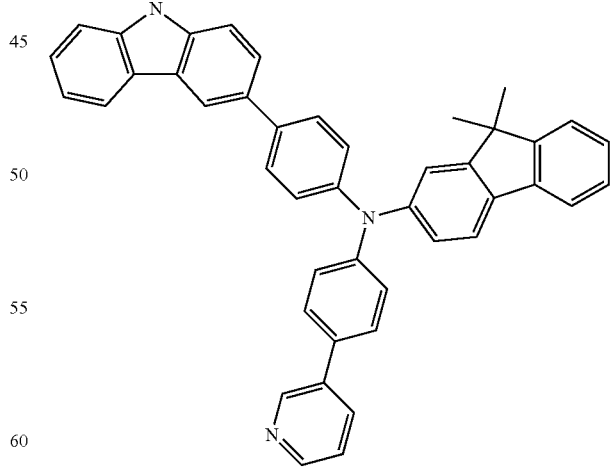

HT11
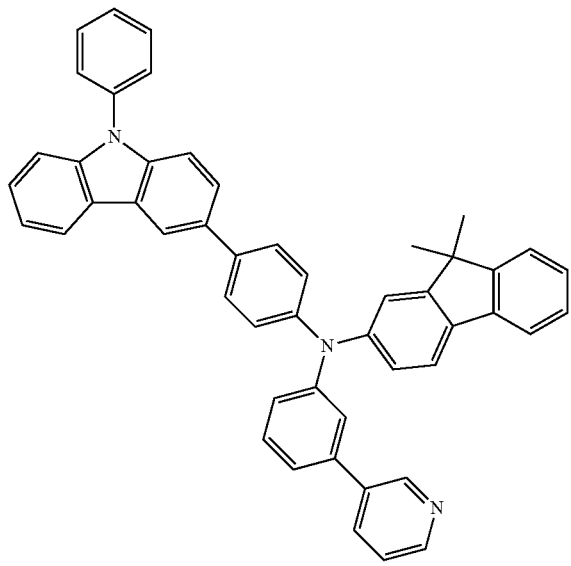
HT14
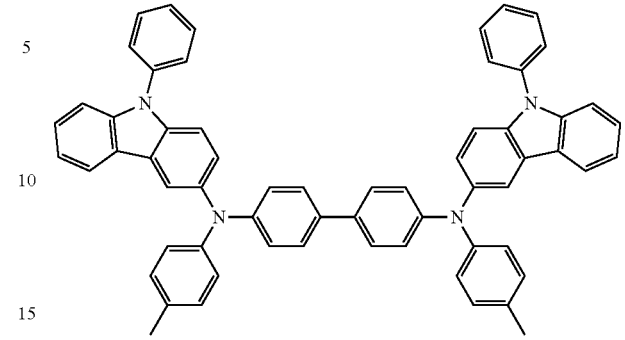
HT15
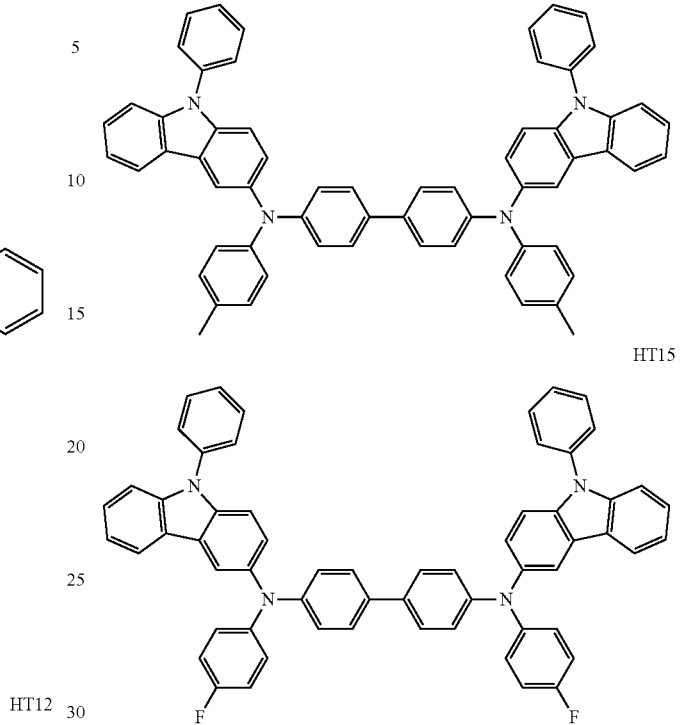
HT12
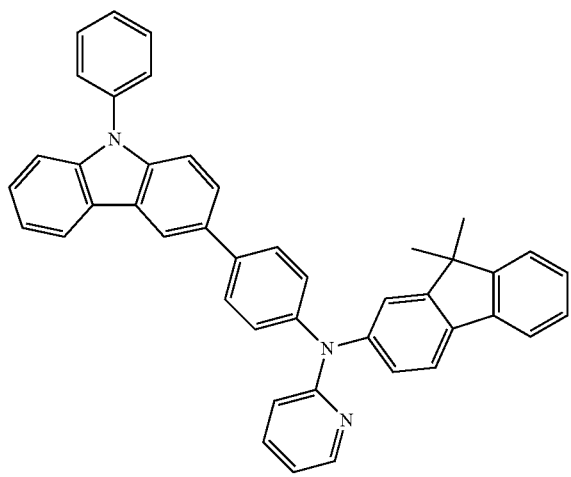
HT16
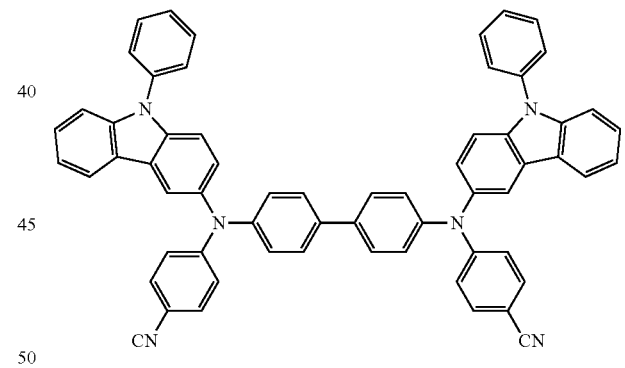
HT13
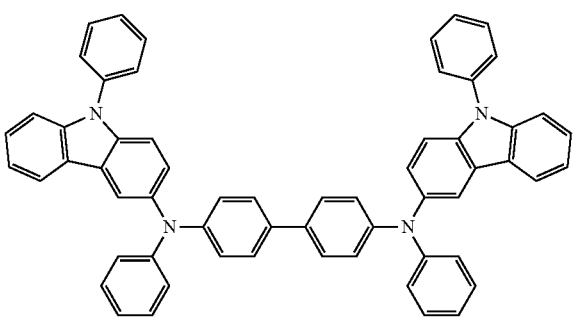
HT17
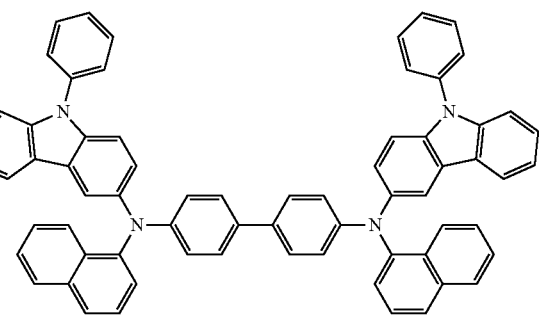

-continued

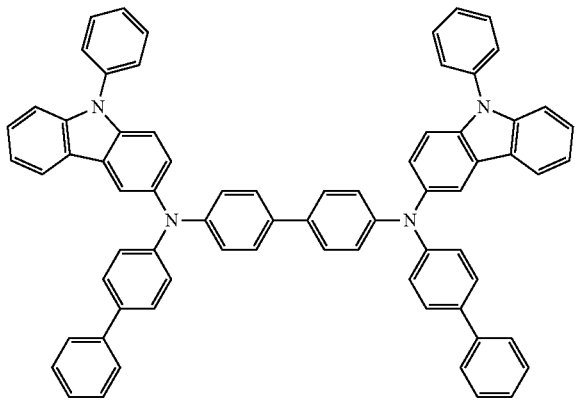
HT18

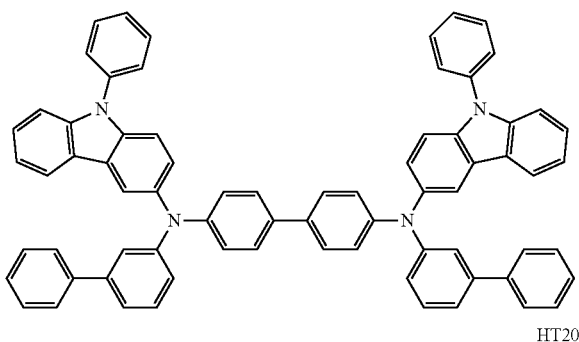
HT19

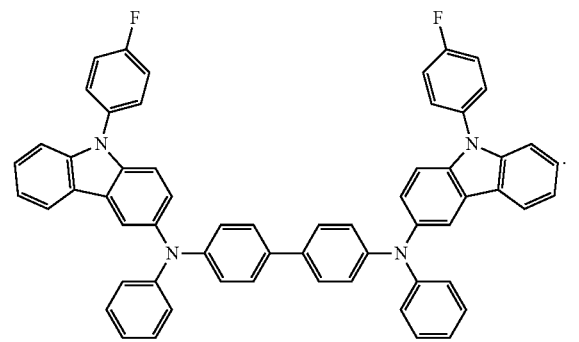
HT20

The second compound may be represented by one selected from Formula 2A and 2B:

$$Ar_{21}-[(L_{21})_{a21}-R_{21}]_{b21},$$ Formula 2A

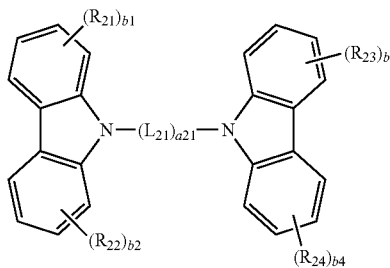
Formula 2B

In Formulae 2A and 2B, $Ar_{21}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{31}$)($Q_{32}$)($Q_{33}$), $L_{21}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a21 may be selected from 0, 1, 2, and 3, $R_{21}$ to $R_{24}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, b21 may be selected from 1, 2, 3, and 4, and b1 to b4 may each independently be selected from an integer of 0 to 4, wherein $Q_{31}$ to $Q_{33}$ may each independently be selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group.

In some embodiments, the second compound may be further represented by one selected from Formula 2A(1), Formula 2A(2), and Formula 2B(1):

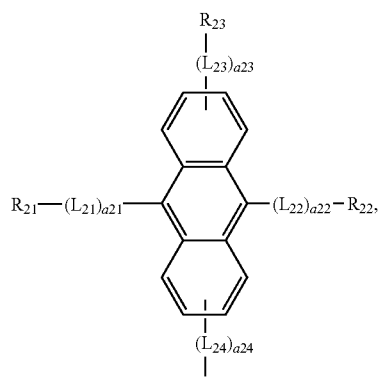

Formula 2A(1)

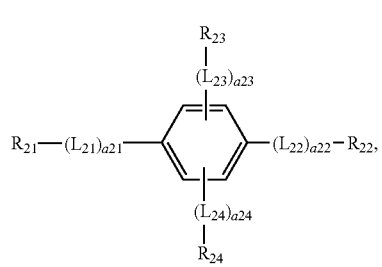

Formula 2A(2)

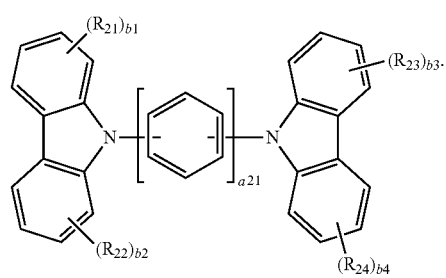

Formula 2B(1)

In Formulae 2A(1), 2A(2), and 2B(1), $L_{21}$ to $L_{24}$ may each independently be selected from a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, and a dibenzocarbazolylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, and a dibenzocarbazolyl group, a21 to a24 may each independently be an integer selected from 0 to 3, $R_{21}$ to $R_{24}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, and a naphthyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a benzimidazolyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a benzimidazolyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a benzimidazolyl group, a quinolinyl group, an isoquinolinyl group, a quinoxalinyl group, a quinazolinyl group, a carbazolyl group, and a triazinyl group, and b1 to b4 may each independently be an integer selected from 0 to 4.

In some embodiments, the second compound may be further represented by one selected from Compounds 1 to 4, but embodiments of the present disclosure are not limited thereto:

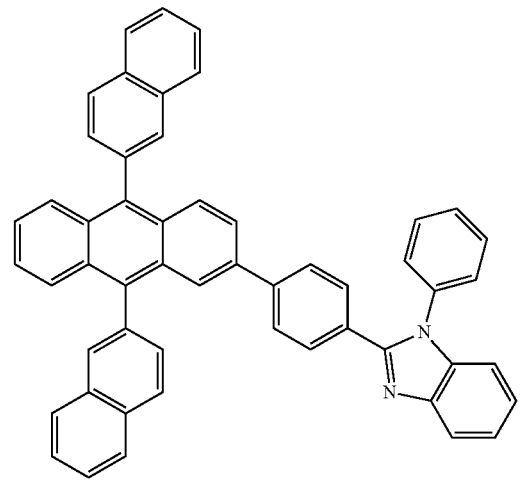

Compound 1

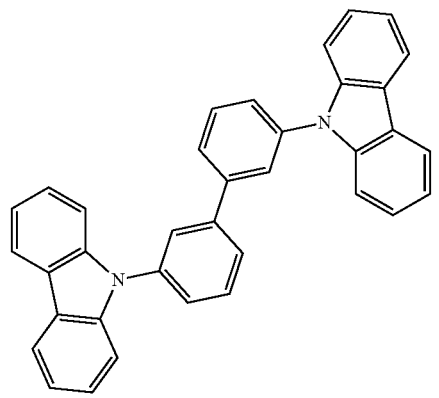

Compound 2

Compound 3

Compound 4

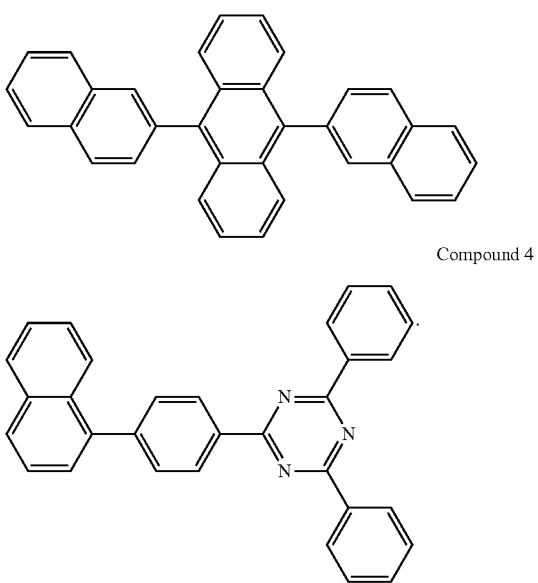

Alternatively, the second compound may be further represented by one selected from Formula 601 and 602:

$$Ar_{601}-[(L_{601})_{xe1}-E_{601}]_{xe2}.$$  Formula 601

In Formula 601, $Ar_{601}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{301}$)($Q_{302}$)($Q_{303}$) (wherein $Q_{301}$ to $Q_{303}$ may each independently be selected from hydrogen, a $C_1$-$C_{60}$ alkyl group, a $C_2$-$C_{60}$ alkenyl group, a $C_6$-$C_{60}$ aryl group, or a $C_1$-$C_{60}$ heteroaryl group), $L_{601}$ may be the same as described herein in connection with $L_{11}$, $E_{601}$ may be selected from:

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, xe1 may be selected from 0, 1, 2, and 3, and xe2 may be selected from 1, 2, 3, and 4.

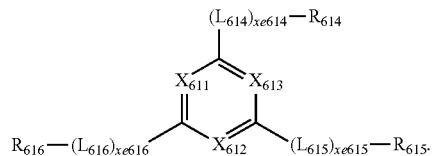

Formula 602

In Formula 602, $X_{611}$ may be selected from nitrogen (N) and C-$(L_{611})_{xe611}$-$R_{611}$, $X_{612}$ may be selected from N and C-$(L_{612})_{xe12}$-$R_{612}$, $X_{613}$ may be selected from N and C-$(L_{613})_{xe613}$-$R_{613}$, and at least one selected from $X_{611}$ to $X_{613}$ may be N, $L_{611}$ to $L_{616}$ may each be the same as described herein in connection with $L_{11}$, $R_{611}$ to $R_{616}$ may each independently be selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and xe611 to xe616 may each independently be selected from 0, 1, 2, and 3.

A compound represented by Formula 601 and a compound represented by Formula 602 may each independently be selected from Compounds ET1 to ET15:

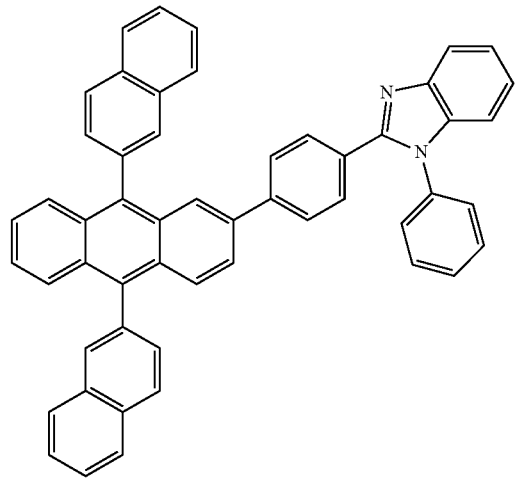

ET1

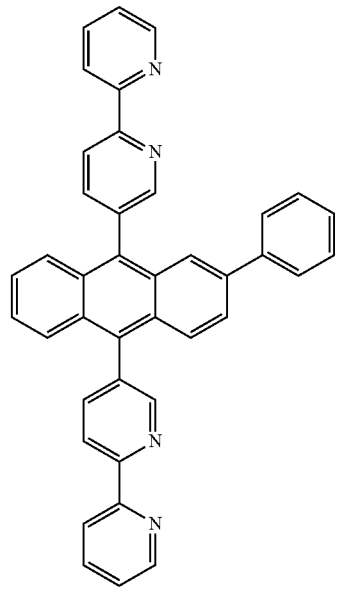

ET2

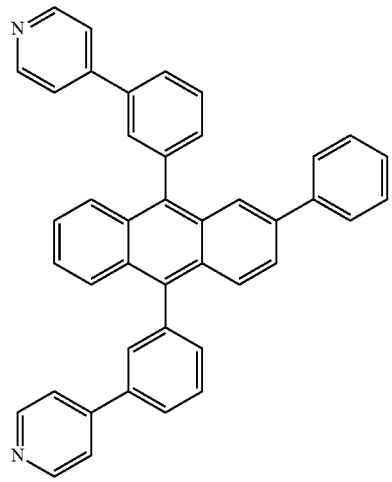

ET3

ET4
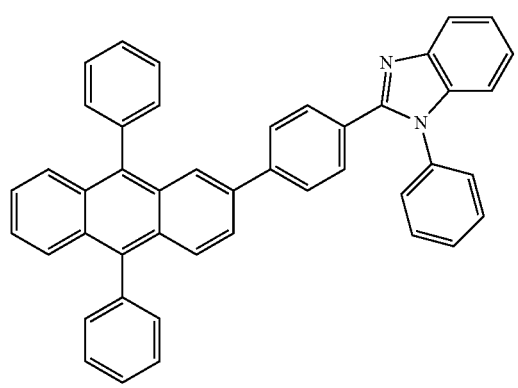
ET7
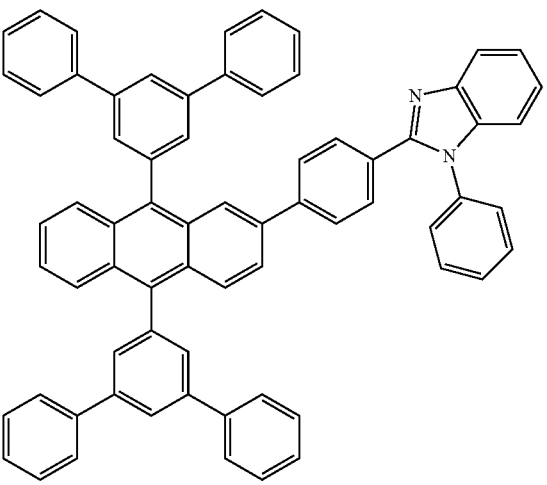
ET5
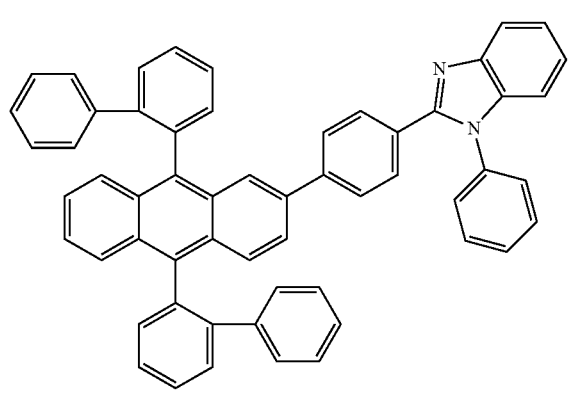
ET8
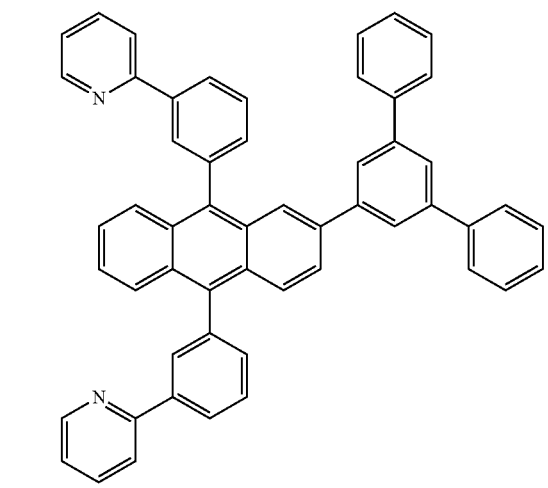
ET6
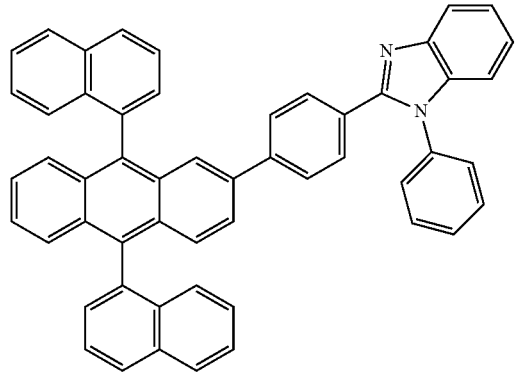
ET9
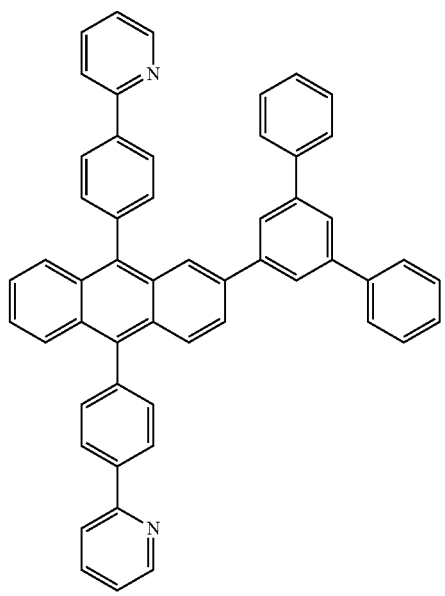

ET10

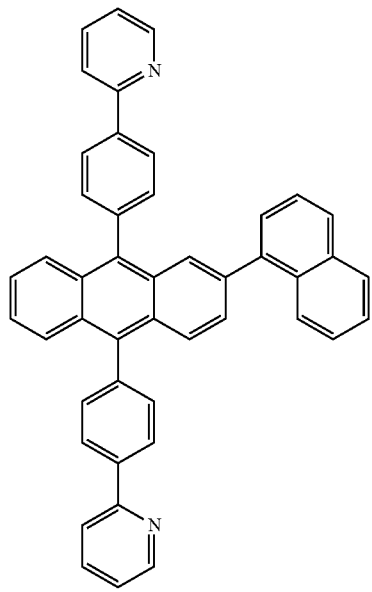

ET11

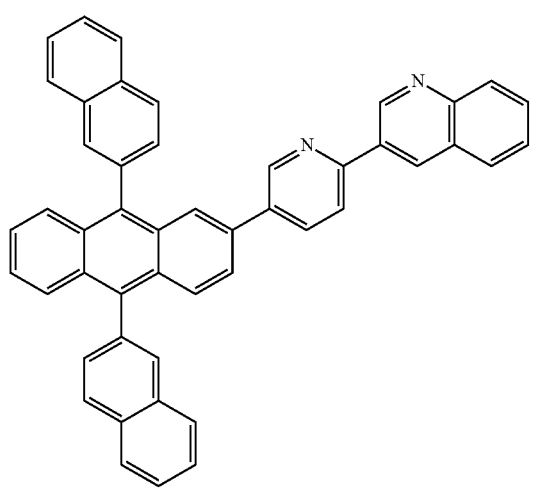

ET12

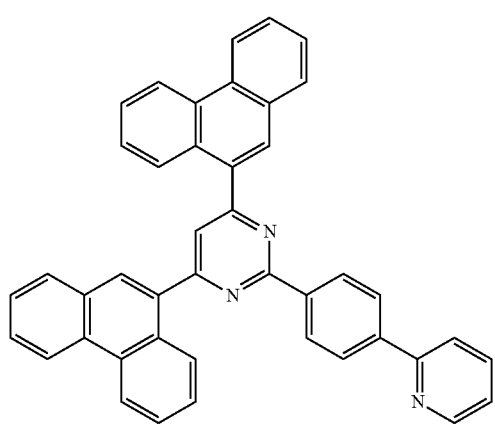

ET13

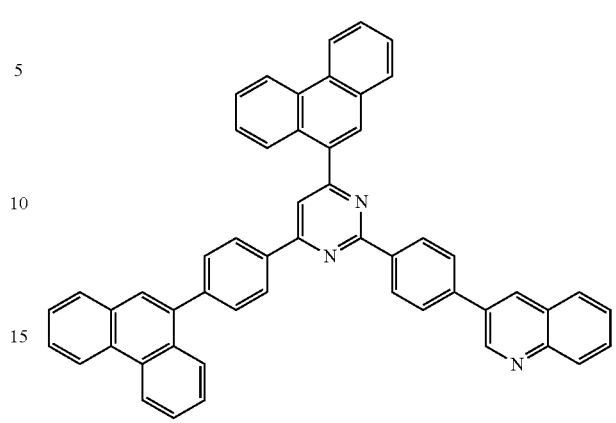

ET14

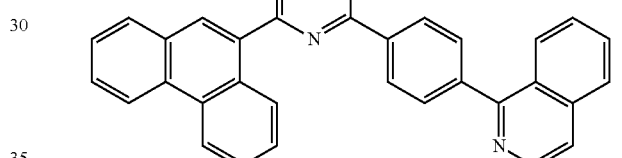

ET15

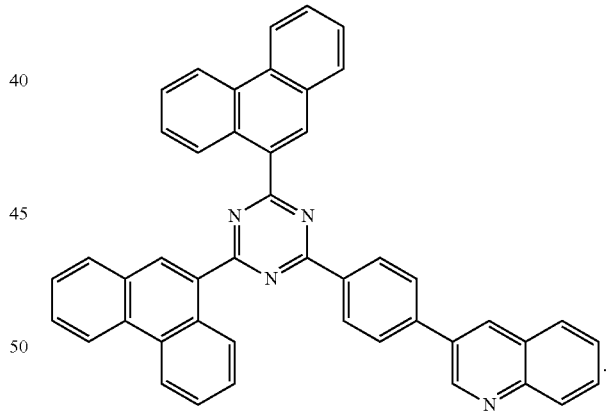

In some embodiments, the first HTL may include the first compound selected from compounds represented by Formulae 1A and 1B, and the second compound selected from compounds represented by Formulae 2A and 2B.

In some embodiments, the first HTL may include the first compound selected from compounds represented by Formulae 1A(1) and 1B(1), and the second compound selected from compounds represented by Formulae 2A(1), 2A(2), and 2B(1).

In some embodiments, the first HTL may include the first compound selected from Compounds HT1 to HT20, and the second compound selected from Compounds 1 to 4.

In some embodiments, the first HTL may include the first compound selected from Compounds HT1 to HT20, and the second compound selected from Compounds ET1 to ET15.

The weight ratio of the first compound to the second compound in the first HTL may be 99:1 to 50:50, and in some embodiments, 99:1 to 80:20. When the weight ratio is within these ranges, electrons leaking from the EML to the first HTL may be trapped, thereby preventing or reducing anionization of the first compound. Accordingly, deterioration in the performance of an organic light-emitting device 10 may be prevented or reduced.

The thickness of the first HTL may be 10 Å to 10,000 Å, and in some embodiments, 50 Å to 1,000 Å. When the thickness of the first HTL is within these ranges, movement of holes and electrons in an organic light-emitting device may be balanced without an increase in driving voltage.

The hole transport region 130 may further include at least one selected from a hole transport layer, a hole injection layer, and a buffer layer between the first electrode 110 and the first hole transport layer.

For example, the hole transport region 130 may have a structure of hole injection layer/first hole transport layer, hole injection layer/buffer layer/first hole transport layer, buffer layer/first hole transport layer, hole injection layer/second hole transport layer/first hole transport layer, second hole transport layer/first hole transport layer, buffer layer/second hole transport layer/first hole transport layer, and/or hole injection layer/buffer layer/second hole transport layer/first hole transport layer, wherein layers of each structure are sequentially stacked on the first electrode 110 in this stated order. However, embodiments of the structure of the hole transport region 130 are not limited thereto.

The hole transport region may further include a second HTL directly contacting the first hole transport layer.

The second HTL may include a fifth compound.

The fifth compound may be identical to or different from the first compound.

For example, the fifth compound may be identical to the first compound.

For example, the fifth compound may be represented by Formula 1A and/or 1B.

In some embodiments, the fifth compound may be represented by Formula 1A(1) and/or 1B(1).

In some embodiments, the fifth compound may be selected from Compounds HT1 to HT20, but embodiments of the present disclosure are not limited thereto.

The thickness of the second HTL may be 10 Å to 10,000 Å, and in some embodiments, 50 Å to 2,000 Å. When the thickness of the second HTL is within these ranges, movement of holes and electrons in an organic light-emitting device may be balanced without an increase in driving voltage.

When the hole transport region includes a hole injection layer, the hole injection layer may be formed on the first electrode 110 using one or more suitable methods, such as vacuum deposition, spin coating, casting, an Langmuir-Blodgett (LB) method, inkjet printing, laser printing, and/or laser induced thermal imaging (LITI). Methods of forming the first hole transport layer, the second hole transport layer, and the buffer layer may be the same as those used to form the hole injection layer.

When the hole injection layer is formed by vacuum deposition, the vacuum deposition, for example, may be performed at a deposition temperature of about 100° C. to about 500° C., at a vacuum degree of about $10^8$ torr to about $10^{-3}$ torr, and at a deposition rate of about 0.01 Å/sec to about 100 Å/sec, depending on the compound to be deposited in the hole injection layer and the structure of the hole injection layer to be formed.

When the hole injection layer is formed by spin coating, the spin coating may be performed at a coating rate of about 2,000 rpm to about 5,000 rpm and at a heat treatment temperature of about 80° C. to about 200° C., depending on the compound to be deposited in the hole injection layer and the structure of the hole injection layer to be formed.

The thickness of the hole transport region may be about 100 Å to about 10,000 Å, and in some embodiments, about 100 Å to about 1,000 Å. When the hole transport region includes a hole injection layer and a buffer layer, the thickness of the hole injection layer may be about 100 Å to about 10,000 Å, and in some embodiments, about 100 Å to about 1,000 Å; the thickness of the buffer layer may be about 50 Å to about 2,000 Å, and in some embodiments, about 100 Å to about 1,500 Å. When the thicknesses of the hole transport region, the hole injection layer, and the buffer layer are within these ranges, satisfactory hole transport characteristics may be obtained without a substantial increase in driving voltage.

The hole transport region may further include, in addition to the material described above, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant may include a quinone derivative (such as tetracyanoquinonedimethane (TCNQ), 2,3,5,6-tetrafluoro-tetracyano-1,4-benzoquinonedimethane (F4-TCNQ), and/or 2,2-(perfluoronaphthalene-2,6-diylidene)dimalononitrile (F6-TCNNQ)), a metal oxide (such as a tungsten oxide and/or a molybdenum oxide), and Compound HT-D1, but embodiments of the present disclosure are not limited thereto.

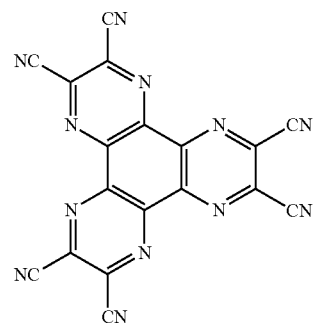

Compound HT-D1

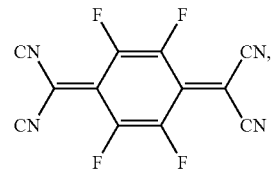

F4-TCNQ

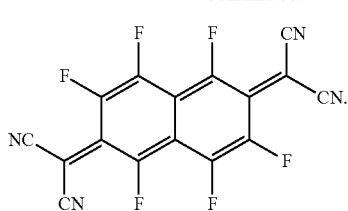

F6-TCNNQ

The hole transport region may further include, in addition to the first HTL described above, at least one selected from a hole injection layer and a buffer layer. The buffer layer may compensate for an optical resonance distance according to a wavelength of light emitted from the EML (e.g., be used to adjust the optical resonance distance to match the wavelength of light emitted from the emission layer), thereby improving the light-emission efficiency of a formed organic light-emitting device. A material included in the hole transport region may also be used as a material included in the buffer layer.

The EML may be formed on the first electrode 110 or on the hole transport region using one or more suitable methods such as vacuum deposition, spin coating, casting, an LB method, inkjet printing, laser printing, and/or LITI. When the EML is formed by vacuum deposition and/or spin coating, the deposition and coating conditions for the EML may be similar to the deposition and coating conditions used for the hole injection layer.

When the organic light-emitting device 10 is a full color organic light-emitting device, the EML may be patterned into a red EML, a green EML, and/or a blue EML, according to a sub pixel. Alternatively, the EML may have a structure in which a red EML, a green EML, and a blue EML are stacked on one another, or a structure in which a red-light emitting material, a green-light emitting material, and a blue-light emitting material are mixed with one another in a single layer to thereby emit white light.

The EML may include a host and a dopant.

The host may be a third compound, and the dopant may be a fourth compound.

The third compound may be represented by Formula 3:

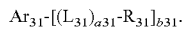

Formula 3

In Formula 3, $Ar_{31}$ may be selected from an anthracene and an indenoanthracene; and an anthracene and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{31}$)($Q_{32}$)($Q_{33}$), $L_{31}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a31 may be selected from 0, 1, 2, and 3, $R_{31}$ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and b31 may be selected from 1, 2, 3, and 4, wherein $Q_{31}$ to $Q_{33}$ may each independently be selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group.

For example, in Formula 3, $L_{31}$ may be selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, and $R_{31}$ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group.

The third compound may be represented by one selected from Compounds H1 to H45, but embodiments of the present disclosure are not limited thereto:

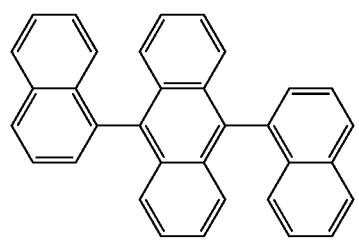

H1

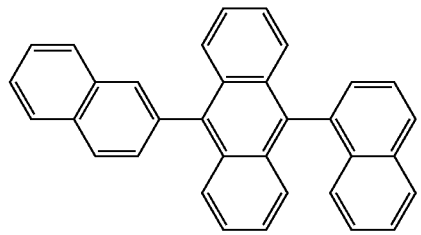

H2

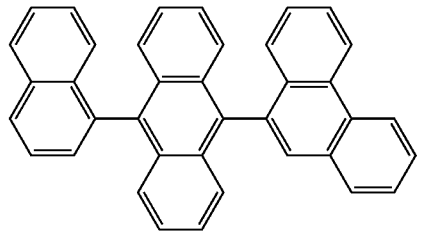

H3

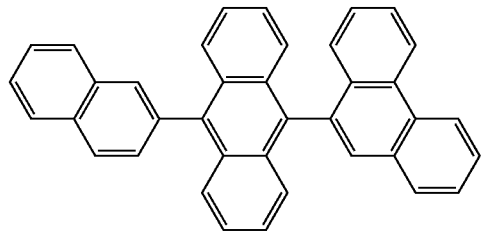

H4

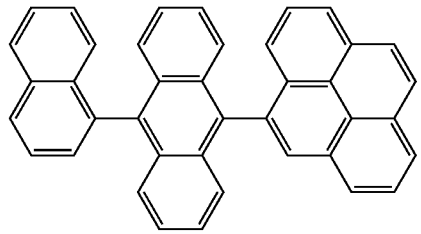

H5

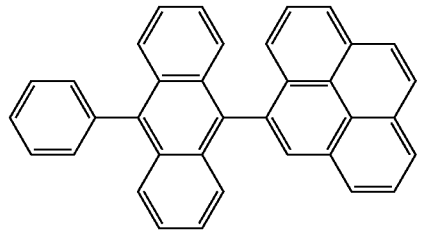

H6

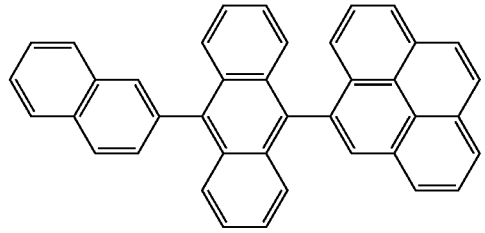

H7

H8
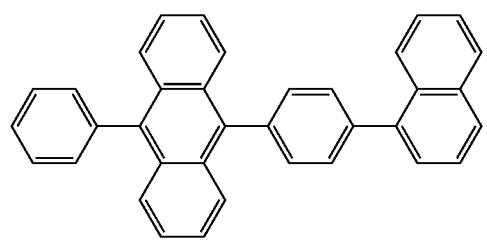
H9
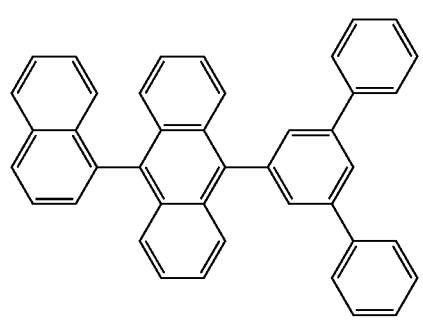
H10
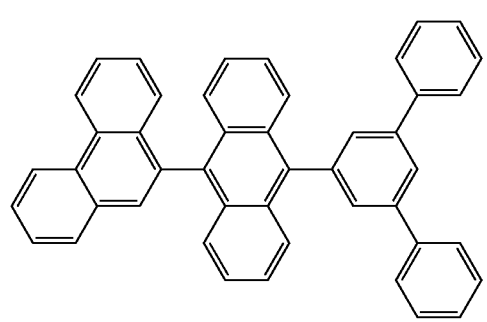
H11
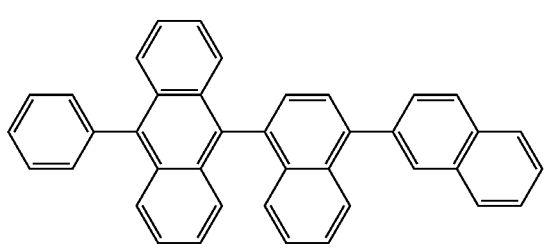
H12
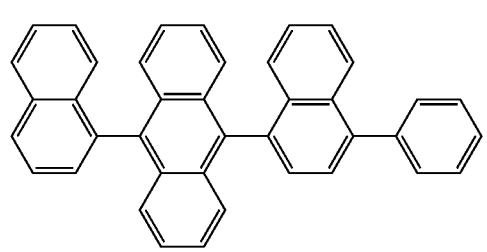
H13
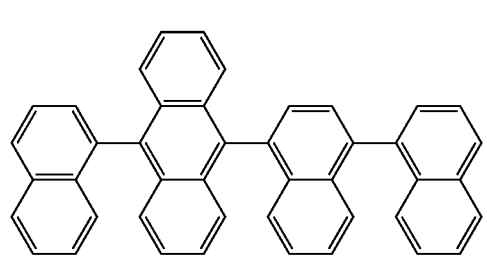
H14
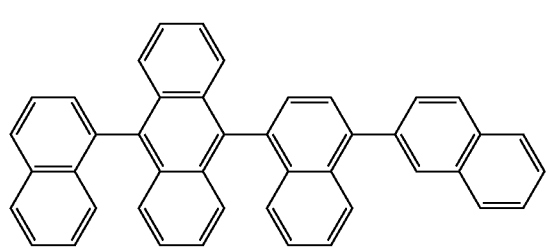
H15
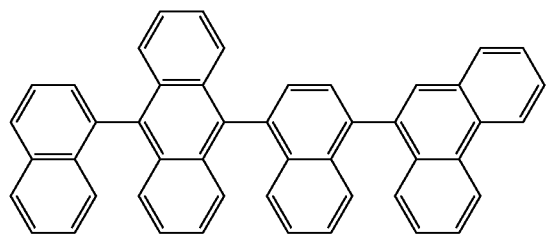
H16
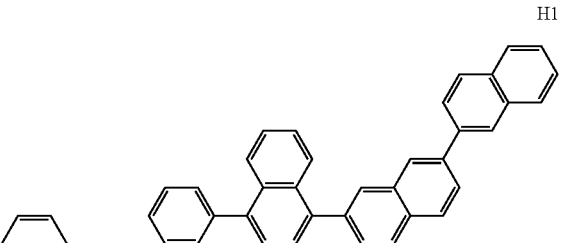
H17
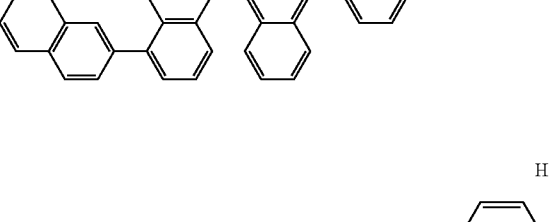
H18
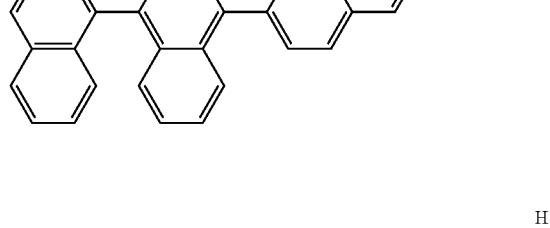

H19
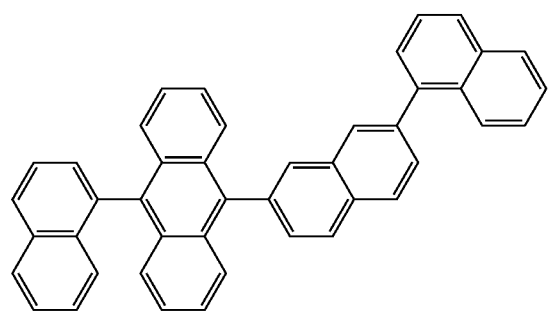
H20
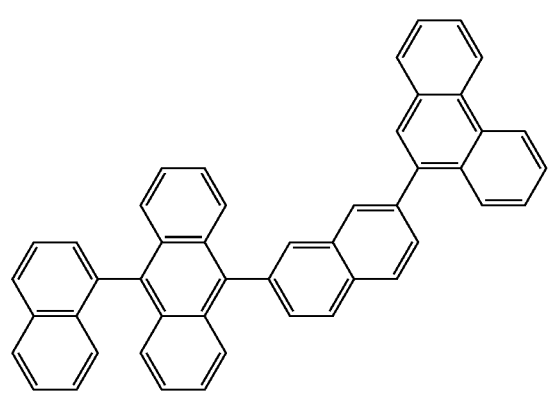
H21
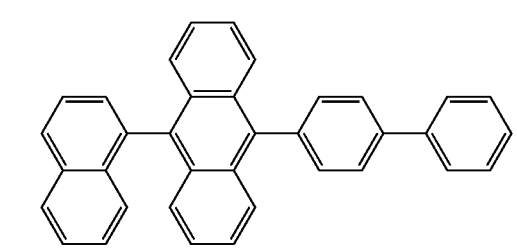
H22
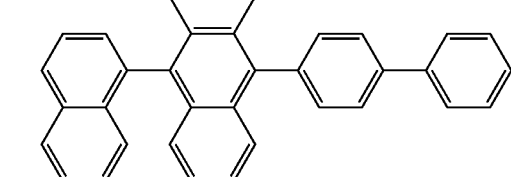
H23
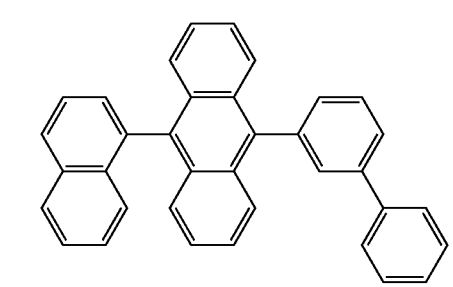
H24
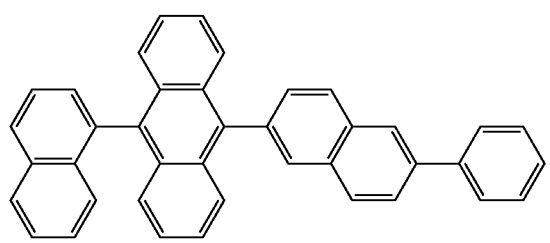
H25
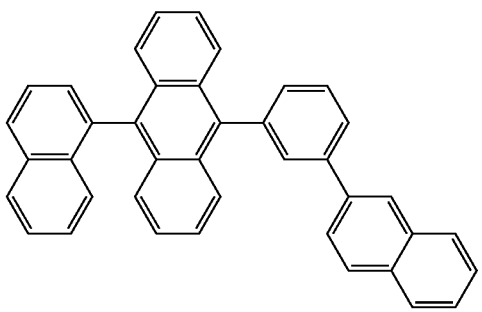
H26
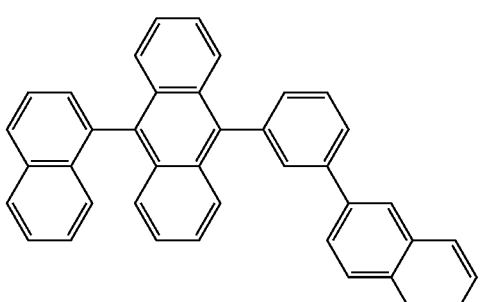
H27
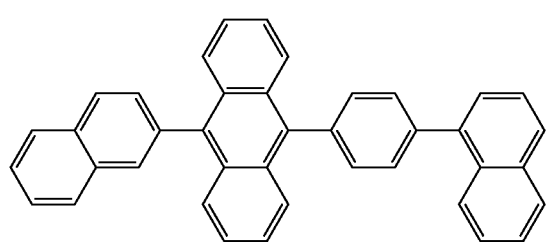
H28
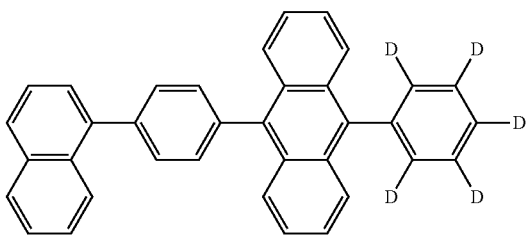

-continued
H29
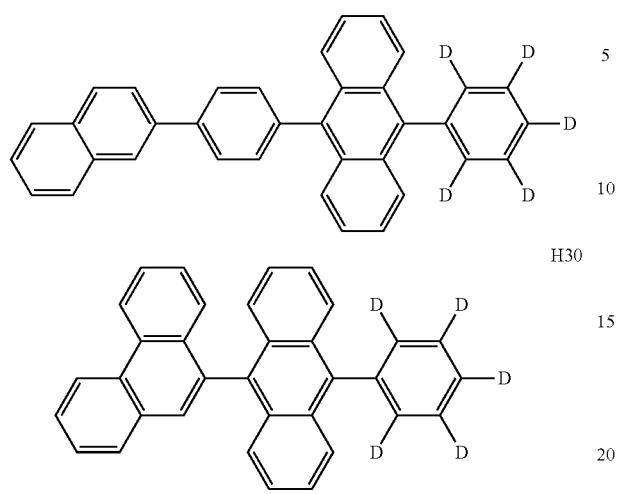
H30
H31
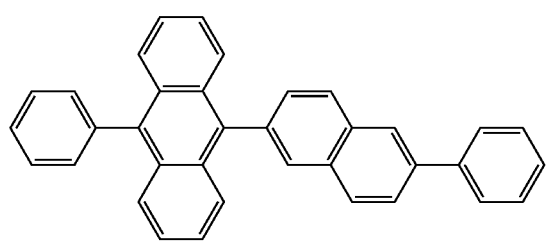
H32
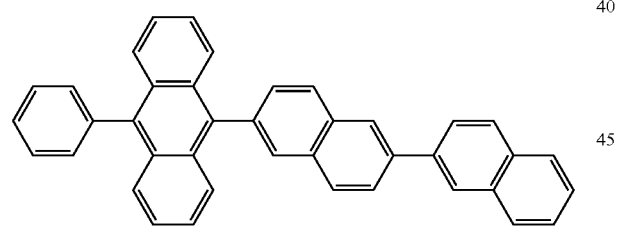
H33
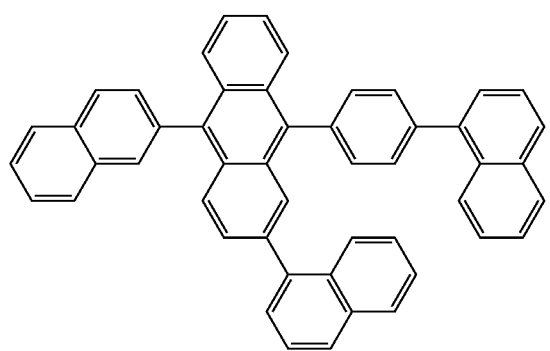
-continued
H34
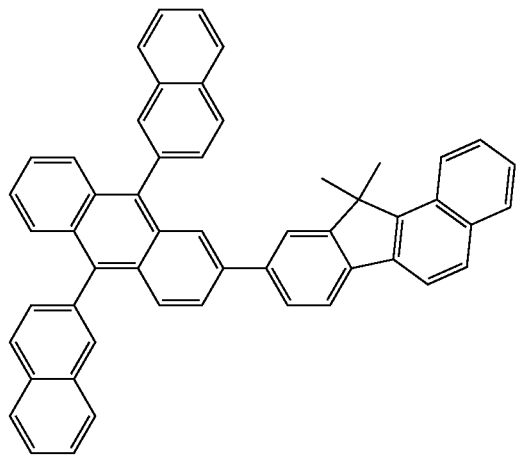
H35
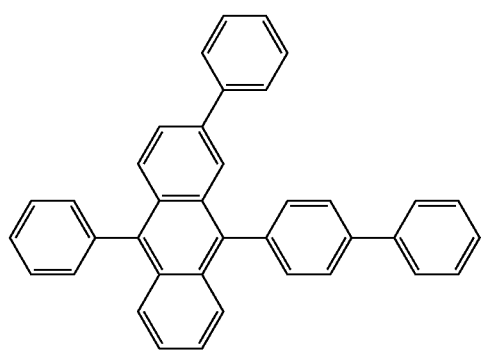
H36
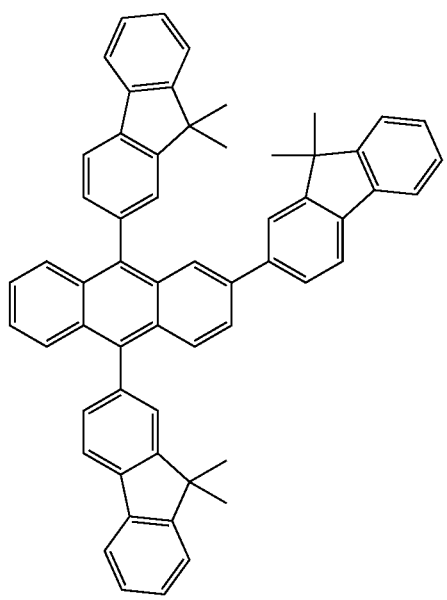

H37
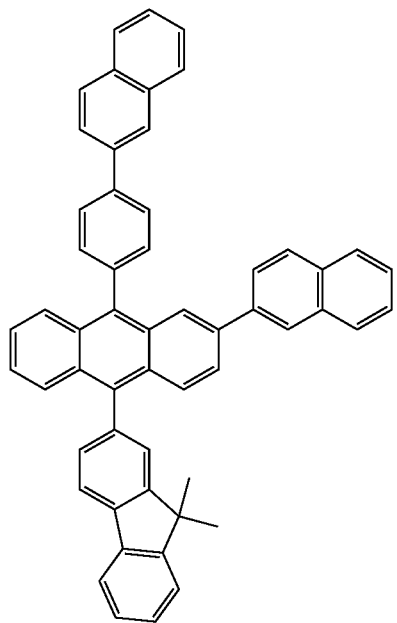
H38
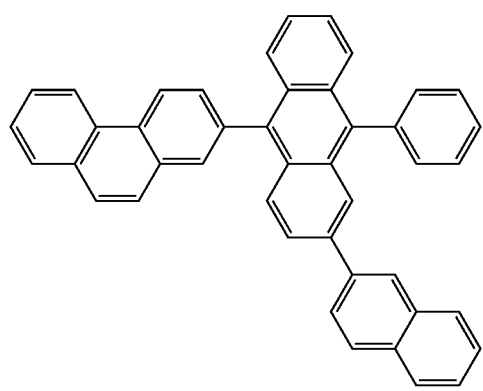
H39
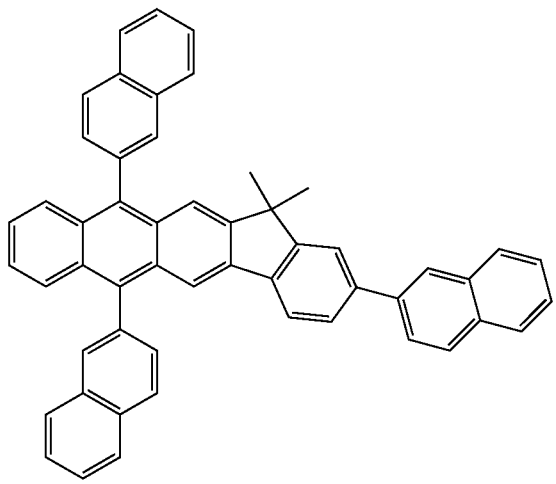
H40
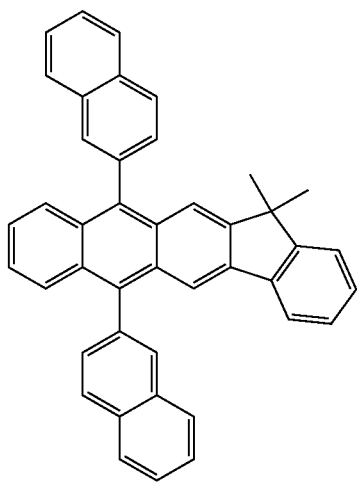
H41
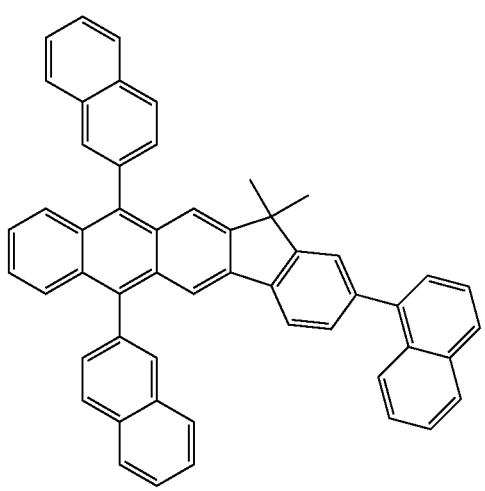
H42
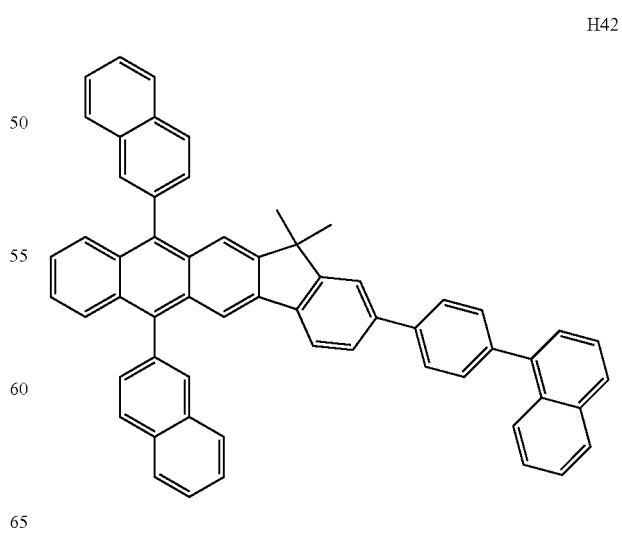

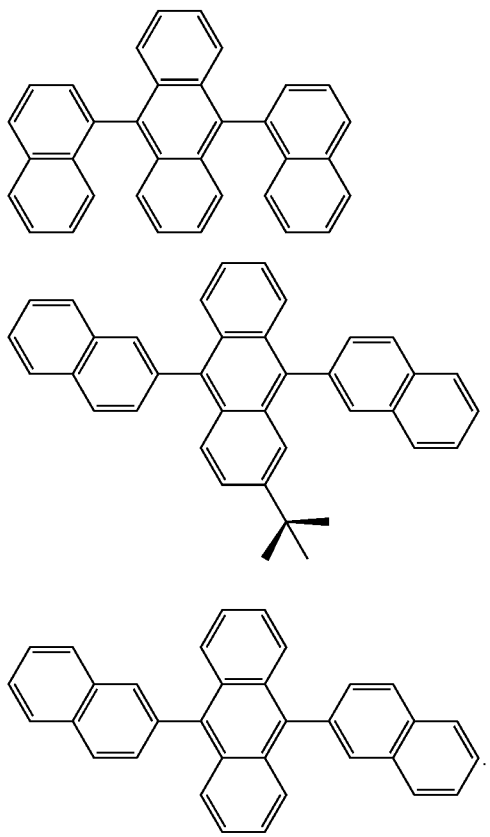

H43

H44

H45

The fourth compound may be represented by Formula 4:

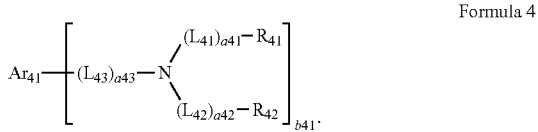

Formula 4

In Formula 4,

Ar$_{41}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si(Q$_{31}$)(Q$_{32}$)(Q$_{33}$), L$_{41}$ to L$_{43}$ may each independently be selected from:

a substituted or unsubstituted $C_2$-$C_{60}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a41 and a42 may each independently be selected from an integer of 0, 1, 2, and 3, a43 may be an integer selected from 0 to 8, R$_{41}$ and R$_{42}$ may each independently be selected from:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, and a dibenzothiophenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, and b41 may be an integer selected from 1, 2, 3, and 4, wherein Q$_{31}$ to Q$_{33}$ may each independently be selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group.

For example, the fourth compound may be represented by one selected from Compounds FD1 to FD15, but embodiments of the present disclosure are not limited thereto:

53
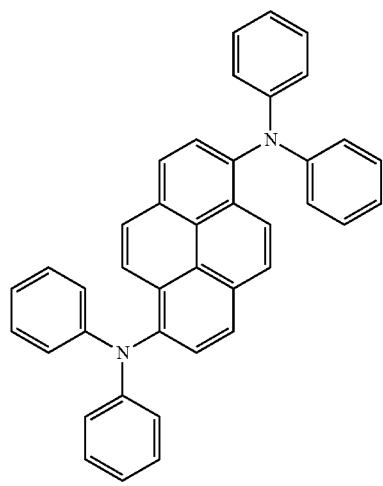
54
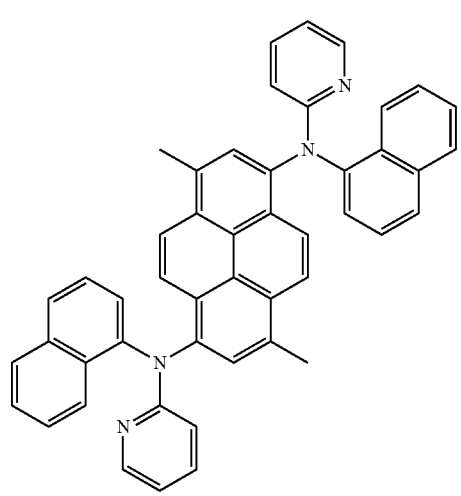
FD1
FD2
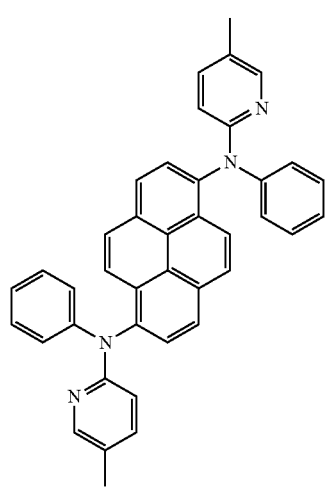
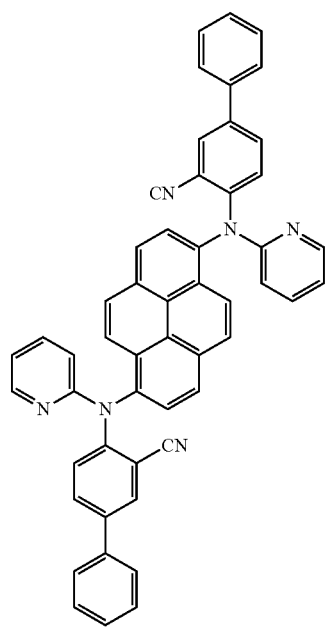
FD3
FD4
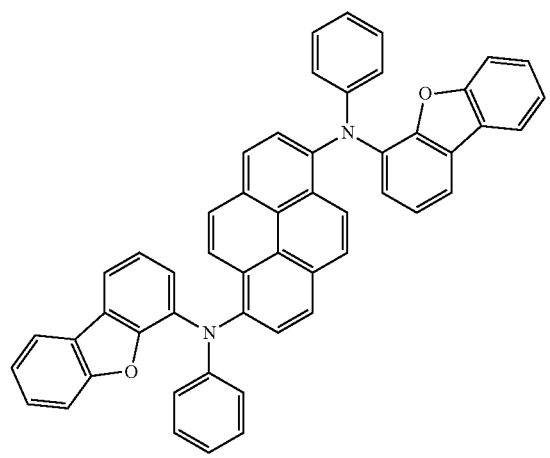
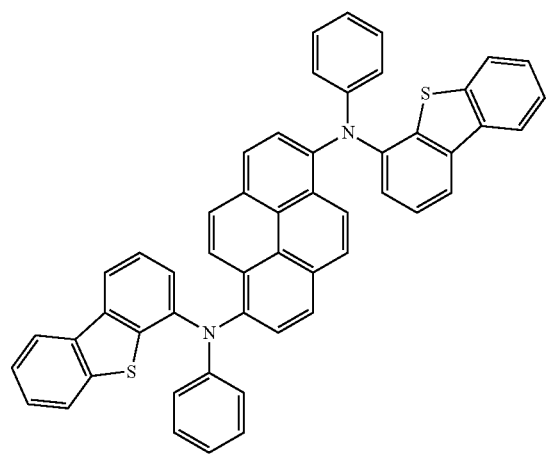
FD5
FD6

FD7
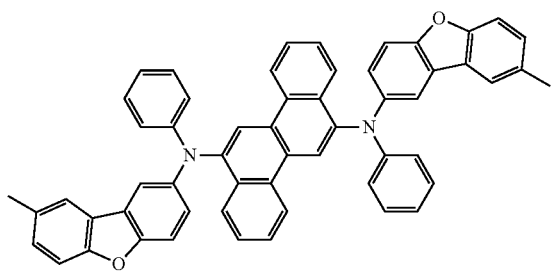
FD8
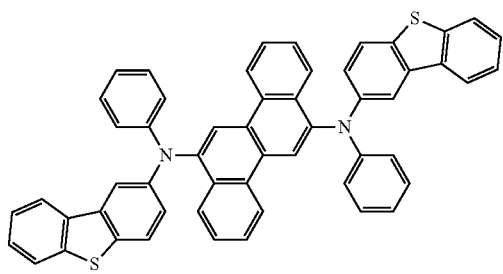
FD9
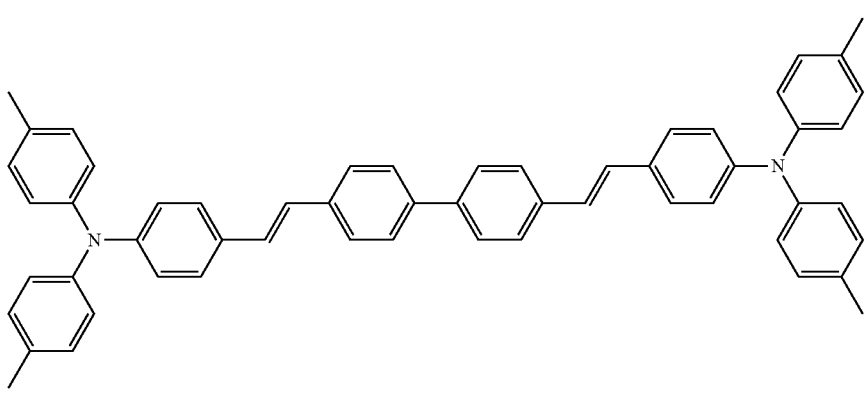
FD10
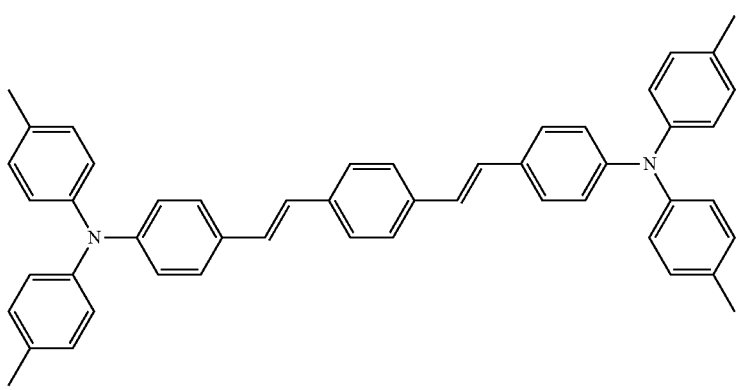
FD11
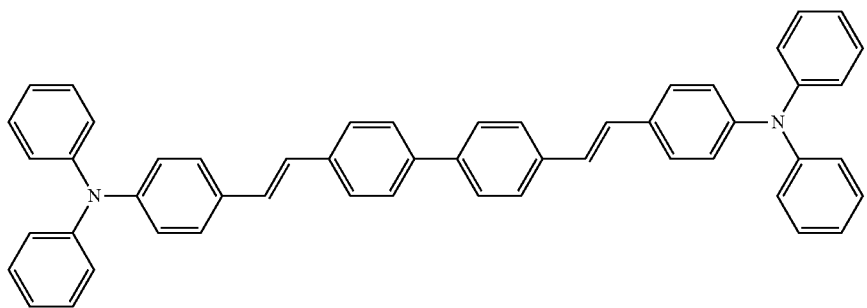

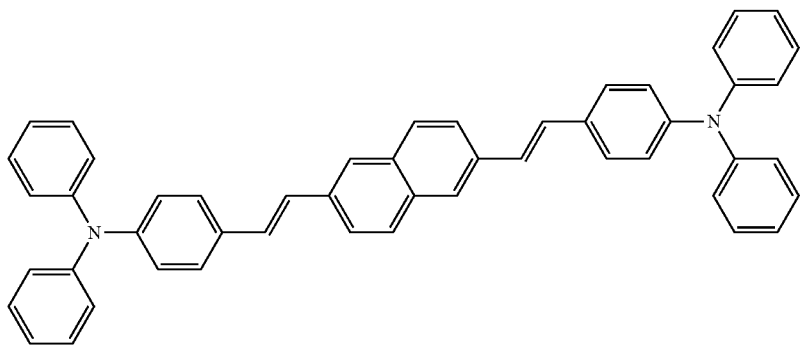

FD12

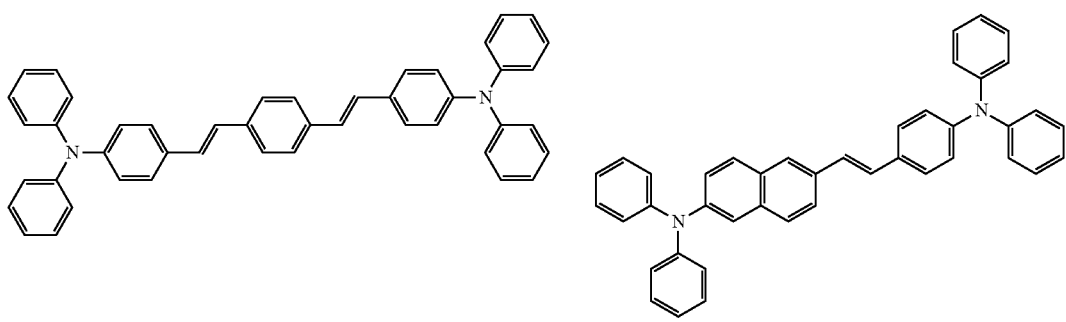

FD13

FD14

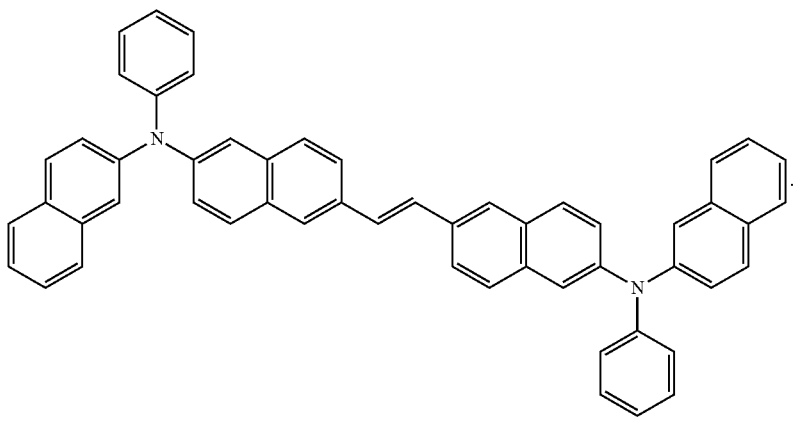

FD15

In some embodiments, the EML may include the third compound represented by Formula 3, and the fourth compound represented by Formula 4.

In some embodiments, the EML may include the third compound selected from Compounds H1 to H45, and the fourth compound selected from Compounds FD1 to FD15.

The weight ratio of the third compound and the fourth compound in the EML may be 99:1 to 70:30, and in some embodiments, 98:2 to 90:10. When the weight ratio is within these ranges, an organic light-emitting device may have high efficiency.

The thickness of the EML may be about 100 Å to about 1,000 Å, and in some embodiments, about 200 Å to about 600 Å. When the thickness of the EML is within these ranges, excellent light-emission characteristics may be obtained without a substantial increase in driving voltage.

In some embodiments, the first HTL may include the first compound selected from compounds represented by Formulae 1A and 1B, and the second compound selected from compounds represented by Formulae 2A and 2B, and the EML may include the third compound represented by Formula 3, and the fourth compound represented by Formula 4.

In some embodiments, the first HTL may include the first compound selected from compounds represented by Formulae 1A(1) and 1B(1), and the second compound selected from compounds represented by Formulae 2A(1), 2A(2), and 2B(1), and the EML may include the third compound represented by Formula 3, and the fourth compound represented by Formula 4.

In some embodiments, the first HTL may include the first compound selected from Compounds HT1 to HT20, and the second compound selected from Compounds 1 to 4, and the EML may include the third compound selected from Compounds H1 to H45, and the fourth compound selected from Compounds FD1 to FD15.

The second compound and the third compound may be different from each other.

Figure 5:
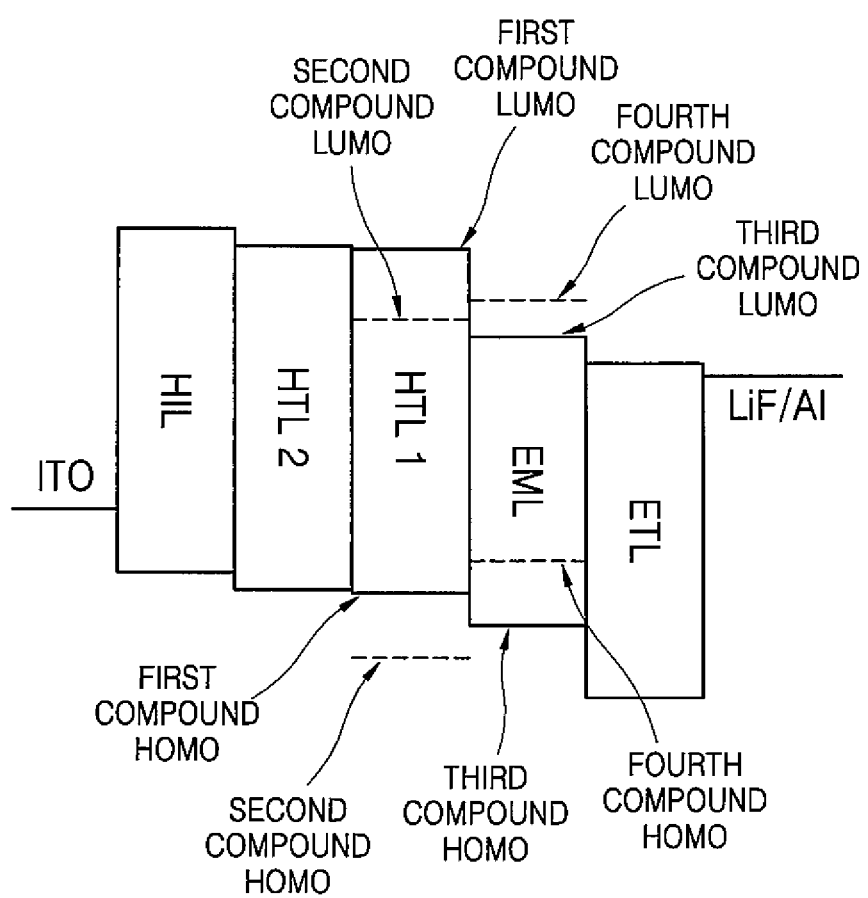
FIG. 5 illustrates an energy level diagram indicating energy levels of a HIL material, a first hole transport layer (HTL 1) material, a second hole transport layer (HTL 2) material, an EML material, and an ETL material of an organic light-emitting device, according to an embodiment of the present disclosure.

FIG. 5 illustrates an energy level diagram indicating the energy levels of a HIL material, a first HTL (HTL 1) material, a second HTL (HTL 2) material, an EML material, and an ETL material of an organic light-emitting device according to an embodiment of the present disclosure.

The electron affinity of the second compound may be greater than the electron affinity of the first compound.

For example, the difference between the electron affinity of the second compound and the electron affinity of the first compound may be 0.2 eV or more.

In some embodiments, the difference between the electron affinity of the second compound and the electron affinity of the first compound may be 0.4 eV or more.

When the electron affinity of the second compound is greater than the electron affinity of the first compound, anionization of the first compound due to electrons leaking from the EML to the HTL 1 may be prevented or reduced. Accordingly, deterioration in the performance of a device including the first compound may be prevented or reduced.

The LUMO energy level of the fourth compound may be higher than the LUMO energy level of the third compound.

For example, the difference between the LUMO energy level of the fourth compound and the LUMO energy level of the third compound may be 0.1 eV or more, and in some embodiments, 0.2 eV or more.

When the LUMO energy level of the fourth compound is greater than the LUMO energy level of the third compound, anionization of the fourth compound may be prevented or reduced. Accordingly, deterioration in performance of a device including the first compound may be prevented or reduced.

The minimum anionic decomposition energy of the second compound may be greater than the triplet energy of the third compound.

The term "minimum anionic decomposition energy" refers to the minimum energy required to cleave a covalent bond in a molecule existing in an anionic state.

For example, the difference between the minimum anionic decomposition energy of the second compound and triplet energy of the third compound may be 0.1 eV or more.

The term "decomposition energy when in an anionic state" may be defined as being identical to the term "anionic decomposition energy".

When the minimum anion decomposition energy of the second compound is greater (e.g., higher) than the triplet energy of the third compound, decomposition of the second compound due to triplet exciton energy transfer may be prevented or reduced. Accordingly, the manufactured organic light-emitting device may have a long lifespan.

The minimum anionic decomposition energy of the second compound may be greater than the singlet energy of the fourth compound.

For example, the difference between the lowest anion decomposition energy of the second compound and the singlet energy of the fourth compound may be 0.1 eV or more.

When the lowest anion decomposition energy of the second compound is greater than the singlet energy of the fourth compound, decomposition of the second compound due to singlet exciton energy transfer may be prevented or reduced. Accordingly, the manufactured organic light-emitting device may have a long lifespan.

The electron transport region 170 may be on the EML 150.

The electron transport region 170 may include at least one selected from a hole blocking layer, an electron transport layer, and an electron injection layer, but embodiments of the present disclosure are not limited thereto.

For example, the electron transport region may have a structure of electron transport layer/electron injection layer or a structure of hole blocking layer/electron transport layer/electron injection layer, wherein layers of each structure are sequentially stacked on the EML in these stated orders, but embodiments of the structure thereof are not limited thereto.

The methods of forming the hole blocking layer, the electron transport layer, and the electron injection layer may be the same as the method used to form the hole injection layer.

The hole blocking layer may include, for example, at least one selected from BCP and Bphen, but embodiments of the present disclosure are not limited thereto.

The ETL may include at least one selected from a compound represented by Formula 601 and a compound represented by Formula 602.

The compound represented by Formula 601 and the compound represented by Formula 602 may each independently be selected from Compounds ET1 to ET15.

In some embodiments, the ETL may include at least one selected from BCP, Bphen, Alq$_3$, Balq, TAZ, and NTAZ.

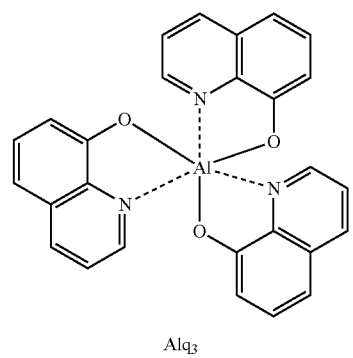

Alq$_3$

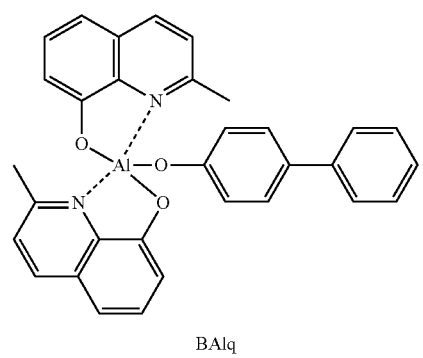

BAlq

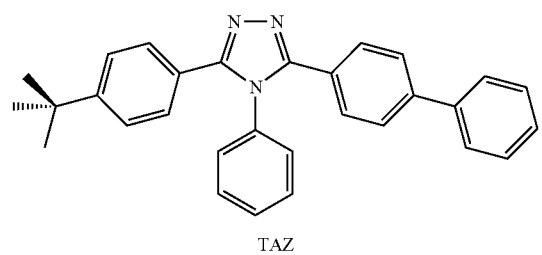

TAZ

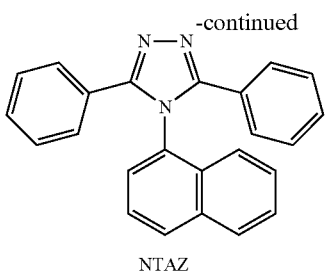

NTAZ

The thickness of the ETL may be about 100 Å to about 1,000 Å, and in some embodiments, about 150 Å to about 500 Å. When the thickness of the ETL is within these ranges, the ETL may have satisfactory electron transport characteristics without a substantial increase in driving voltage.

The ETL may further include, in addition to the materials described above, a metal-containing material.

The metal-containing material may include a Li complex. The Li complex may include, for example, Compound ET-D1 (lithium quinolate, LiQ) and/or ET-D2.

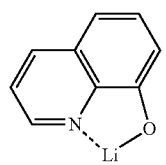

ET-D1

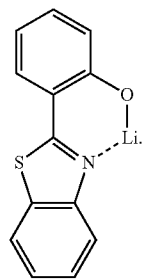

ET-D2

The electron transport region may include an electron injection layer to facilitate injection of electrons from the second electrode 190.

The electron injection layer may be formed on the ETL using one or more suitable methods selected from vacuum deposition, spin coating, casting, an LB method, ink-jet printing, laser-printing, and LITI. When the electron injection layer is formed by vacuum deposition and/or spin coating, the deposition and coating conditions for the electron injection layer may be similar to those used for the hole injection layer.

The electron injection layer may include at least one selected from LiF, NaCl, CsF, $Li_2O$, BaO, and LiQ.

The thickness of the electron injection layer may be about 1 Å to about 100 Å, and in some embodiments, about 3 Å to about 90 Å. When the thickness of the electron injection layer is within these ranges, the electron injection layer may have satisfactory electron injection characteristics without a substantial increase in driving voltage.

The second electrode 190 is on the electron transport region 170. The second electrode 190 may be a cathode, which is an electron injection electrode. In this regard, a material for the second electrode 190 may be selected from a metal, an alloy, an electrically conductive compound, and mixtures thereof, each having a relatively low work function. Non-limiting examples of the material for the second electrode 190 may include lithium (Li), magnesium (Mg), aluminum (Al), aluminum-lithium (Al—Li), calcium (Ca), magnesium-indium (Mg—In), and magnesium-silver (Mg—Ag). In some embodiments, the material for forming the second electrode 190 may be ITO and/or IZO. The second electrode 190 may be a semi-transmissive electrode or a transmissive electrode.

An encapsulation layer may be formed on the organic light-emitting device 10. The encapsulation layer may be formed by alternately stacking an organic film and an inorganic film. The encapsulation layer may prevent or reduce permeation of external moisture and/or oxygen into the organic light-emitting device 10.

The encapsulation layer may include the second compound. For example, the encapsulation layer may include one selected from Compounds 1 to 4.

The term "$C_1$-$C_{60}$ alkyl group" as used herein refers to a linear or branched aliphatic hydrocarbon monovalent group having 1 to 60 carbon atoms. Non-limiting examples thereof may include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group" as used herein refers to a divalent group having substantially the same structure as the $C_1$-$C_{60}$ alkyl group.

The term "$C_1$-$C_{60}$ alkoxy group" as used herein refers to a monovalent group represented by —O-$A_{101}$ (wherein $A_{101}$ is a $C_1$-$C_{60}$ alkyl group), and non-limiting examples thereof may include a methoxy group, an ethoxy group, and an isopropyloxy group.

The term "$C_2$-$C_{60}$ alkenyl group" as used herein refers to a hydrocarbon group including at least one carbon-carbon double bond in the body (e.g., middle) or at the terminus of the $C_1$-$C_{60}$ alkyl group, and non-limiting examples thereof may include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a hydrocarbon group including at least one carbon-carbon triple bond in the body (e.g., middle) or at the terminus of the $C_1$-$C_{60}$ alkyl group, and non-limiting examples thereof may include an ethynyl group and a propynyl group. The term "$C_2$-$C_{60}$ alkenylene group" as used herein refers to a divalent group having substantially the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof may include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent monocyclic group having at least one heteroatom selected from N, O, silicon (Si), phosphorus (P), and sulfur (S) as a ring-forming atom and 1 to 10 carbon atoms, and non-limiting examples thereof may include a tetrahydrofuranyl group and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one double bond in the ring thereof, and is not aromatic. Non-limiting examples thereof may include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group may include a 2,3-hydrofuranyl group and a 2,3-hydrothiophenyl group. The term "$C_1$-$C_{10}$ heterocycloalkenylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Non-limiting examples of the $C_6$-$C_{60}$ aryl group may include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a carbocyclic aromatic system that has at least one heteroatom selected from N, O, Si, P, and S as a ring-forming atom, and 1 to 60 carbon atoms. The term "$C_1$-$C_{60}$ heteroarylene group" as used herein refers to a divalent group having a carbocyclic aromatic system that has at least one heteroatom selected from N, O, P, and S as a ring-forming atom, and 1 to 60 carbon atoms. Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —O-$A_{102}$ (wherein $A_{102}$ is a $C_6$-$C_{60}$ aryl group), and a $C_6$-$C_{60}$ arylthio group used herein indicates —S-$A_{13}$ (wherein $A_{103}$ is a $C_6$-$C_{60}$ aryl group).

The term "monovalent non-aromatic condensed polycyclic group" as used herein refers to a monovalent group that has two or more rings condensed (e.g., fused) to each other, only carbon atoms (for example, 8 to 60 carbon atoms) as ring forming atoms, and non-aromaticity in the entire molecular structure. A non-limiting example of the monovalent non-aromatic condensed polycyclic group may include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more rings condensed (e.g., fused) to each other, has a heteroatom selected from N, O, Si, P, and S, in addition to carbon atoms (for example, 1 to 60 carbon atoms), as ring forming atoms, and has non-aromaticity in the entire molecular structure. A non-limiting example of the monovalent non-aromatic condensed heteropolycyclic group may include a carbazolyl group. The term "divalent non-aromatic condensed hetero-polycyclic group" as used herein refers to a divalent group having substantially the same structure as the monovalent non-aromatic condensed heteropolycyclic group.

In the present specification, at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{11}$)($Q_{12}$)($Q_{13}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{21}$)($Q_{22}$)($Q_{23}$); and —Si($Q_{31}$)($Q_{32}$)($Q_{33}$), wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

The term "Ph" as used herein refers to a phenyl group, the term "Me" as used herein refers to a methyl group, the term "Et" as used herein refers to an ethyl group, and the term "ter-Bu" or "Bu'" as used herein refers to a tert-butyl group.

The term "biphenyl group" as used herein refers to a monovalent group consisting of two benzenes linked to each other via a single bond, and the term "terphenyl group" as used herein refers to a monovalent group consisting of three benzenes linked to each other via two single bonds.

EXAMPLE

Example 1

A glass substrate (a product of Corning Company) with an ITO/Ag/ITO (100/1,000/100 Å) anode thereon was cut to a size of 50 mm×50 mm×0.5 mm, sonicated using isopropyl alcohol and pure water for 15 minutes each, exposed to ultraviolet rays for 30 minutes, and then exposed to ozone. The resultant glass substrate was mounted on a vacuum deposition apparatus.

HT3 and F6-TCNNQ were co-deposited on the anode at a weight ratio of 97:3 to form a hole injection layer having a thickness of 100 Å, and HT3 (fifth compound) was deposited on the hole injection layer to form a second HTL having a thickness of 1,100 Å. Subsequently, Compound HT3 (the first compound) and Compound 2 (the second compound) were co-deposited on the second HTL at a weight ratio of 95:5 to form a first HTL having a thickness of 100 Å.

Compound H43 (the third compound) and FD15 (the fourth compound) were co-deposited on the first HTL at a weight ratio of 95:5 to form an EML having a thickness of 200 Å.

Subsequently, Compound ET1 and Compound ET-D1 were co-deposited on the EML at a weight ratio of 50:50 to form an ETL having a thickness of 350 Å. LiF was deposited on the ETL to form an electron injection layer having a thickness of 7 Å.

Magnesium (Mg) and silver (Ag) were co-deposited on the electron injection layer at a weight ratio of 90:10 to form a cathode having a thickness of 120 Å, and HT3 was deposited on the cathode to improve light extraction efficiency by forming an encapsulation layer having a thickness of 600 Å, thereby completing the manufacture of an organic light-emitting device.

HT3

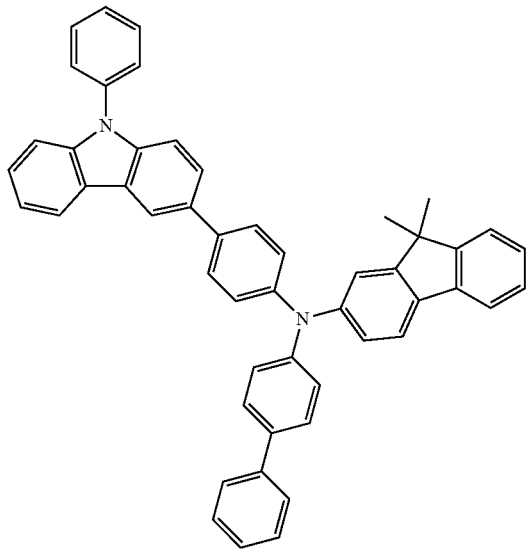

F6-TCNNQ

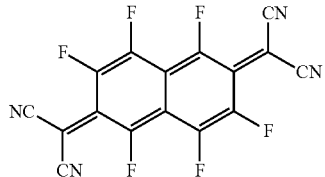

-continued
H43
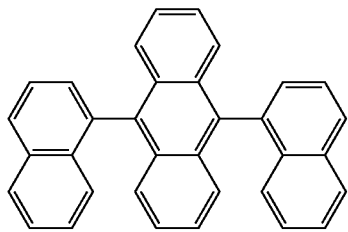
TCTA
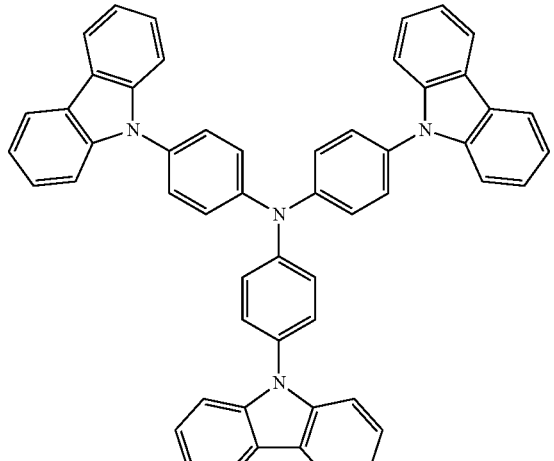
FD15
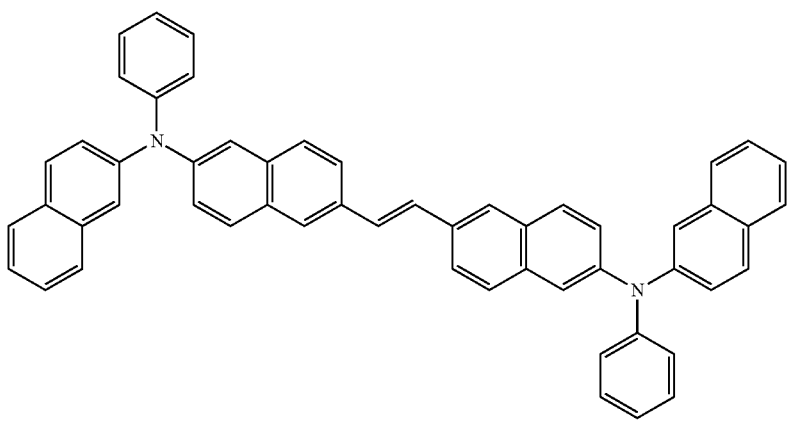
ET1
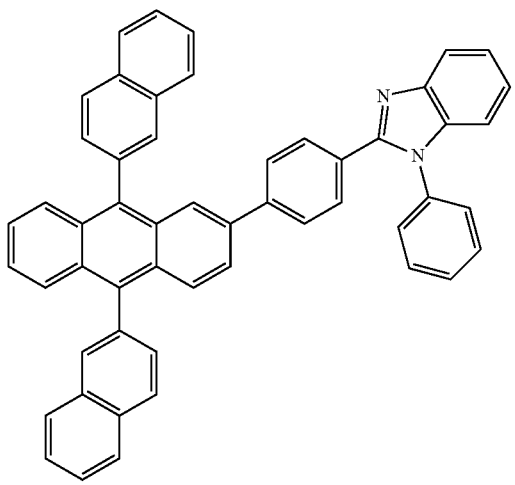
ET-D1
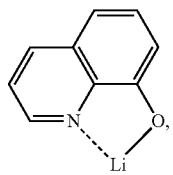

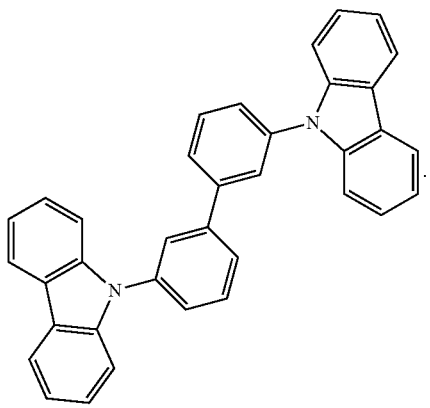

Compound 2

Examples 2 to 4

Additional organic light-emitting devices were manufactured in substantially the same manner as in Example 1, except that the materials shown in Table 2 were used.

Comparative Example 1

An organic light-emitting device was manufactured in substantially the same manner as in Example 1, except that in forming the first hole transport layer, Compound 2 was not used.

Comparative Example 2

An organic light-emitting device was manufactured in substantially the same manner as in Example 1, except that in forming the first hole transport layer, TCTA was used instead of Compound 2.

Comparative Example 3

An organic light-emitting device was manufactured in substantially the same manner as in Example 1, except that in forming the first hole transport layer, Compound H43 was used instead of Compound 2.

Evaluation Example 1

The minimum anionic decomposition energy and electron affinity of the first compound and the second compound in the first HTL of each of the organic light-emitting devices manufactured according to Examples 1 to 4 and Comparative Examples 1 to 3 were calculated using the method described below. The results are summarized in Table 2. The LUMO energy level, triplet energy, and singlet energy of each of H43 and FD15, which are materials for an EML, were also calculated using the method described below, and the results are summarized in Table 3.

Minimum Anionic Decomposition Energy

The minimum anionic decomposition energy was calculated according to Equation 1.

$$E_{minimum\ anionic\ decompositon\ energy} = E_{[A\text{-}B]^-} - [E_A^- + E_B^{\bullet}(\text{or } E_A^{\bullet} + E_B^-)]. \quad \text{Equation 1}$$

1. A density function theory (DFT) and/or ab initio method was used to calculate the ground state of a neutral molecule.

2. The structure of a neutral molecular under an excess electron was used to calculate the anionic state ($E_{[A\text{-}B]^-}$) of the molecule.

3. Based on an anionic state being the most stable structure (global minimum, the energy of the decomposition process was calculated:

$$[A\text{-}B]^- \rightarrow A^x \text{ and } B^y([E_A^- + E_B^{\bullet}(\text{or } E_A^{\bullet} + E_B^-)]).$$

The decomposition may produce i) $A^- + B^{\bullet}$ or ii) $A^{\bullet} + B^-$, and from these two decomposition modes i and ii, the decomposition mode having a smaller decomposition energy value was selected for the calculation.

Figure 6:
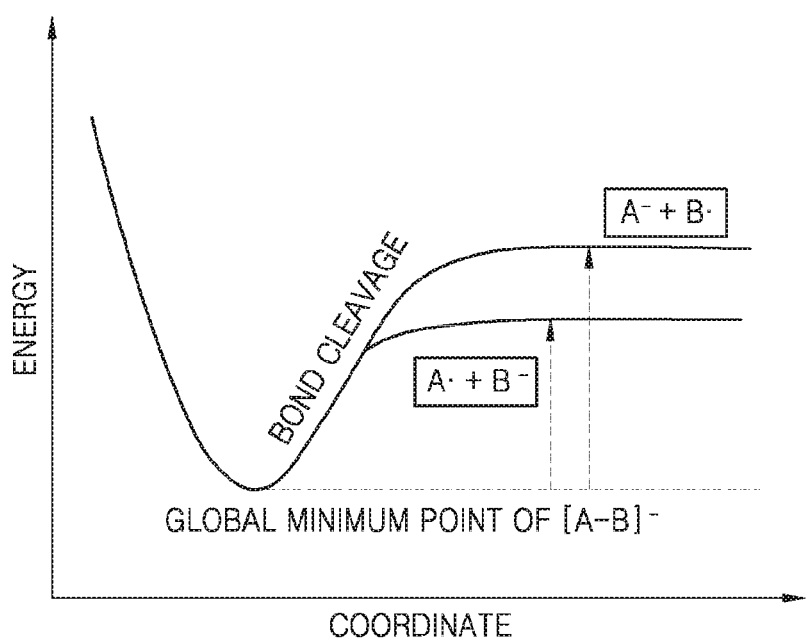
FIG. 6 illustrates an example reaction coordinate for the anionic decomposition of an A-B bond in an organic molecule.

FIG. 6 illustrates an example reaction coordinate for the decomposition of an A-B bond in an organic molecule according to decomposition modes i and ii.

LUMO Energy Level

Cyclic voltammetry (CV) was used to obtain the LUMO energy levels.

Electron Affinity

Electron affinities were obtained by calculating the energy difference between vacuum level (0 eV) and LUMO energy level.

Singlet and Triplet Energies

Singlet energies and triplet energies were measured by performing photoluminescence (PL) tests on material formed as a thin film having a thickness of 50 nm on a glass substrate.

TABLE 2

| | First hole transport layer | | | | | |
|---|---|---|---|---|---|---|
| | First compound | | | Second compound | | |
| | Material | Lowest anionic decomposition energy (eV) | Electron affinity (eV) | Material | Lowest anionic decomposition energy (eV) | Electron affinity (eV) |
| Example1 | HT3 | (C—N single bond) 1.4 | 2.3 | Compound 1 | (C—N single bond) 2.0 | 2.9 |
| Example2 | HT3 | (C—N single bond) 1.4 | 2.3 | Compound 2 | (C—N single bond) 2.9 | 2.6 |
| Example3 | HT3 | (C—N single bond) 1.4 | 2.3 | Compound 3 | (C—C single bond) 3.9 | 3.0 |
| Example4 | HT3 | (C—N single bond) 1.4 | 2.3 | Compound 4 | (C—C single bond) 4.8 | 3.1 |
| Comparative Example1 | HT3 | (C—N single bond) 1.4 | 2.3 | — | — | — |
| Comparative Example2 | HT3 | (C—N single bond) 1.4 | 2.3 | TCTA | (C—C single bond) 1.6 | 2.6 |
| Comparative Example3 | HT3 | (C—N single bond) 1.4 | 2.3 | H43 | (C—C single bond) 3.9 | 3.0 |

TABLE 3

| EML material | LUMO energy level (eV) | triplet energy (eV) | singlet energy (eV) |
|---|---|---|---|
| Compound H43 | −3.0 | 1.7 | 3.1 |
| Compound FD15 | −2.7 | 1.9 | 2.8 |

Evaluation Example 2

The driving voltage, efficiency, T90 lifespan, and CIE chromaticity diagram of each of the organic light-emitting devices manufactured according to Examples 1 to 4 and Comparative Examples 1 to 3 were measured using a Keithley SMU 236 and a luminance meter PR650. Results are shown in Table 4. The T90 lifespan indicates the period of time that has elapsed when luminance is reduced to 90% of initial luminance, which was measured at a current density of 10 mA/cd and referred to as 100%.

TABLE 4

| | First hole transport layer | | Driving voltage (V) | Efficiency (cd/A) | Lifespan (T90, hr) | Chromaticity diagram | |
|---|---|---|---|---|---|---|---|
| | First compound | Second compound | | | | CIEx | CIEy |
| Example1 | HT3 | Compound 1 | 4.3 | 4.5 | 114 | 0.143 | 0.060 |
| Example2 | HT3 | Compound 2 | 4.3 | 4.6 | 140 | 0.143 | 0.061 |
| Example3 | HT3 | Compound 3 | 4.3 | 4.6 | 180 | 0.143 | 0.061 |
| Example4 | HT3 | Compound 4 | 4.3 | 4.3 | 170 | 0.143 | 0.059 |
| Comparative Example1 | HT3 | — | 4.3 | 4.4 | 50 | 0.143 | 0.060 |
| Comparative Example2 | HT3 | TCTA | 4.4 | 4.5 | 55 | 0.143 | 0.058 |
| Comparative Example3 | HT3 | H43 | 5.0 | 3.5 | 90 | 0.143 | 0.060 |

From Table 4, it is seen that the organic light-emitting devices of Examples 1 to 4 have longer lifespans than the organic light-emitting devices of Comparative Examples 1 to 3.

According to one or more example embodiments of the present disclosure, an organic light-emitting device may have a long lifespan.

It should be understood that the example embodiments described herein should be considered in a descriptive sense only and not for purposes of limitation. Descriptions of features or aspects within each example embodiment should typically be considered as being available for other similar features or aspects in other example embodiments.

As used herein, the terms "use", "using", and "used" may be considered synonymous with the terms "utilize", "utilizing", and "utilized", respectively. Further, the use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more example embodiments have been described with reference to the drawings, it will be understood by those of ordinary skill in the art that various changes in form and details may be made therein without departing from the spirit and scope as defined by the following claims and equivalents thereof.

What is claimed is:

1. An organic light-emitting device comprising:
a first electrode;
a second electrode facing the first electrode;
an emission layer between the first electrode and the second electrode;
a hole transport region between the first electrode and the emission layer, the hole transport region comprising a first hole transport layer directly contacting the emission layer; and
an electron transport region between the second electrode and the emission layer,
wherein the first hole transport layer comprises a first compound and a second compound,
the emission layer comprises a third compound and a fourth compound,
an electron affinity of the second compound is greater than an electron affinity of the first compound,
a lowest unoccupied molecular orbital (LUMO) energy level of the fourth compound is greater than a LUMO energy level of the third compound,
the second compound and the third compound are different from each other,
a minimum anionic decomposition energy of the second compound is greater than a triplet energy of the third compound, and
the second compound is represented by one selected from Compounds 1, 2, and 4:

Compound 1
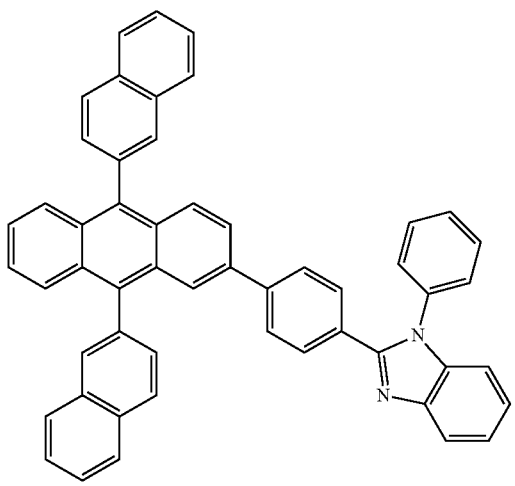

Compound 2
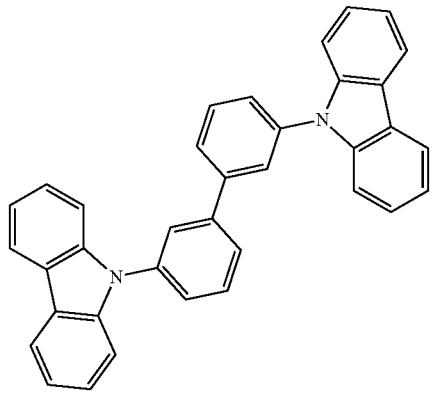

Compound 4
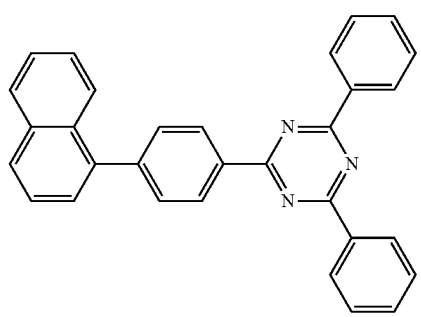

wherein a weight ratio of the first compound to the second compound is 99:1 to 50:50.

2. The organic light-emitting device of claim 1, wherein a difference between the electron affinity of the second compound and the electron affinity of the first compound is 0.2 eV or greater.

3. The organic light-emitting device of claim 1, wherein a difference between the LUMO energy level of the fourth compound and the LUMO energy level of the third compound is 0.1 eV or greater.

4. The organic light-emitting device of claim 1, wherein a difference between the minimum anionic decomposition energy of the second compound and the triplet energy of the third compound is 0.1 eV or greater.

5. The organic light-emitting device of claim 1, wherein the minimum anionic decomposition energy of the second compound is greater than a singlet energy of the fourth compound.

6. The organic light-emitting device of claim 1, wherein the first compound is selected from m-MTDATA, TDATA, 2-TNATA, NPB, β-NPB, TPD, Spiro-TPD, Spiro-NPB, methylated NPB, TAPC, HMTPD, TCTA, and compounds represented by Formulae 1A and 1B:

-continued
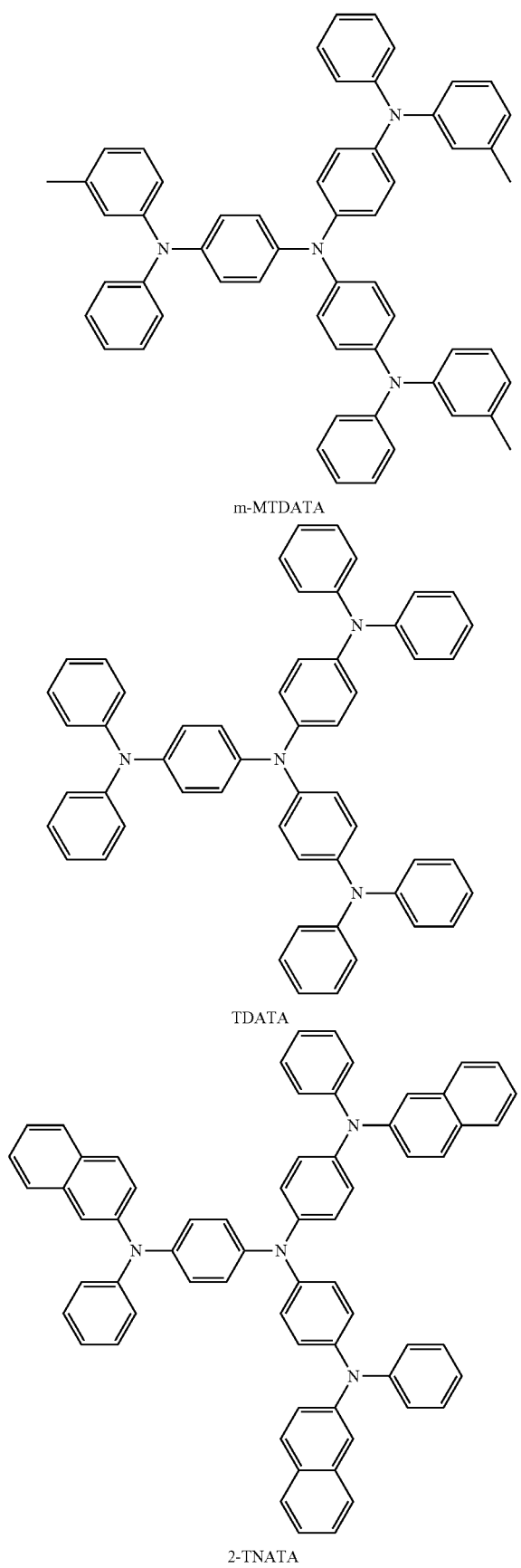
m-MTDATA
TDATA
2-TNATA
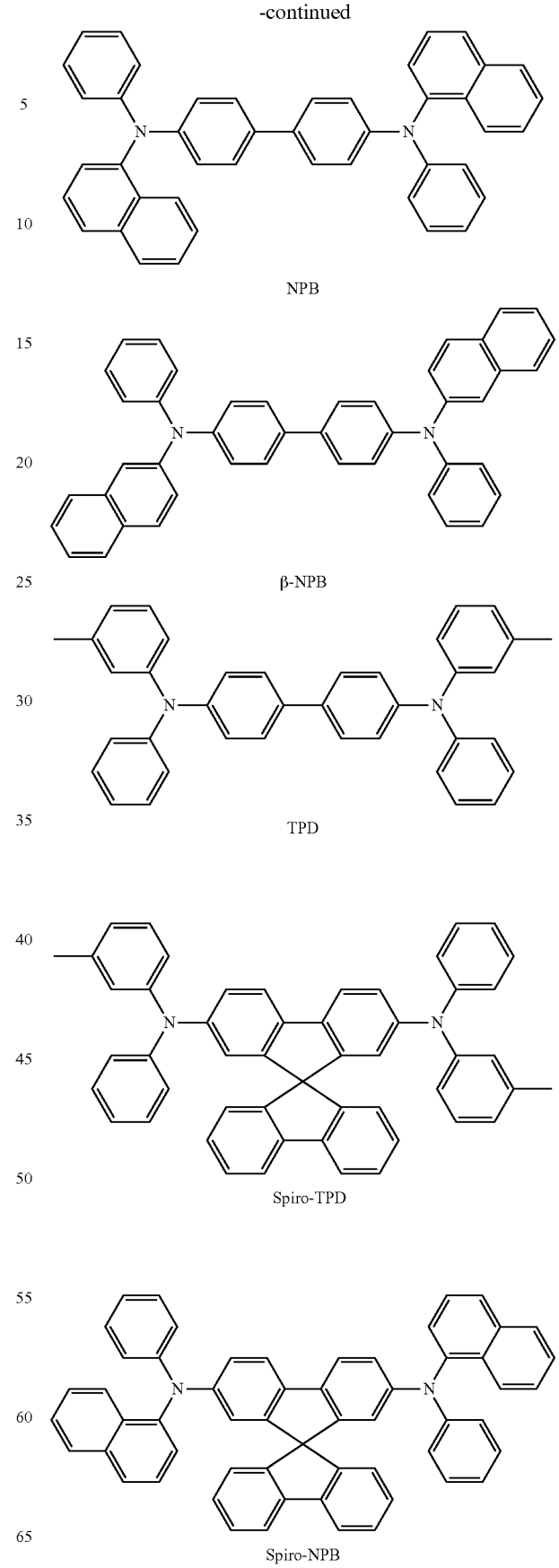
NPB
β-NPB
TPD
Spiro-TPD
Spiro-NPB -continued

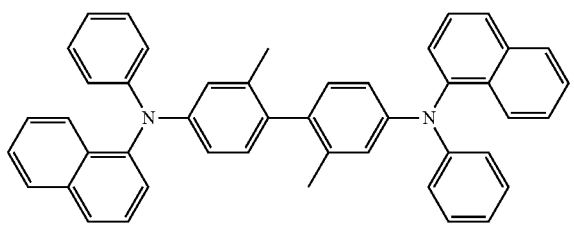

methylated NPB

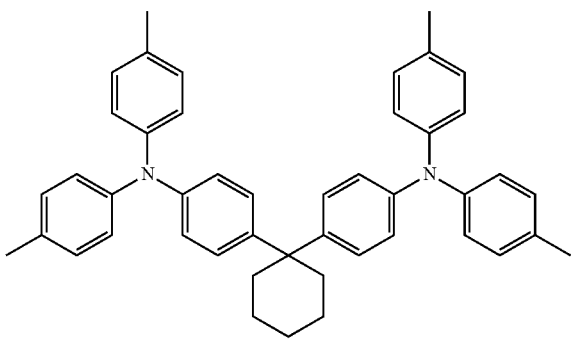

TAPC

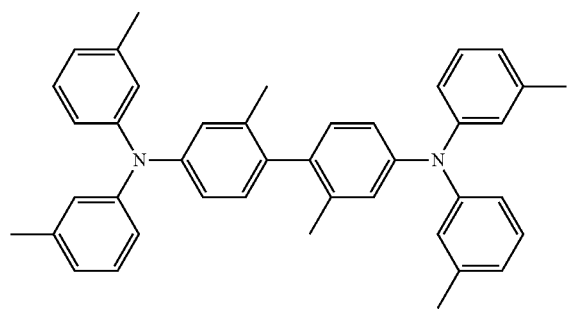

HMTPD

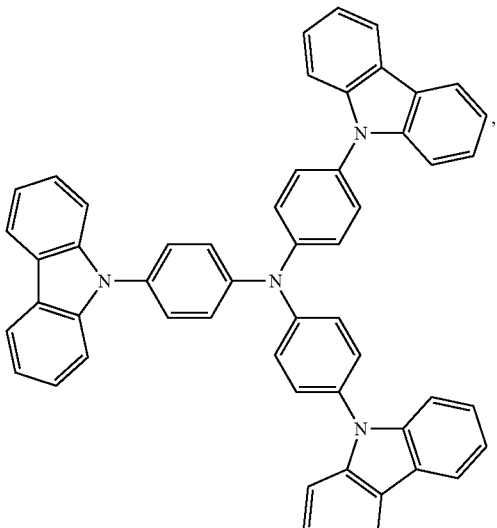

TCTA

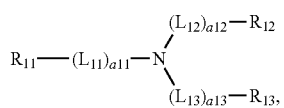

Formula 1A

-continued

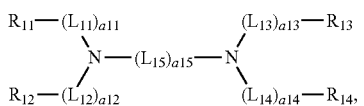

Formula 1B wherein, in Formulae 1A and 1B, $L_{11}$ to $L_{15}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a11 to a14 are each independently selected from 0, 1, 2, and 3, a15 is selected from 1, 2, 3, 4, and 5, and $R_{11}$ to $R_{14}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

7. The organic light-emitting device of claim 1, wherein the first compound is represented by one selected from Compounds HT1 to HT20:

HT1

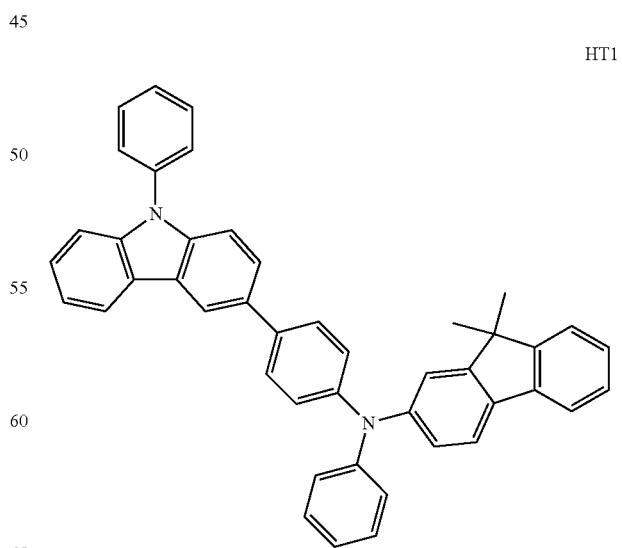

HT2
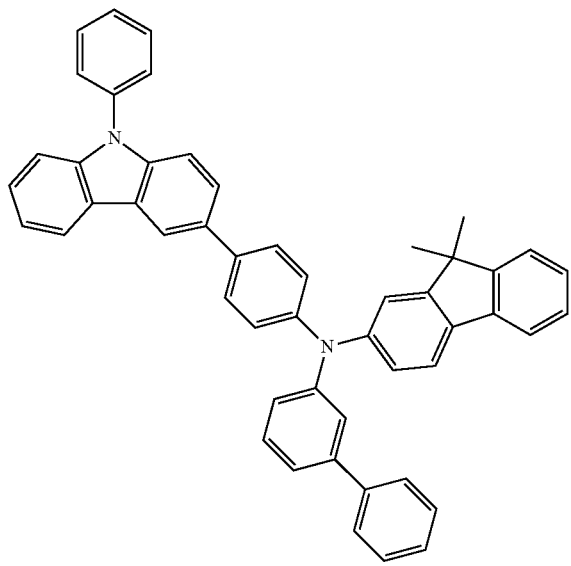
HT4
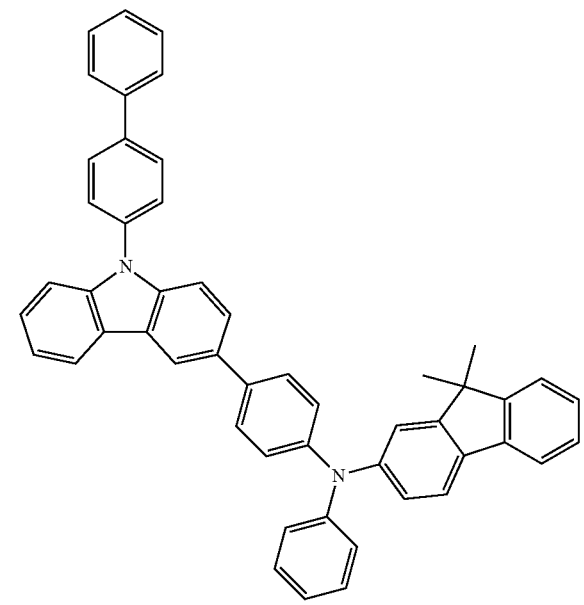
HT3
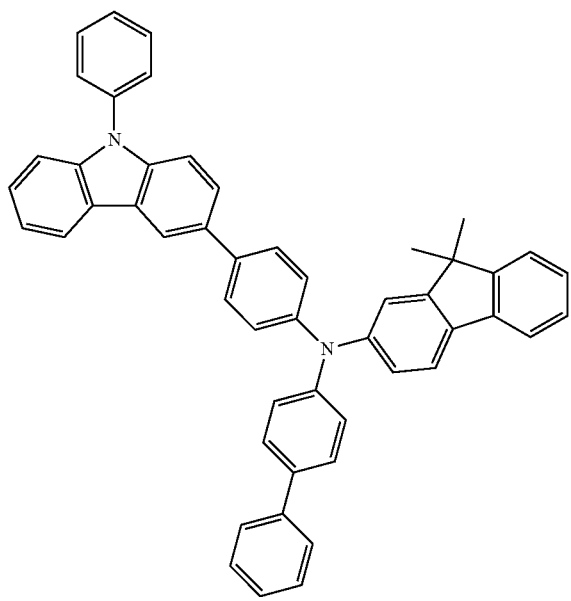
HT5
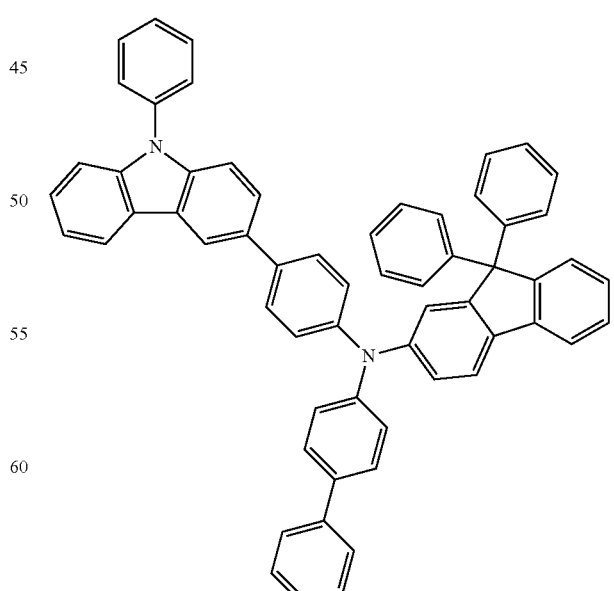

HT6
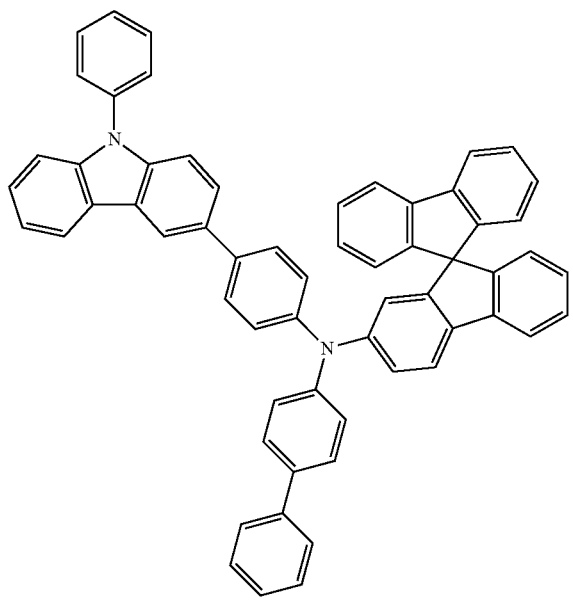
HT7
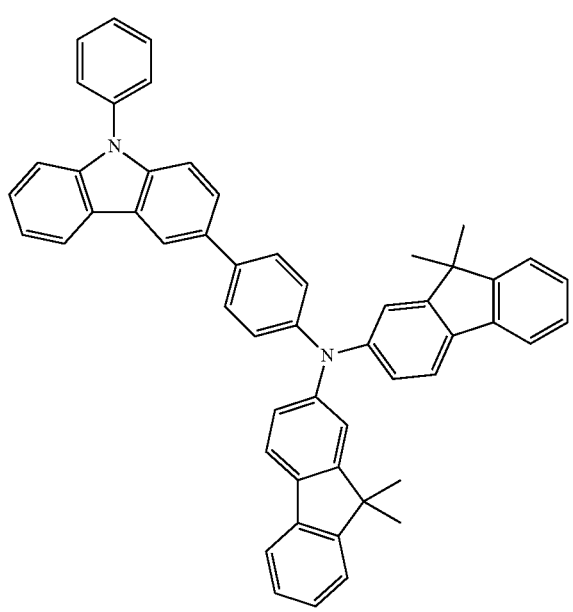
HT8
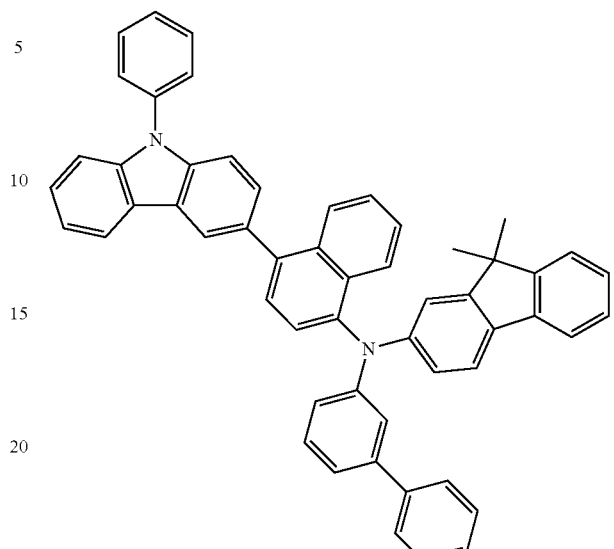
HT9
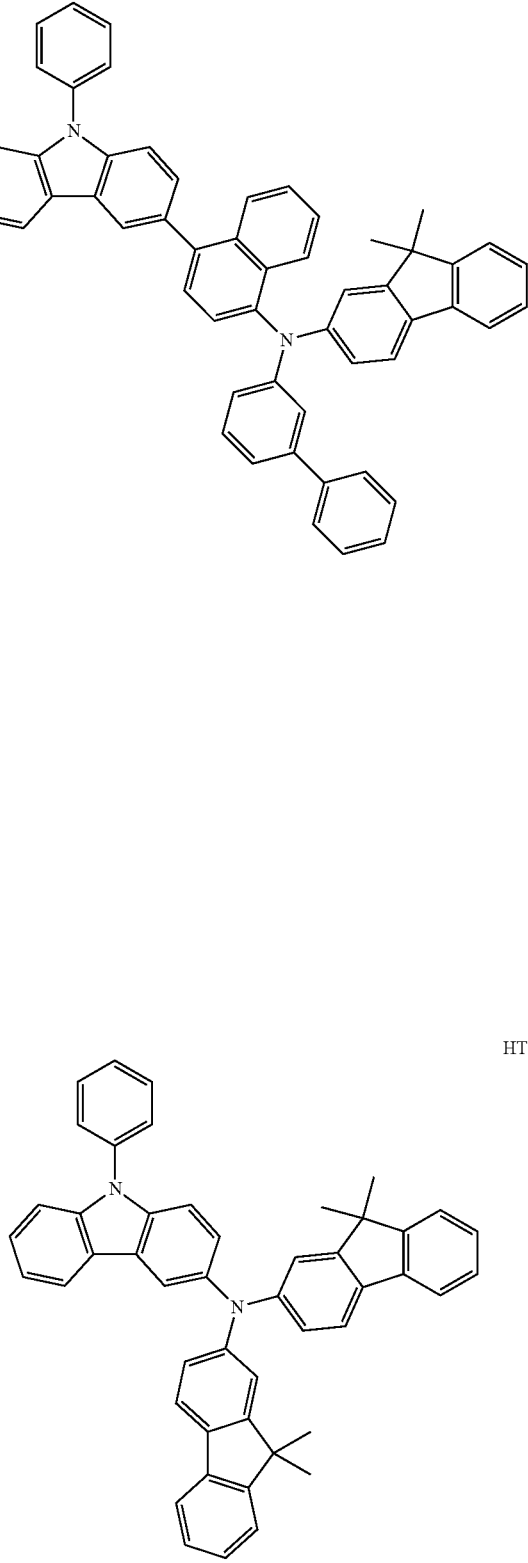

HT10
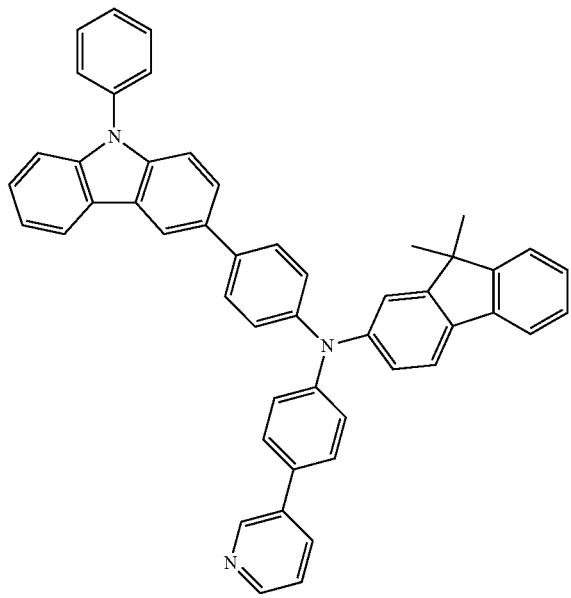
HT11
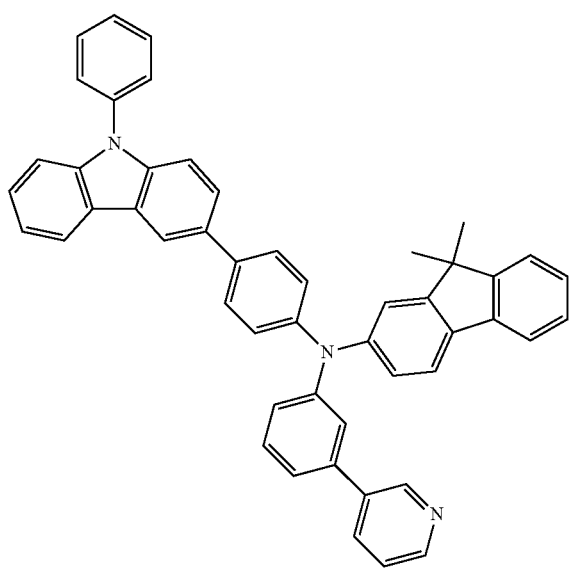
HT12
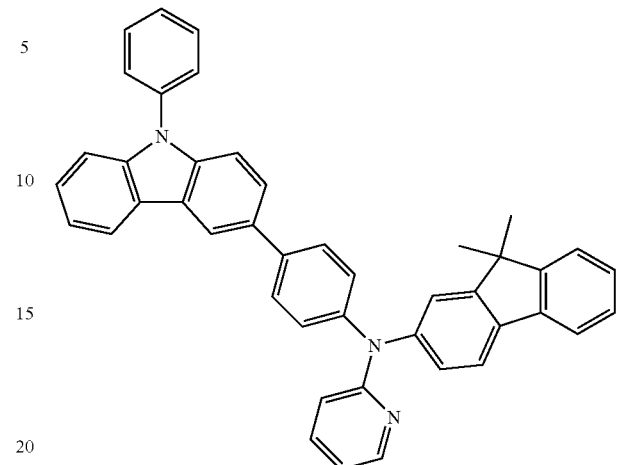
HT13
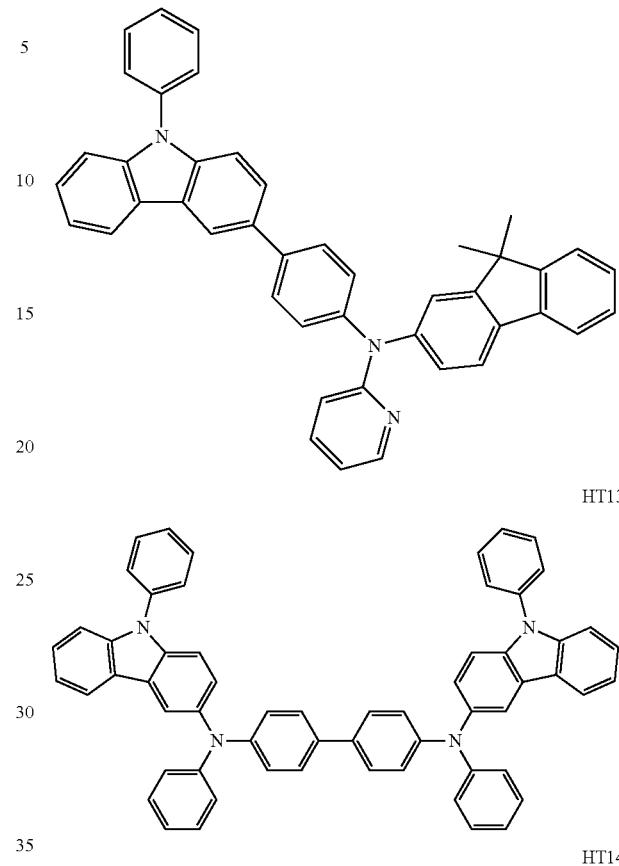
HT14
HT15
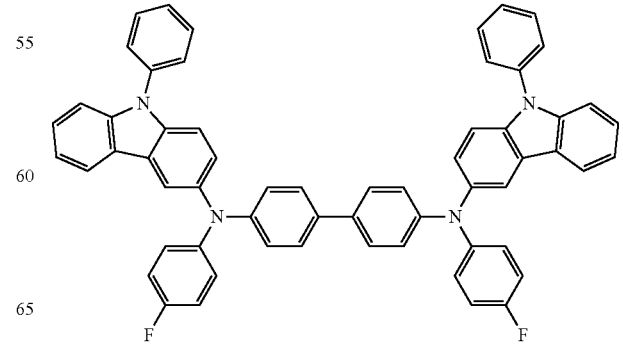

-continued

HT16

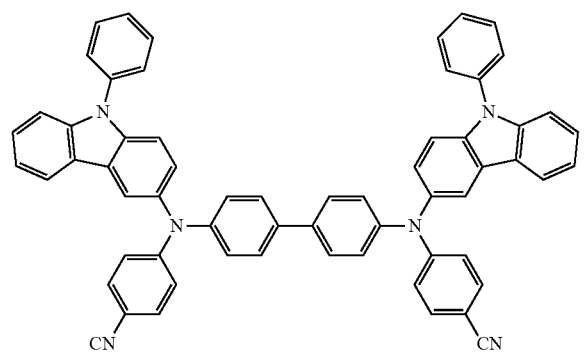

HT17

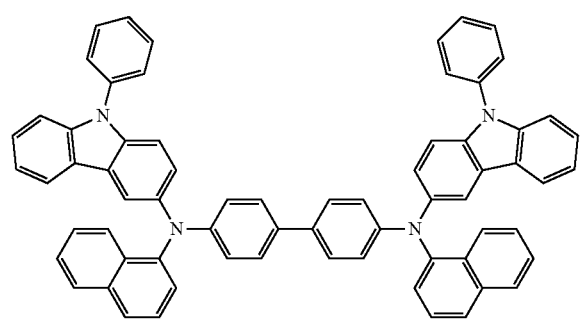

HT18

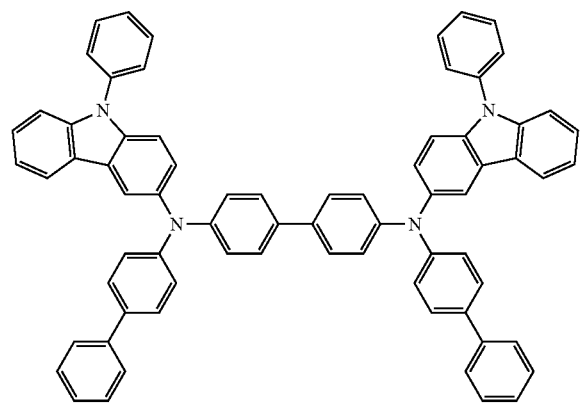

HT19

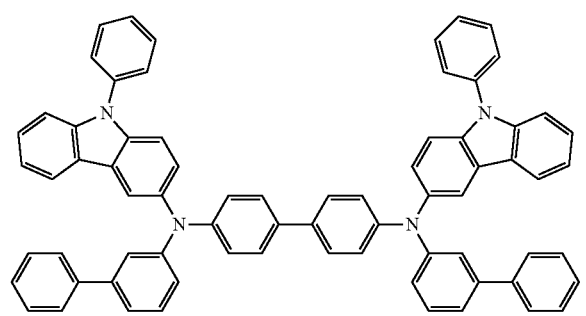

-continued

HT20

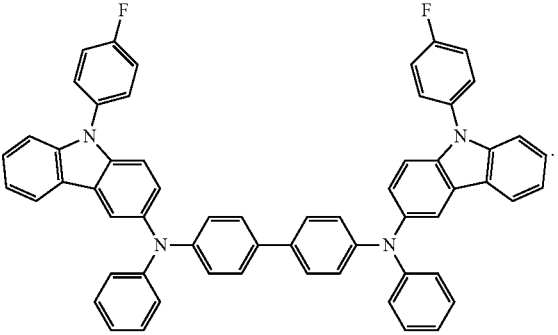

8. The organic light-emitting device of claim 1, wherein the third compound is represented by Formula 3:

$$Ar_{31}-[(L_{31})_{a31}-R_{31}]_{b31},\qquad \text{Formula 3}$$

wherein, in Formula 3, $Ar_{31}$ is selected from an anthracene and an indenoanthracene; and an anthracene and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{31}$)($Q_{32}$)($Q_{33}$), $L_{31}$ is selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a31 is selected from 0, 1, 2, and 3, $R_{31}$ is selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and b31 is selected from 1, 2, 3, and 4, wherein $Q_{31}$ to $Q_{33}$ are each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group.

9. The organic light-emitting device of claim 1, wherein the third compound is represented by one selected from Compounds H1 to H45:

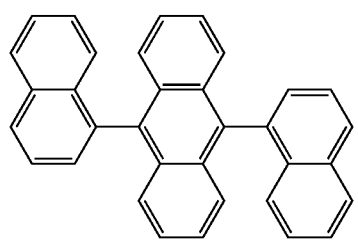
H1

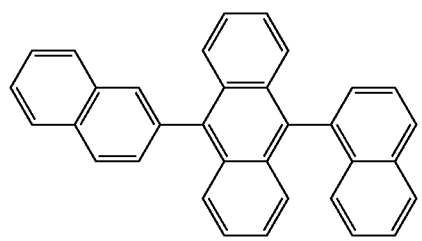
H2

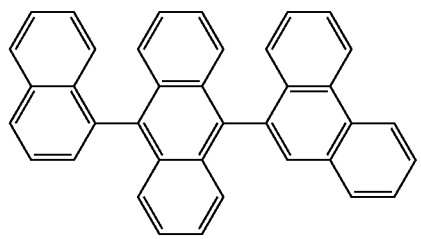
H3

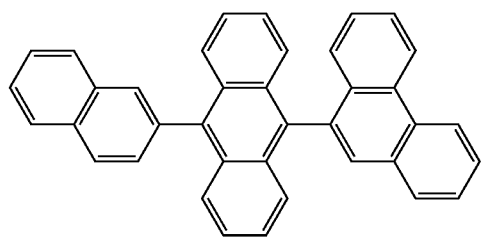
H4

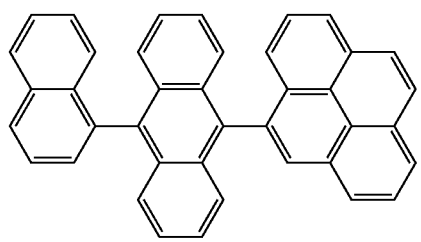
H5

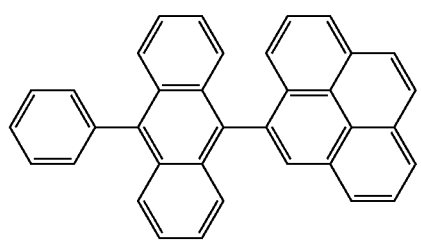
H6

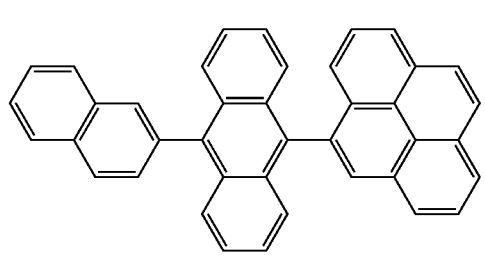
H7

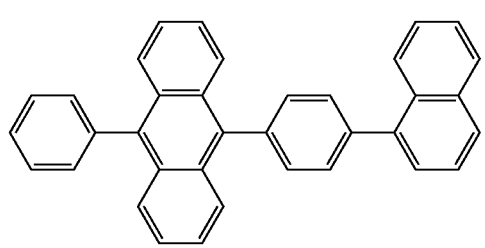
H8

-continued
H9
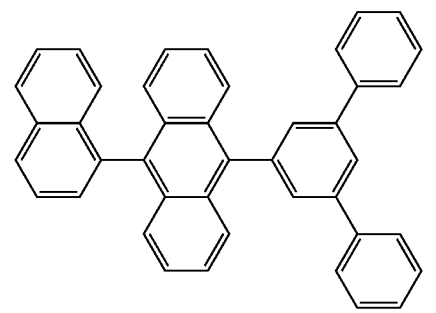
H10
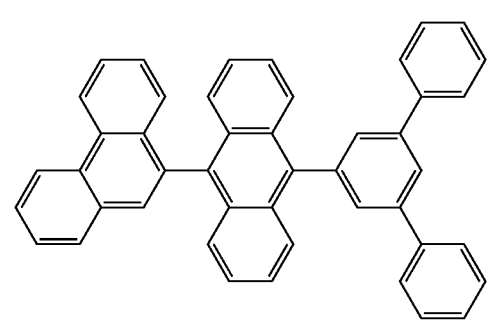
H11
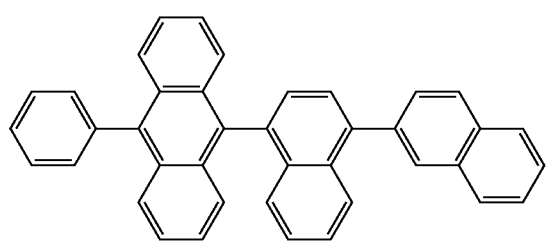
H12
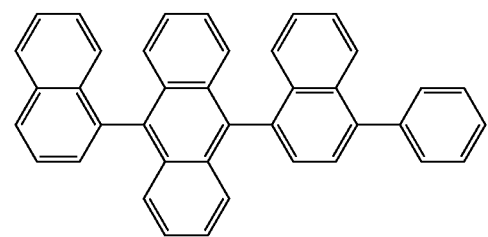
H13
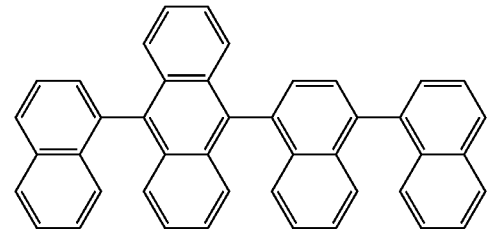
H14
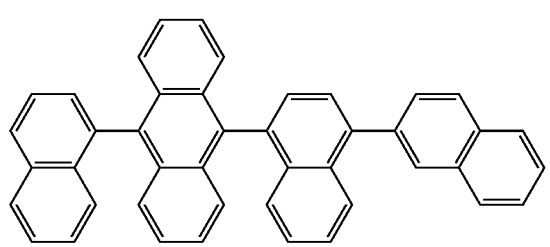
-continued
H15
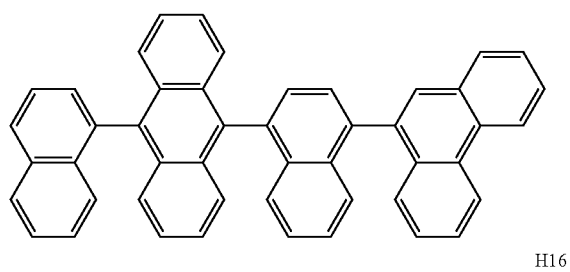
H16
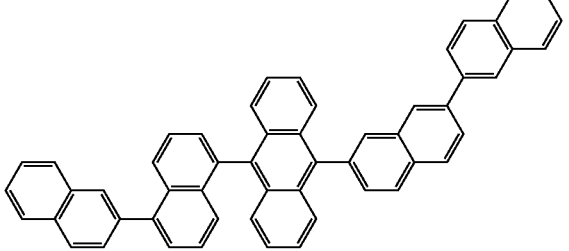
H17
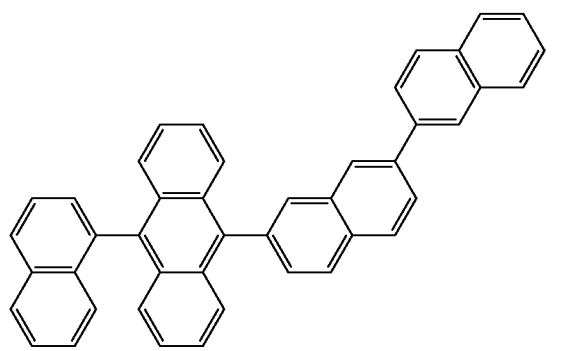
H18
H19
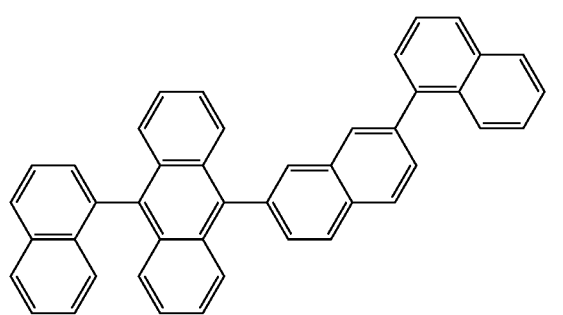

-continued
H20
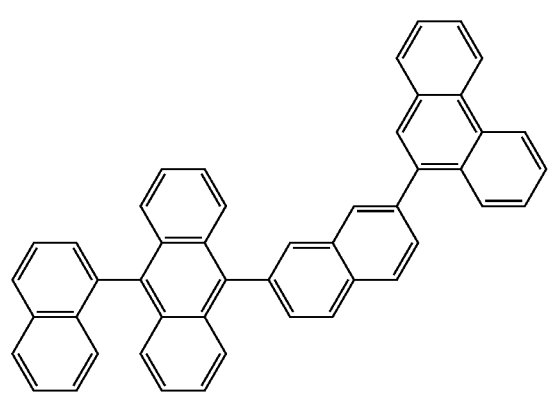
H21
H22
H23
H24
-continued
H25
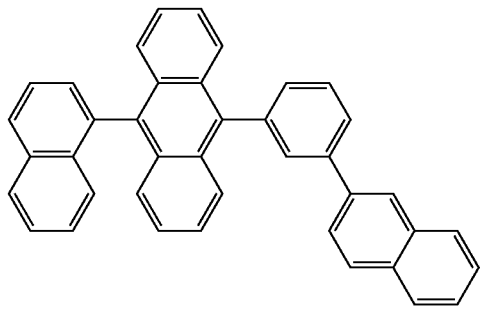
H26
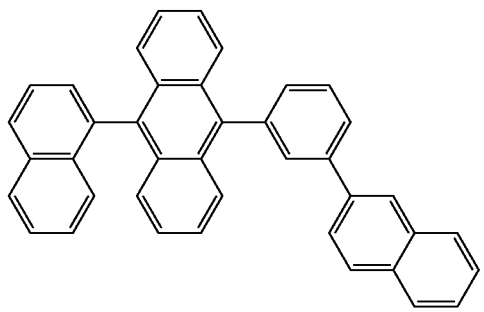
H27
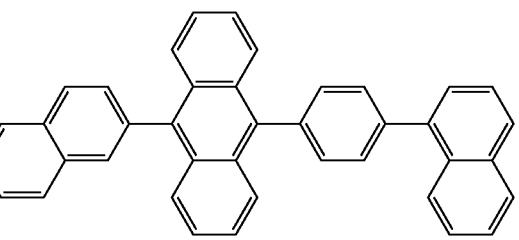
H28
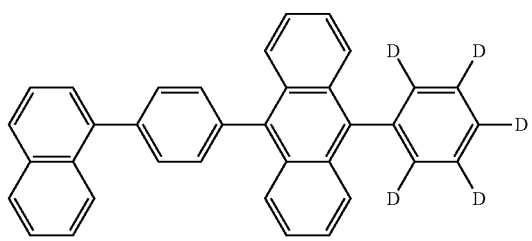
H29
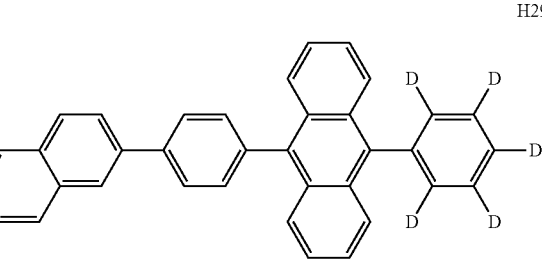
H30
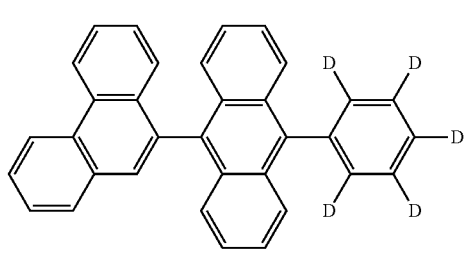

H31
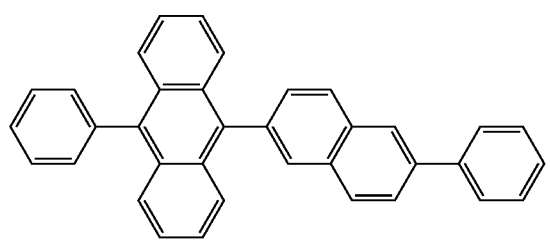
H32
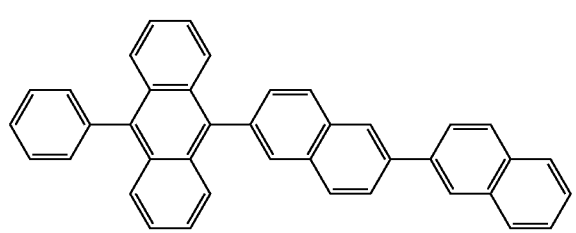
H33
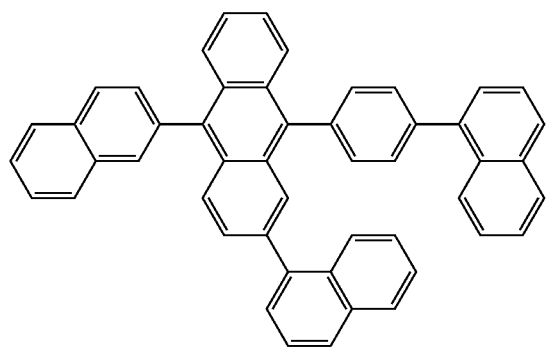
H34
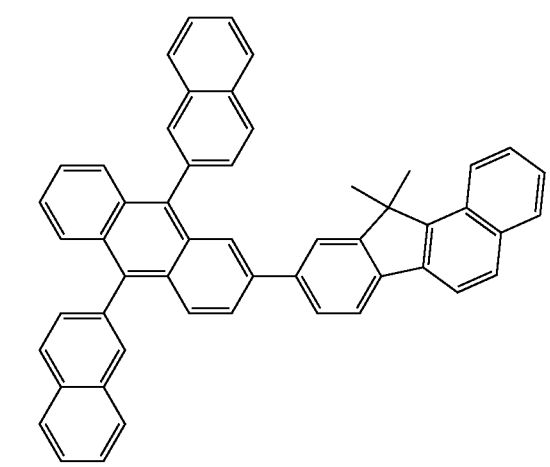
H35
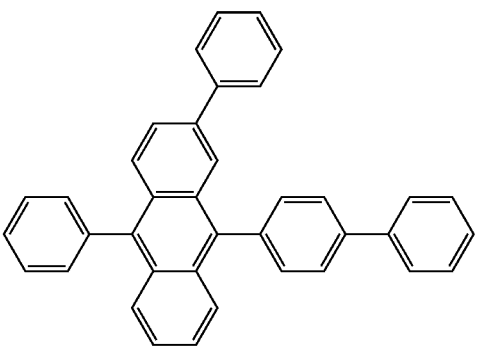
H36
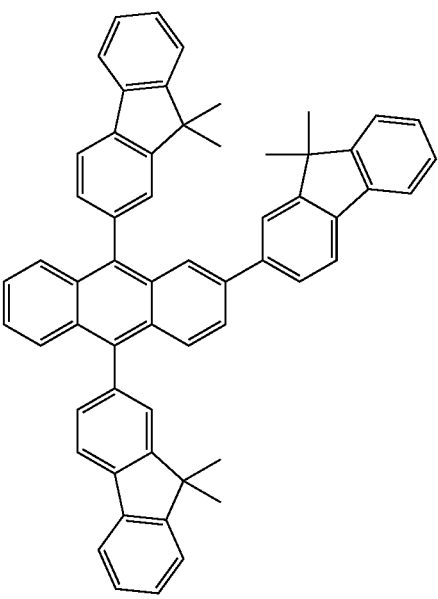
H37
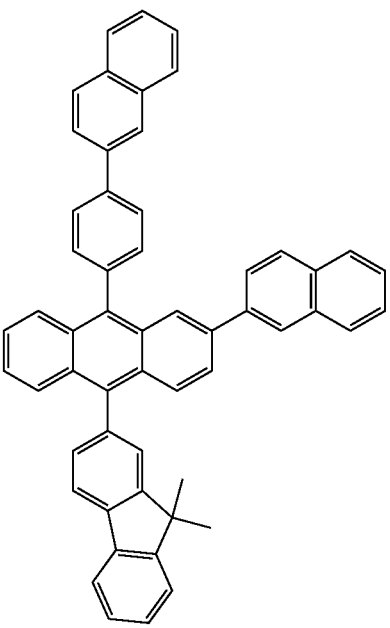

H38
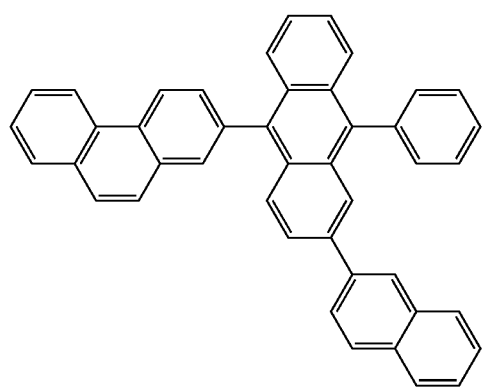
H39
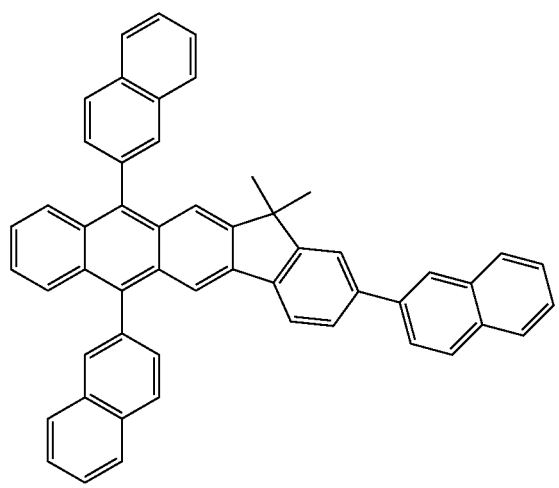
H40
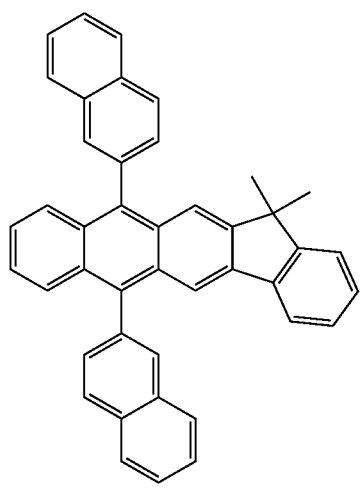
H41
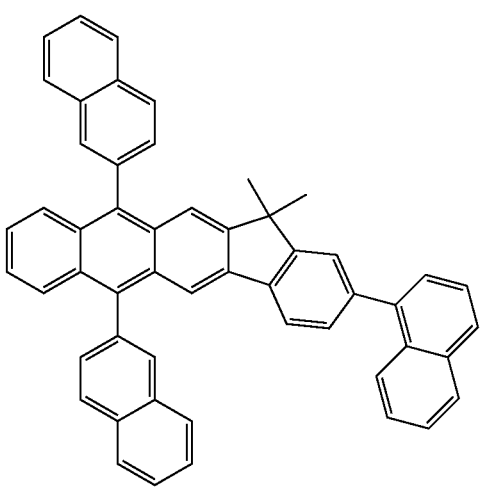
H42
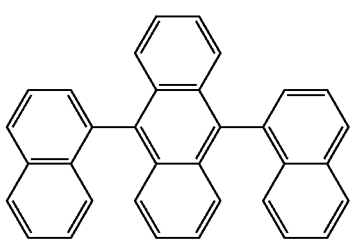
H43
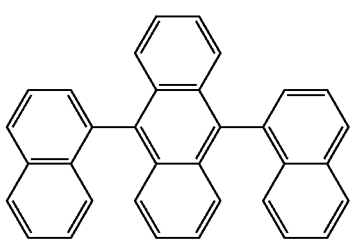

-continued

H44

H45

10. The organic light-emitting device of claim 1, wherein the fourth compound is represented by Formula 4:

$$Ar_{41}\left[(L_{43})_{a43}-N\begin{matrix}(L_{41})_{a41}-R_{41}\\ \\(L_{42})_{a42}-R_{42}\end{matrix}\right]_{b41},$$
Formula 4 wherein, in Formula 4, $Ar_{41}$ is selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{31}$)($Q_{32}$)($Q_{33}$), $L_{41}$ to $L_{43}$ are each independently selected from:

a substituted or unsubstituted $C_2$-$C_{60}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a41 and a42 are each independently an integer selected from 0, 1, 2, and 3, a43 is an integer selected from 0 to 8, $R_{41}$ and $R_{42}$ are each independently selected from:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, and a dibenzothiophenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, and b41 is an integer selected from 1, 2, 3 and 4, wherein $Q_{31}$ to $Q_{33}$ are each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group.

11. The organic light-emitting device of claim 1, wherein the fourth compound is represented by one selected from Compounds FD1 to FD15:

99
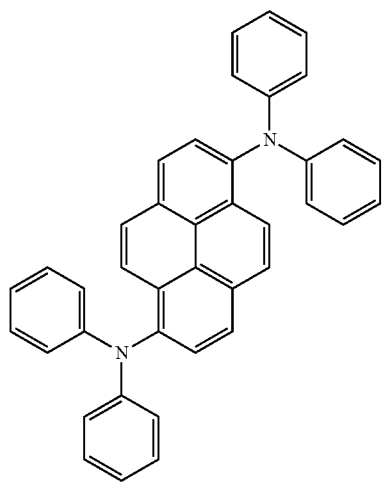
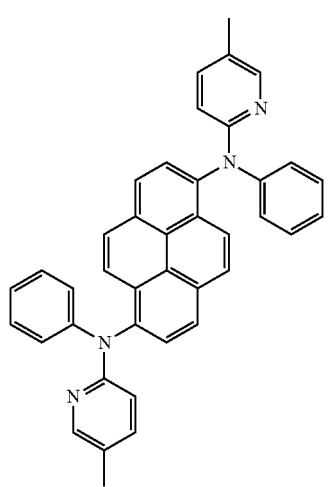
100
FD1
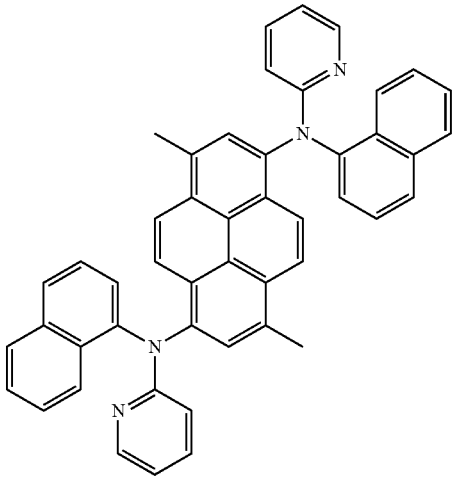
FD3
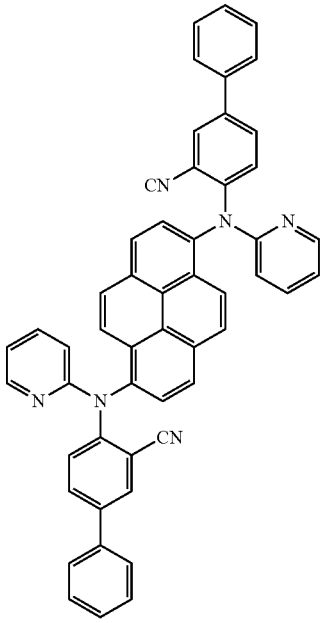
FD5
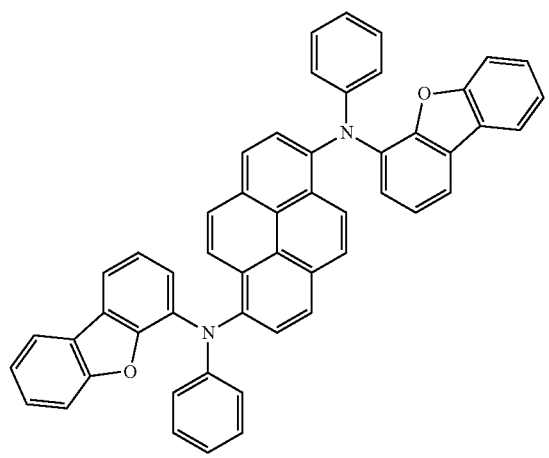
FD2
FD4
FD6
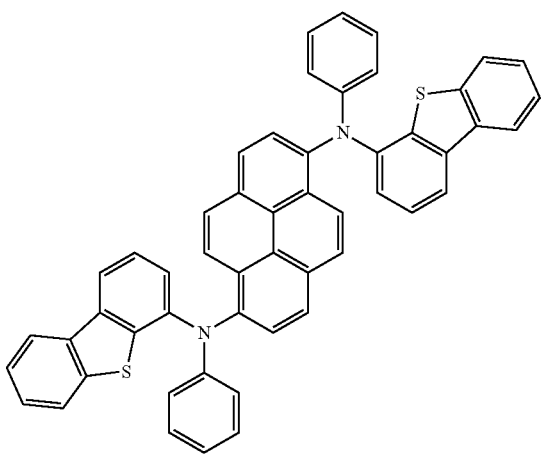

-continued
FD7
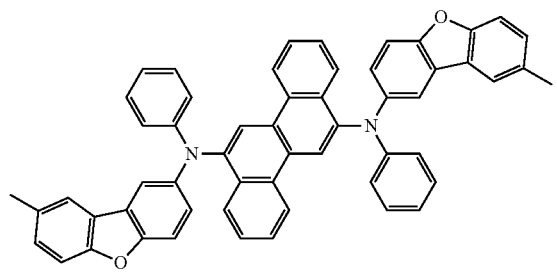
FD8
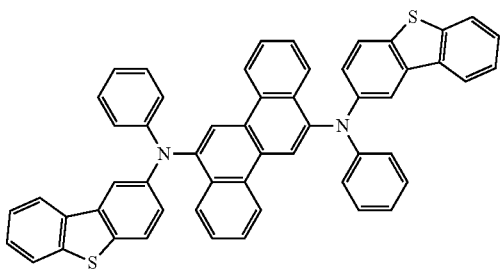
FD9
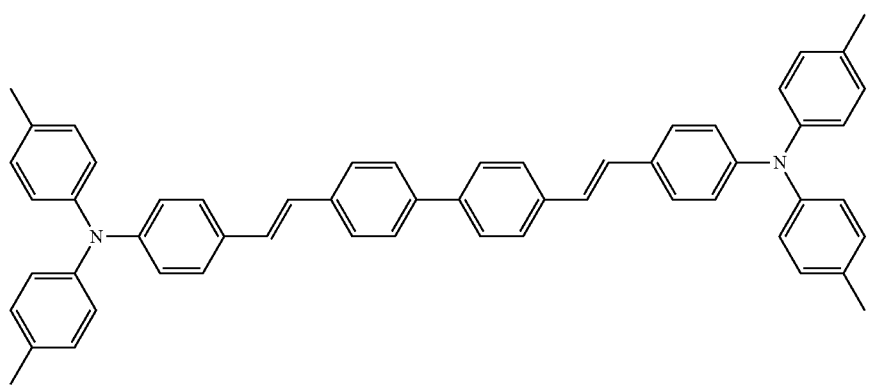
FD10
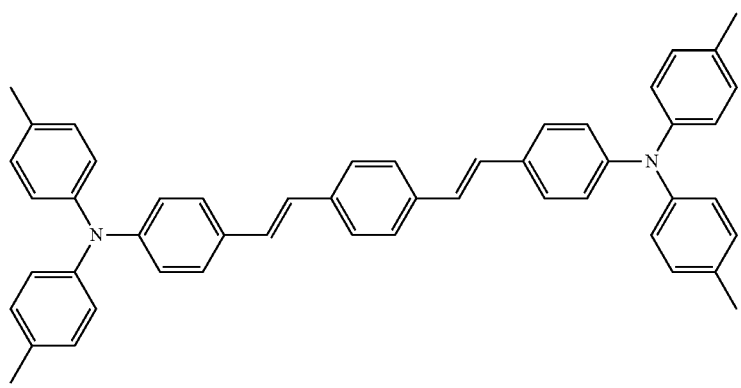
FD11
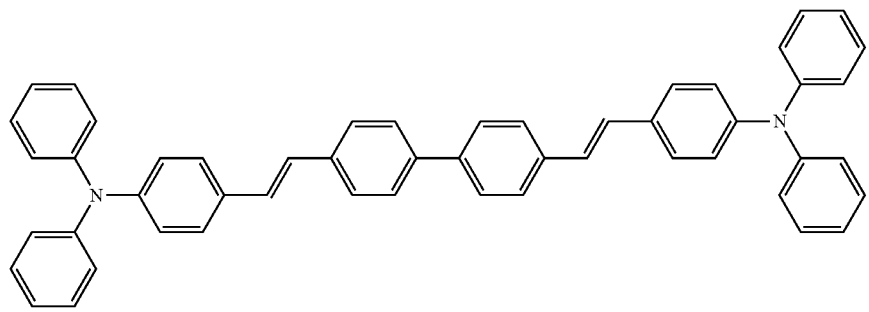

-continued

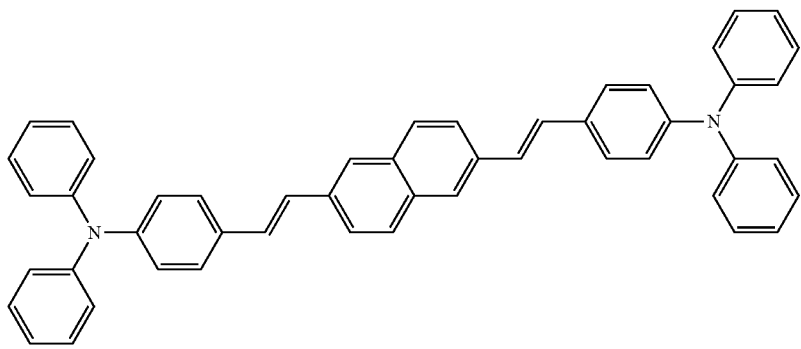
FD12

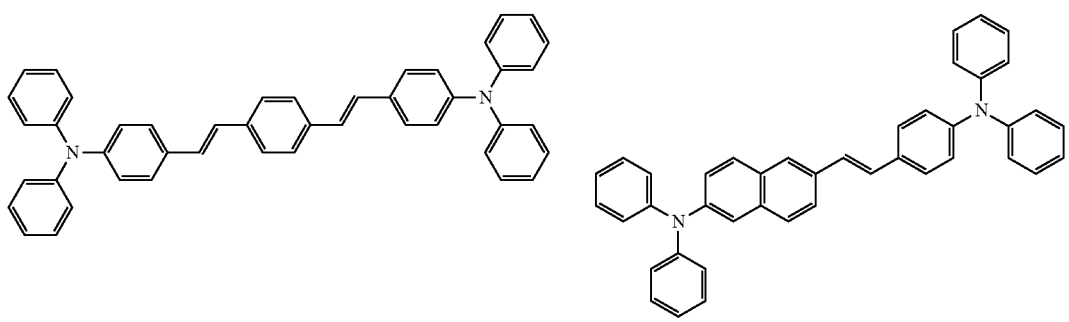
FD13  FD14

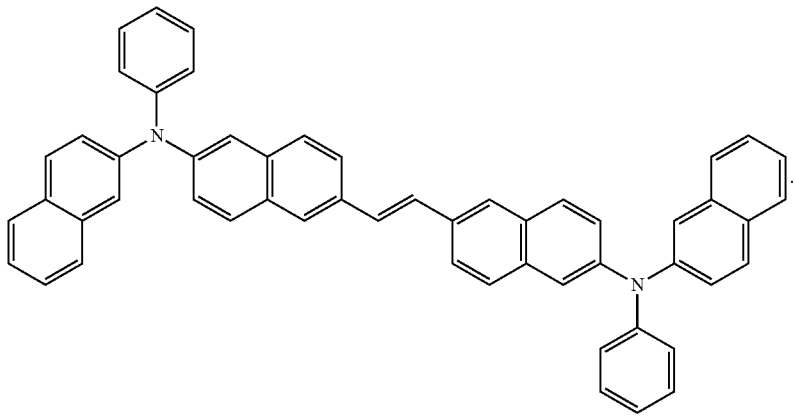
FD15

12. The organic light-emitting device of claim 1, wherein a weight ratio of the third compound to the fourth compound is 99:1 to 70:30.

13. The organic light-emitting device of claim 1, wherein the hole transport region further comprises a second hole transport layer directly contacting the first hole transport layer, and the second hole transport layer comprises a fifth compound.

14. The organic light-emitting device of claim 13, wherein the fifth compound is identical to the first compound.

15. The organic light-emitting device of claim 13, wherein the fifth compound is different from the first compound.

16. The organic light-emitting device of claim 1, wherein the electron transport region comprises at least one selected from a hole blocking layer, an electron transport layer, and an electron injection layer.

* * * * *